(12) United States Patent
Lochtefeld

(10) Patent No.: US 7,777,250 B2
(45) Date of Patent: Aug. 17, 2010

(54) LATTICE-MISMATCHED SEMICONDUCTOR STRUCTURES AND RELATED METHODS FOR DEVICE FABRICATION

(75) Inventor: Anthony J. Lochtefeld, Somerville, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 127 days.

(21) Appl. No.: 11/728,032

(22) Filed: Mar. 23, 2007

(65) Prior Publication Data

US 2008/0001169 A1    Jan. 3, 2008

Related U.S. Application Data

(60) Provisional application No. 60/785,567, filed on Mar. 24, 2006.

(51) Int. Cl.
*H01L 29/15* (2006.01)

(52) U.S. Cl. ............................. 257/190; 257/E29.193

(58) Field of Classification Search ................ 257/615, 257/614, 616
See application file for complete search history.

(56) References Cited

U.S. PATENT DOCUMENTS

| | | |
|---|---|---|
| 4,545,109 A | 10/1985 | Reichert |
| 4,551,394 A | 11/1985 | Betsch et al. |
| 4,651,179 A | 3/1987 | Reichert |
| 4,727,047 A * | 2/1988 | Bozler et al. ............... 438/464 |
| 4,774,205 A | 9/1988 | Choi et al. |
| 4,789,643 A | 12/1988 | Kajikawa |
| 4,826,784 A | 5/1989 | Salerno et al. |
| 4,860,081 A | 8/1989 | Cogan |
| 4,948,456 A | 8/1990 | Schubert |
| 5,032,893 A | 7/1991 | Fitzgerald, Jr. et al. |
| 5,034,337 A | 7/1991 | Mosher et al. |
| 5,061,644 A | 10/1991 | Yue et al. |
| 5,091,333 A | 2/1992 | Fan et al. |
| 5,091,767 A | 2/1992 | Bean et al. |
| 5,093,699 A | 3/1992 | Weichold et al. |
| 5,105,247 A | 4/1992 | Cavanaugh |
| 5,156,995 A | 10/1992 | Fitzgerald, Jr. et al. |
| 5,166,767 A | 11/1992 | Kapoor et al. |
| 5,236,546 A | 8/1993 | Mizutani et al. |
| 5,238,869 A | 8/1993 | Shichijo et al. |
| 5,256,594 A | 10/1993 | Wu et al. |
| 5,269,876 A | 12/1993 | Mizutani et al. |
| 5,281,283 A | 1/1994 | Tokunaga et al. |
| 5,285,086 A | 2/1994 | Fitzgerald, Jr. |

(Continued)

FOREIGN PATENT DOCUMENTS

DE    103 20 160 A1    8/2004

(Continued)

OTHER PUBLICATIONS

68 Applied Physics Letters 7, pp. 774-779 (1999). (trans. of relevant portions attached).

(Continued)

*Primary Examiner*—Jerome Jackson, Jr.
*Assistant Examiner*—Dale Page
(74) *Attorney, Agent, or Firm*—Slater & Matsil, L.L.P.

(57) ABSTRACT

Lattice-mismatched materials having configurations that trap defects within sidewall-containing structures.

20 Claims, 30 Drawing Sheets

U.S. PATENT DOCUMENTS

| | | | |
|---|---|---|---|
| 5,295,150 A | 3/1994 | Vangieson et al. |
| 5,403,751 A | 4/1995 | Nishida et al. |
| 5,417,180 A | 5/1995 | Nakamura et al. |
| 5,427,976 A | 6/1995 | Koh et al. |
| 5,432,120 A | 7/1995 | Meister et al. |
| 5,438,018 A | 8/1995 | Mori et al. |
| 5,518,953 A | 5/1996 | Takasu et al. |
| 5,589,696 A | 12/1996 | Baba et al. |
| 5,621,227 A | 4/1997 | Joshi |
| 5,640,022 A | 6/1997 | Inai et al. |
| 5,710,436 A | 1/1998 | Tanamoto et al. |
| 5,717,709 A | 2/1998 | Sasaki et al. |
| 5,792,679 A | 8/1998 | Nakato |
| 5,825,049 A | 10/1998 | Simmons et al. |
| 5,849,077 A | 12/1998 | Kenney |
| 5,886,385 A | 3/1999 | Arisumi et al. |
| 5,953,361 A | 9/1999 | Borchert et al. |
| 5,966,620 A | 10/1999 | Sakaguchi et al. |
| 6,011,271 A | 1/2000 | Sakuma et al. |
| 6,015,979 A | 1/2000 | Sugiura et al. |
| 6,049,098 A | 4/2000 | Sato et al. |
| 6,100,106 A | 8/2000 | Yamaguchi et al. |
| 6,111,288 A | 8/2000 | Watanabe et al. |
| 6,191,432 B1 | 2/2001 | Sugiyama et al. |
| 6,228,691 B1 | 5/2001 | Doyle |
| 6,235,547 B1 | 5/2001 | Sakuma et al. |
| 6,252,261 B1 | 6/2001 | Usui et al. |
| 6,271,551 B1 | 8/2001 | Schmitz et al. |
| 6,320,220 B1 | 11/2001 | Watanabe et al. |
| 6,342,404 B1 | 1/2002 | Shibata et al. |
| 6,348,096 B1 | 2/2002 | Sunakawa et al. |
| 6,362,071 B1 | 3/2002 | Nguyen et al. |
| 6,407,425 B1 | 6/2002 | Babcock et al. |
| 6,475,869 B1 | 11/2002 | Yu |
| 6,492,216 B1 | 12/2002 | Yeo et al. |
| 6,512,252 B1 | 1/2003 | Takagi et al. |
| 6,521,514 B1 | 2/2003 | Gehrke et al. |
| 6,576,532 B1 | 6/2003 | Jones et al. |
| 6,579,463 B1 | 6/2003 | Winningham et al. |
| 6,603,172 B1 | 8/2003 | Segawa et al. |
| 6,617,643 B1 | 9/2003 | Goodwin-Johansson |
| 6,635,110 B1 | 10/2003 | Luan et al. |
| 6,686,245 B1 | 2/2004 | Mathew et al. |
| 6,710,368 B2 | 3/2004 | Fisher et al. |
| 6,720,196 B2 | 4/2004 | Kunisato et al. |
| 6,727,523 B2 | 4/2004 | Morita et al. |
| 6,753,555 B2 | 6/2004 | Takagi et al. |
| 6,762,483 B1 | 7/2004 | Krivokapic et al. |
| 6,767,793 B2 | 7/2004 | Clark et al. |
| 6,784,074 B2 | 8/2004 | Shchukin et al. |
| 6,787,864 B2 | 9/2004 | Paton et al. |
| 6,794,718 B2 | 9/2004 | Nowak et al. |
| 6,800,910 B2 | 10/2004 | Lin et al. |
| 6,803,598 B1 | 10/2004 | Berger et al. |
| 6,809,351 B2 | 10/2004 | Kuramoto et al. |
| 6,812,495 B2 | 11/2004 | Wada et al. |
| 6,815,241 B2 * | 11/2004 | Wang .......................... 438/46 |
| 6,815,738 B2 | 11/2004 | Rim |
| 6,825,534 B2 | 11/2004 | Chen et al. |
| 6,835,246 B2 | 12/2004 | Zaidi |
| 6,835,618 B1 | 12/2004 | Dakshina-Murthy et al. |
| 6,838,322 B2 | 1/2005 | Pham et al. |
| 6,841,410 B2 | 1/2005 | Sasaoka et al. |
| 6,841,808 B2 | 1/2005 | Shibata et al. |
| 6,849,487 B2 | 2/2005 | Taylor, Jr. et al. |
| 6,849,884 B2 | 2/2005 | Clark et al. |
| 6,855,583 B1 | 2/2005 | Krivokapic et al. |
| 6,855,982 B1 | 2/2005 | Xiang et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,887,773 B2 | 5/2005 | Gunn, III et al. |
| 6,888,181 B1 | 5/2005 | Liao et al. |
| 6,900,070 B2 | 5/2005 | Craven et al. |
| 6,900,502 B2 | 5/2005 | Ge et al. |
| 6,902,965 B2 | 6/2005 | Ge et al. |
| 6,902,991 B2 | 6/2005 | Xiang et al. |
| 6,909,186 B2 | 6/2005 | Chu |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,921,963 B2 | 7/2005 | Krivokapic et al. |
| 6,921,982 B2 | 7/2005 | Joshi et al. |
| 6,936,875 B2 | 8/2005 | Sugii et al. |
| 6,943,407 B2 | 9/2005 | Ouyang et al. |
| 6,946,683 B2 | 9/2005 | Sano et al. |
| 6,949,769 B2 | 9/2005 | Hu et al. |
| 6,955,969 B2 | 10/2005 | Djomehri et al. |
| 6,955,977 B2 | 10/2005 | Kong et al. |
| 6,958,254 B2 | 10/2005 | Seifert et al. |
| 6,960,781 B2 | 11/2005 | Currie et al. |
| 6,974,733 B2 | 12/2005 | Boyanov et al. |
| 6,977,194 B2 | 12/2005 | Belyansky et al. |
| 6,982,204 B2 | 1/2006 | Saxler et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,998,684 B2 | 2/2006 | Anderson et al. |
| 7,001,804 B2 | 2/2006 | Dietz et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green et al. |
| 7,041,178 B2 | 5/2006 | Tong et al. |
| 7,045,401 B2 | 5/2006 | Lee et al. |
| 7,049,627 B2 | 5/2006 | Vineis et al. |
| 7,074,623 B2 | 7/2006 | Lochtefeld et al. |
| 7,078,299 B2 | 7/2006 | Maszara et al. |
| 7,078,731 B2 | 7/2006 | D'Evelyn et al. |
| 7,084,051 B2 | 8/2006 | Ueda et al. |
| 7,084,441 B2 | 8/2006 | Saxler |
| 7,087,965 B2 | 8/2006 | Chan et al. |
| 7,091,561 B2 | 8/2006 | Matsushita et al. |
| 7,095,043 B2 | 8/2006 | Oda et al. |
| 7,098,508 B2 | 8/2006 | Ieong et al. |
| 7,101,444 B2 | 9/2006 | Shchukin et al. |
| 7,109,516 B2 | 9/2006 | Langdo et al. |
| 7,118,987 B2 | 10/2006 | Fu et al. |
| 7,119,402 B2 | 10/2006 | Kinoshita et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,138,302 B2 | 11/2006 | Xiang et al. |
| 7,160,753 B2 | 1/2007 | Williams, Jr. |
| 7,164,183 B2 | 1/2007 | Sakaguchi et al. |
| 7,176,522 B2 | 2/2007 | Cheng et al. |
| 7,180,134 B2 | 2/2007 | Yang et al. |
| 7,195,993 B2 | 3/2007 | Zheleva et al. |
| 7,198,995 B2 | 4/2007 | Chidambarrao et al. |
| 7,205,586 B2 | 4/2007 | Takagi et al. |
| 7,205,604 B2 | 4/2007 | Ouyang et al. |
| 7,211,864 B2 | 5/2007 | Seliskar |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |

| | | |
|---|---|---|
| 7,268,058 B2 | 9/2007 | Chau et al. |
| 7,344,942 B2 | 3/2008 | Korber |
| 2001/0006249 A1* | 7/2001 | Fitzgerald .................... 257/613 |
| 2001/0045604 A1 | 11/2001 | Oda et al. |
| 2002/0030246 A1 | 3/2002 | Eisenbeiser et al. |
| 2002/0066403 A1 | 6/2002 | Sunakawa et al. |
| 2002/0070383 A1 | 6/2002 | Shibata et al. |
| 2003/0030117 A1 | 2/2003 | Iwasaki et al. |
| 2003/0045017 A1 | 3/2003 | Hiramatsu et al. |
| 2003/0064535 A1 | 4/2003 | Kub et al. |
| 2003/0087462 A1 | 5/2003 | Koide et al. |
| 2003/0089899 A1 | 5/2003 | Lieber et al. |
| 2003/0155586 A1 | 8/2003 | Koide et al. |
| 2003/0178677 A1 | 9/2003 | Clark et al. |
| 2003/0207518 A1 | 11/2003 | Kong et al. |
| 2004/0012037 A1 | 1/2004 | Venkatesan et al. |
| 2004/0072410 A1 | 4/2004 | Motoki et al. |
| 2004/0075105 A1 | 4/2004 | Leitz et al. |
| 2004/0188791 A1 | 9/2004 | Horng |
| 2004/0195624 A1 | 10/2004 | Liu et al. |
| 2004/0227187 A1 | 11/2004 | Cheng et al. |
| 2005/0003572 A1 | 1/2005 | Hahn et al. |
| 2005/0017351 A1 | 1/2005 | Ravi |
| 2005/0040444 A1 | 2/2005 | Cohen |
| 2005/0045983 A1 | 3/2005 | Noda et al. |
| 2005/0054164 A1 | 3/2005 | Xiang |
| 2005/0054180 A1* | 3/2005 | Han et al. .................... 438/479 |
| 2005/0073028 A1 | 4/2005 | Grant et al. |
| 2005/0093021 A1 | 5/2005 | Ouyang et al. |
| 2005/0093154 A1 | 5/2005 | Kottantharayil et al. |
| 2005/0104152 A1 | 5/2005 | Snyder et al. |
| 2005/0104156 A1 | 5/2005 | Wasshuber |
| 2005/0118793 A1 | 6/2005 | Snyder et al. |
| 2005/0118825 A1 | 6/2005 | Nishijima et al. |
| 2005/0127451 A1 | 6/2005 | Tsuchiya et al. |
| 2005/0139860 A1 | 6/2005 | Snyder et al. |
| 2005/0145941 A1 | 7/2005 | Bedell et al. |
| 2005/0145954 A1 | 7/2005 | Zhu et al. |
| 2005/0156169 A1 | 7/2005 | Chu |
| 2005/0156202 A1 | 7/2005 | Rhee et al. |
| 2005/0161711 A1 | 7/2005 | Chu |
| 2005/0164475 A1 | 7/2005 | Peckerar et al. |
| 2005/0181549 A1 | 8/2005 | Barr et al. |
| 2005/0184302 A1 | 8/2005 | Kobayashi et al. |
| 2005/0205859 A1 | 9/2005 | Currie et al. |
| 2005/0205932 A1 | 9/2005 | Cohen |
| 2005/0212051 A1 | 9/2005 | Jozwiak et al. |
| 2005/0217565 A1 | 10/2005 | Lahreche et al. |
| 2006/0009012 A1 | 1/2006 | Leitz et al. |
| 2006/0019462 A1 | 1/2006 | Cheng et al. |
| 2006/0049409 A1 | 3/2006 | Rafferty et al. |
| 2006/0105533 A1 | 5/2006 | Chong et al. |
| 2006/0113603 A1 | 6/2006 | Currie |
| 2006/0128124 A1 | 6/2006 | Haskell et al. |
| 2006/0131606 A1 | 6/2006 | Cheng |
| 2006/0145264 A1 | 7/2006 | Chidambarrao et al. |
| 2006/0160291 A1 | 7/2006 | Lee et al. |
| 2006/0175601 A1 | 8/2006 | Lieber et al. |
| 2006/0186510 A1 | 8/2006 | Lochtefeld et al. |
| 2006/0189056 A1 | 8/2006 | Ko et al. |
| 2006/0197123 A1 | 9/2006 | Lochtefeld et al. |
| 2006/0197124 A1 | 9/2006 | Lochtefeld et al. |
| 2006/0197126 A1 | 9/2006 | Lochtefeld et al. |
| 2006/0202276 A1 | 9/2006 | Kato |
| 2006/0205197 A1 | 9/2006 | Yi et al. |
| 2006/0211210 A1 | 9/2006 | Bhat et al. |
| 2006/0267047 A1 | 11/2006 | Murayama |
| 2006/0292719 A1 | 12/2006 | Lochtefeld et al. |
| 2007/0029643 A1 | 2/2007 | Johnson et al. |
| 2007/0054465 A1 | 3/2007 | Currie et al. |
| 2007/0054467 A1 | 3/2007 | Currie et al. |
| 2007/0105256 A1 | 5/2007 | Fitzgerald |
| 2007/0105274 A1 | 5/2007 | Fitzgerald |
| 2007/0105335 A1 | 5/2007 | Fitzgerald |
| 2007/0181977 A1 | 8/2007 | Lochtefeld et al. |
| 2007/0187668 A1 | 8/2007 | Noguchi et al. |
| 2007/0196987 A1 | 8/2007 | Chidambarrao et al. |
| 2007/0267722 A1 | 11/2007 | Lochtefeld et al. |
| 2008/0070355 A1 | 3/2008 | Lochtefeld et al. |
| 2008/0073641 A1 | 3/2008 | Cheng et al. |
| 2008/0073667 A1 | 3/2008 | Lochtefeld |
| 2008/0093622 A1 | 4/2008 | Li et al. |
| 2008/0099785 A1 | 5/2008 | Bai et al. |
| 2008/0187018 A1 | 8/2008 | Li |
| 2009/0039361 A1 | 2/2009 | Li et al. |
| 2009/0065047 A1 | 3/2009 | Fiorenza et al. |

FOREIGN PATENT DOCUMENTS

| | | |
|---|---|---|
| EP | 1 551 063 | 7/2005 |
| EP | 1796180 | 6/2007 |
| JP | 2-062090 | 3/1990 |
| JP | 2000-286449 | 10/2000 |
| JP | 2004-200375 | 7/2004 |
| WO | WO-02/086952 | 10/2002 |
| WO | WO 2004/023536 | 3/2004 |
| WO | WO-2005/013375 | 2/2005 |
| WO | WO-2005/048330 | 5/2005 |
| WO | WO-2005/098963 | 10/2005 |
| WO | WO-2005/122267 | 12/2005 |
| WO | WO-2006/125040 | 11/2006 |

OTHER PUBLICATIONS

Asano, T. et al., "AlGaInN laser diodes grown on an ELO-GaN substrate vs. on a sapphire substrate," 2000 IEEE 17th International Semiconductor Laser Conference, *Conference Digest.*, pp. 109-110.

Ashby, C.I.H. et al., "Low-dislocation-density GaN from a single growth on a textured substrate." Applied Physics Letters, v 77, n. 20, Nov. 13, 2000, p. 3233-35.

Ashley et al., "Heternogeneous InSb Quantum Well Transistors on Silicon for ultra-high speed, low power logic applications," 43 Electronics Letters 14 (Jul. 2007).

Bai et al, "Study of the defect elimination mechanisms in aspect ratio trapping Ge growth," Appl. Phys. Letters, vol. 90 (2007).

Bakkers et al., "Epitaxial Growth on InP Nanowires on Germanium," Nature Materials, vol. 3 (Nov. 2004), pp. 769-773.

Baron et al., "Chemical Vapor Deposition of Ge Nanocrystals on $SiO_2$," Applied Physics Letters, vol. 83, No. 7 (Aug. 18, 2003), pp. 1444-1446.

Beckett et al., "Towards a reconfigurable nanocomputer platform," ACM Int'l. Conf. Proceeding Series, vol. 19, pp. 141-150 (2002).

Beltz et al., "A Theoretical Model for Threading Dislocation Reduction During Selective Area Growth," Materials Science and Engineering, A234-236 (1997), pp. 794-797.

Borland, J.O., "Novel device structures by selective epitaxial growth (SEG)," 1987 International Electron Devices Meeting, pp. 12-15.

Bryskiewicz, T., "Dislocation filtering in SiGe and InGaAs buffer layers grown by selective lateral overgrowth method," Applied Physics Letters, v 66, n 10, Mar. 6, 1995, p. 1237-39.

Bushroa, A.R. et al., "Lateral epitaxial overgrowth and reduction in defect density of 3C-SiC on patterned Si substrates," Journal of Crystal Growth, v 271, Oct. 15, 2004, pp. 200-206.

Cannon et al., "Monolithic Si-based Technology for Optical Receiver Circuits," Proceedings of SPIE, vol. 4999 (2003), pp. 145-155.

Chan et al., "Influence of metalorganic Sources on the Composition Uniformity of Selectively Grown $Ga_xIn_{1-x}P$," Jpn J. Appl. Phys., vol. 33 (1994) pp. 4812-4819.

Chang et al., "Epitaxial Lateral Overgrowth of Wide Dislocation-Free GaAs on Si Substrates," Electrochemical Soc'y Proceedings, vol. 97-21, pp. 196-200.

Chang, Y.S. et al., "Effect of growth temperature on epitaxial lateral overgrowth of GaAs on Si substrate," Journal of Crystal Growth, 174, Apr. 1997, pp. 630-634.

Chau et al., "Opportunities and Challenges of III-V Nanoelectronics for Future High-Speed, Low Power Logic Applications," IEEE CSIC Digest, pp. 17-20 (2005).

Chen, Y. et al., "Dislocation reduction in GaN thin films via lateral overgrowth from trenches," Applied Physics Letters, v 75, n 14, Oct. 4, 1999, p. 2062-63.

Dadgar et al., "MOVPE Growth of GaN on Si (111) Substrates," Journal of Crystal Growth, 248 (2003) pp. 556-562.

Datta et al., "Silicon and III-V Nanoelectronics," IEEE Int'l. Conf. on Indium Phosphide & Related Mat., pp. 7-8 (2005).

Datta et al., "Ultrahigh-Speed 0.5 V Supply Voltage $In_{0.7}Ga_{0.3}As$ Quantum-Well Transistors on Silicon Substrate," 28 Electron Device Letters 8, pp. 685-687 (2007).

Davis, R.F. et al., "Lateral epitaxial overgrowth of and defect reduction in GaN thin films," IEEE Lasers and Electro-Optics Society Annual Meeting, 1998, vol. 1, pp. 360-361.

de Boeck et al., "The fabrication on a novel composite $GaAs/SiO_2$ nucleation layer on silicon for heteroepitaxial overgrowth by molecular beam epitaxy," Mat. Sci. and Engineering, B9 (1991), pp. 137-141.

Dong et al., "Selective area growth of InP through narrow openings by MOCVD and its application to InP HBT," 2003 International Conference on Indium Phosphide and Related Materials, pp. 389-392, May 12-16, 2003.

Dong-Ho Kim et al., "GaN nano epitaxial lateral overgrowth on holographically patterned substrates," International Symposium on Compound Semiconductors, pp. 27-28, Aug. 2003.

Epitaxial Lateral Overgrowth of GaAs on a Si Substrate, 28 Jap. J. App. Physics 3, pp. L337-L339 (Mar. 1989).

Fang et al., "Electrically pumped hybrid AlGaInAs-silicon evanescent laser," 14 Optics Express 20, pp. 9203-9210 (2006).

Feltin, E. et al., "Epitaxial lateral overgrowth of GaN on Si (111)," Journal of Applied Physics, v 93, n 1, Jan. 1, 2003, pp. 182-185.

Fitzgerald et al., "Elimination of Dislocations in Heteroepitaxial MBE and RTCVD $Ge_xSi_{1-x}$ Grown on Patterned Si Substrates," Journal of Electronic Materials, vol. 19, No. 9 (1990), pp. 949-955.

Fitzgerald et al., "Epitaxial Necking in GaAs Grown on Pre-patterned Si Substrates," Journal of Electronic Materials, vol. 20, No. 10 (1991), pp. 839-853.

Fitzgerald et al., "Nucleation Mechanisms and the Elimination of Misfit Dislocations at Mismatched Interfaces by Reduction in Growth Area," J. Applied Phys., vol. 65, No. 6, (Mar. 15, 1989), pp. 2220-2237.

Fitzgerald, "The Effect of Substrate Growth Area on Misfit and Threading Dislocation Densities in Mismatched Heterostructures," J. Vac. Sci. Technol., vol. 7, No. 4 (Jul./Aug. 1989), pp. 782-788.

Gallagher et al., "Development of the magnetic tunnel junction MRAM at IBM: From first junctions to a 16-Mb MRAM demonstrator chip," 50 IBM J. Research & Dev. 1 (2006).

Gallas et al, "Influence of Doping on Facet Formation at the $SiO_2/Si$ Interface," Surface Sci. 440, pp. 41-48 (1999).

Geppert, L., "Quantum transistors: toward nanoelectronics," IEEE Spectrum, pp. 46-51 (Sep. 2000).

Glew et al., "New DFB grating structure using dopant-induced refractive index step," J. Crystal Growth 261 (2004) pp. 349-354.

Gould et al., "Magnetic resonant tunneling diodes as voltage-controlled spin selectors," 241 Phys. Stat. Sol. (B) 3, pp. 700-703 (2004).

Groenert et al., "Monolithic integration of room-temperature cw GaAs/AlGaAs lasers on Si substrates via relaxed graded GeSi buffer layers," 93 J. Appl. Phys. 362 (2003).

Gustafsson et al., "Cathodoluminescence from relaxed $Ge_xSi_{1-x}$ grown by heteroepitaxial lateral overgrowth," J. Crystal Growth 141 (1994), pp. 363-370.

Gustafsson et al., "Investigations of high quality $Ge_xSi_{1-x}$ grown by heteroepitaxial lateral overgrowth using cathodoluminescence," Inst. Phys. Conf. Ser. No. 134: Section 11, pp. 675-678 (1993).

Hayafuji et al., Jap. J. Appl. Phys. 29, pp. 2371 (1990).

Hersee, et al., "The Controlled Growth of GaN Nanowires," Nano Letters, vol. 6, No. 8 (2006), pp. 1808-1811.

Hiramatsu, K. et al., "Fabrication and characterization of low defect density GaN using facet-controlled epitaxial lateral overgrowth (FACELO)," Journal of Crystal Growth, v 221, Dec. 2000, pp. 316-326.

Hollander et al., "Strain and Misfit Dislocation Density in Finite Lateral Size $Si_{1-x}Ge_x$ Films Grown by Sective Epitaxy," Thin Solid Films, vol. 292, (1997) pp. 213-217.

Huang et al., "Electron and Hole Mobility Enhancement in Strained SOI by Wafer Bonding," 49 IEEE Trans. on Electron Devices 9, pp. 1566-1571 (2002).

International Search Report and Written Opinion for Patent Application No. PCT/US2006/019152, dated Oct. 19, 2006.

International Search Report and Written Opinion for Patent Application No. PCT/US2006/029247, dated May 7, 2007.

International Search Report and Written Opinion for Patent Application No. PCT/US2006/033859, dated Sep. 12, 2007.

Ipri, A.C. et al., "Mono/Poly technology for fabricating low-capacitance CMOS integrated circuits," IEEE Trans. on Electron Devices, vol. 35, No. 8, pp. 1382-1383, Aug. 1988.

Ishitani et al., "Facet Formation in Selective Silicon Epitaxial Growth," 24 Jap. J. Appl. Phys. 10, pp. 1267-1269 (1985).

Jing Wang et al., "Fabrication of patterned sapphire substrate by wet chemical etching for maskless lateral overgrowth of GaN," J. Electrochemical Soc'y, v. 153, n. 3, Mar. 2006, pp. C182-C185.

Ju, W. et al. , "Epitaxial lateral overgrowth of gallium nitride on silicon substrate," J. Crystal Growth, v. 263, Mar. 1, 2004, p. 30-4.

Kamiyama, S. et al., "UV laser diode with 350.9-nm-lasing wavelength grown by hetero-epitaxial-lateral overgrowth technology," IEEE Journal of Selected Topics in Quantum Electronics, vol. 11, No. 5, pp. 1069-1073, Sep.-Oct. 2005.

Kamiyama, S. et al., "UV light-emitting diode fabricated on hetero-ELO-grown $Al_{0.22}Ga_{0.78}N$ with low dislocation density," Physica Status Solidi A, v 192, n 2, Aug. 2002, pp. 296-300.

Kazi et al., "Realization of GaAs/AlGaAs Lasers on Si Substrates Using Epitaxial Lateral Overgrowth by Metalorganic Chemical Vapor Deposition," Jpn. J. Appl. Physics, vol. 40 (2001), pp. 4903-4906.

Kidoguchi, I. et al., "Air-bridged lateral epitaxial overgrowth of GaN thin films," Applied Physics Letters, v 76, n 25, Jun. 19, 2000, pp. 3768-3770.

Kimura et al., "Vibronic Fine Structure Found in the Blue Luminescence from Silicon Nanocolloids," Jpn. J. Appl. Physics, vol. 38 (1999), pp. 609-612.

Klapper, "Generation and Propagation of Dislocations During Crystal Growth," Mat. Chem. and Phys. 66, pp. 101-109 (2000).

Knall et al., Threading Dislocations in GaAs Grown with Free Sidewalls on Si mesas, J Vac. Sci. Technol. B, vol. 12, No. 6, (Nov./Dec. 1994) pp. 3069-3074.

Krost et al., "GaN-based Optoelectronics on Silicon Substrates," Mat. Sci. & Engineering, B93 (2002) pp. 77-84.

Kushida, K. et al., "Epitaxial growth of $PbTiO_3$ films on $SrTiO_3$ by RF magnetron sputtering," Ultrasonics, IEEE Transactions on Ferroelectrics and Frequency Control, vol. 38, No. 6, pp. 656-662, Nov. 1991.

Kwok K Ng, Complete Guide to Semiconductor Devices, 2nd ed., Chapter 18 (2002).

Langdo et al., "High Quality Ge on Si by Epitaxial Necking," Applied Physics Letters, vol. 76, No. 25 (Jun. 19, 2000), pp. 3700-3702.

Langdo, "Selective SiGe Nanostructures," Ph.D. Thesis, Massachusetts Institute of Technology (2001).

Lee et al., "Strained-relieved, Dislocation-free $In_xGa_{1-x}/GaAs(001)$ Heterostructure by Nanoscale-patterned Growth," Applied Physics Letters, vol. 85, No. 18 (Nov. 1, 2004), pp. 4181-4183.

Lee, S.C. et al., "Growth of GaN on a nanoscale periodic faceted Si substrate by metal organic vapor phase epitaxy," 2003 International Symposium on Compound Semiconductors: Post-Conference Proceedings, pp. 15-21.

Li et al, "Heteropitaxy of High-quality Ge on Si by Nanoscale Ge seeds Grown through a Thin Layer of $SiO_2$," Applied Physics Letters, vol. 85, No. 11 (Sep. 13, 2004), pp. 1928-1930.

Li et al., "Defect Reduction of GaAs Epitaxy on Si (001) Using Selective Aspect Ratio Trapping," 91 Applied Physics Letters 021114-1-021114-3 (2007).

Li et al., "Morphological Evolution and Strain Relaxation of Ge Islands Grown on Chemically Oxidized Si(100) by Molecular-beam Epitaxy," J. Applied Physics, vol. 98, (2005), pp. 073504-1-073504-8.

Li et al., "Selective Growth of Ge on Si(100) through vias of SiO$_2$ Nanotemplate Using Solid Source Molecular Beam Epitaxy," Applied Physics Letters, vol. 83, No. 24 (Dec. 15, 2003), pp. 5032-5034.
Liang et al., "Critical Thickness Enhancement of Epitaxial SiGe films Grown on Small Structures," Journal of Applied Physics, vol. 97, (2005) pp. 043519-1-043519-7.
Lim et al., "Facet Evolution in Selective Epitaxial Growth of Si by cold-wall ultrahigh vacuum chemical vapor deposition," J. Vac. Sci. Tech. B 22(2), p. 682 (2004).
Liu et al., "High Quality Single-crystal Ge on Insulator by Liquid-phase Epitaxy on Si Substrates," Applied Physics Letters, vol. 84, No. 14, (Apr. 4, 2004) pp. 2563-2565.
Liu et al., "Rapid Melt Growth of Germanium Crystals with Self-Aligned Microcrubiles on Si Substrates," J. Electrochemical Soc'y, vol. 152, No. 8, (2005) pp. G688-G693.
Loo et al., "Successful Selective Epitaxial Si$_{1-x}$Ge$_x$ Deposition Process for HBT-BiCMOS and high Mobility Heterojunction pMOS Applications," 150 J. Electrochemical Soc'y 10, pp. G638-G647 (2003).
Lourdudoss, S. et al., "Semi-insulating epitaxial layers for optoelectronic devices," 2000 IEEE International Semiconducting and Insulating Materials Conference, pp. 171-178.
Luan et al., "High-quality Ge Epilayers on Si with Low Threading-dislocation Densities," Applied Phsics Letters, vol. 75, No. 19, (Nov. 8, 1999) pp. 2909-2911.
Luan, "Ge Photodectors for Si Microphotonics," Ph.D. Thesis, Massachusetts Institute of Technology, Feb. 2001.
Lubnow et al., "Effect of III/V-Compound Epitaxy on Si Metal-Oxide-Semiconductor Circuits," Jpn. J. Applied Phys., vol. 33 (1994) pp. 3628-3634.
Luryi et al., "New Approach to the High Quality Epitaxial Growth of Latticed-mismatch Materials," Appl. Phys. Lett., vol. 49, No. 3, (Jul. 21, 1986) pp. 140-142.
Martinez et al., "Characterization of GaAs Conformal Layers Grown by Hydride Vapour Phase Epitaxy on Si Substrates by Microphotoluminescence Cathodoluminescence and microRaman," J. Crystal Growth, vol. 210 (2000) pp. 198-202.
Matsunaga et al., "A New Way to Achieve Dislocation-free Heteroepitaxial Growth by Molecular Beam Epitaxy: Vertical Microchannel Epitaxy," J. Crystal Growth, 237-239 (2002) pp. 1460-1465.
Monroy et al., "High UV/visible contrast photodiodes based on epitaxial lateral overgrown GaN layers," Electronics Letters, vol. 35, No. 17, pp. 1488-1489, Aug. 19, 1999.
Nakano, K. et al., "Epitaxial lateral overgrowth of AIN layers on patterned sapphire substrates," Source: Physica Status Solidi A, v 203, n 7, May 2006, p. 1632-35.
Nam et al., "Lateral Epitaxy of Low Defect Density GaN Layers via Organometallic Vapor Phase Epitaxy," Appl. Phys. Letters, vol. 71, No. 18, (Nov. 3, 1997) pp. 2638-2640.
Naoi et al, "Epitaxial Lateral Overgrowth of GaN on Selected-area Si(111) Substrate with Nitrided Si Mask," Journal of Crystal Growth, vol. 248, (2003) pp. 573-577.
Naritsuka et al., "InP Layer Grown on (001) Silicon Substrate by Epitaxial Lateral Overgrowth," Jpn. J. Appl. Physics, vol. 34 (1995), pp. L1432-L1435.
Naritsuka et al., "Vertical Cavity Surface Emitting Laser Fabricated on GaAs Laterally Grown on Si Substrate," Electrochemical Soc'y Proc. vol. 97-21, pp. 86-90.
Neudeck et al., "Novel silicon epitaxy for advanced MOSFET devices," Electron Devices Meeting, 2000 IEDM Technical Digest, pp. 169-172.
Norman, A.G. et al., "Characterization of MOCVD lateral epitaxial overgrown III-V semiconductor layers on GaAs substrates," Int'l Symposium on Compound Semiconductors, pp. 45-46, Aug. 25-27, 2003.
Parillaud et al, "High Quality InP on Si by Conformal Growth," Appl. Phys. Lett., vol. 68, No. 19 (May 6, 1996) pp. 2654-2656.
Park et al., "Defect Reduction and Its Mechanism of Selective Ge Epitaxy in Trenches on Si(001) Substrates Using Aspect Ratio Trapping," Mat. Res. Soc'y Symp. Proc., vol. 994 (2007).

Park et al., "Defect Reduction of Selective Ge Epitaxy in Trenches on Si(001) Substrates using Aspect Ratio Trapping," 90 Appl. Physics Letters (2007).
Park et al., "Growth of Ge Thick Layers on Si(001) Substrates Using Reduced Pressure Chemical Vapor Deposition," 45 Japanese J. Applied Physics 11, pp. 8581-8585 (2006).
Partial International Search for International Application No. PCT/US2006/033859, 7 pages.
Piffault, N. et al., "Assessment of the strain of InP films on Si obtained by HVPE conformal growth," Sixth Int'l Conference on Indium Phosphide and Related Materials, Conf. Proc., pp. 155-158, Mar. 27-31, 1994.
Pribat et al., "High Quality GaAs on Si by Conformal Growth," Appl. Phys. Lett., vol. 60, No. 17 (Apr. 27, 1992) pp. 2144-2146.
Reed et al., "Realization of a three-terminal resonant tunneling device: the bipolar quantum resonant tunneling transistor," 54 Appl. Phys. Letters 11, p. 1034 (1989).
Ren, D. et al., "Low-dislocation-density, nonplanar GaN templates for buried heterostructure lasers grown by lateral epitaxial overgrowth," Applied Physics Letters, v 86, Mar. 14, 2005, 111901-1-111901-3.
Rim et al., "Fabrication and mobility characteristics of ultra-thin strained Si Directly on Insulator (SSDOI) MOSFETs," 2003 IEDM Tech. Dig., pp. 49-52.
Ringel et al., "Single-junction InGaP/GaAs Solar Cells Grown on Si Substrates with SiGe Buffer Layers," Prog. Photovolt.: Res. & Appl. 2002; 10:417-426.
Sakai, "Defect Structure in Selectively Grown GaN films with low threading dislocation density," Appl. Physics Letters 71(16), pp. 2259-2261 (1997).
Sakai, "Transmission electron microscopy of defects in GaN films formed by epitaxial lateral overgrowth," 73 App. Physics Letters 4, pp. 481-483 (1998).
Sakawa et al., "Effect of Si Doping on Epitaxial Lateral Overgrowth of GaAs on GaAs-Coated Si Substrate," Jpn. J. Appl. Physics, vol. 31 (1992), pp. L359-L361.
Sangwoo Pae et al., "Multiple layers of silicon-on-insulator islands fabrication by selective epitaxial growth," Electron Device Letters, vol. 20, No. 5, pp. 194-196, May 1999.
Schaub, J.D. et al., "Resonant-cavity-enhanced high-speed Si photodiode grown by epitaxial lateral overgrowth," Photonics Technology Letters, vol. 11, No. 12, pp. 1647-1649, Dec. 1999.
Seabaugh et al., "Promise of Tunnel Diode Integrated Circuits," Tunnel Diode and CMOS/HBT Integration Workshop, Dec. 9, 1999, Naval Research Laboratory.
Shahidi, G. et al., "Fabrication of CMOS on ultrathin SOI obtained by epitaxial lateral overgrowth and chemical-mechanical polishing," 1990 IEDM Tech. Dig., pp. 587-590.
Siekkinen, J.W. et al., "Selective epitaxial growth silicon bipolar transistors for material characterization," IEEE Transactions on Electron Devices, vol. 35, No. 10, pp. 1640-1644, Oct. 1988.
Su et al., "Catalytic Growth of Group III-nitride Nanowires and Nanostructures by Metalorganic Chemical Vapor Deposition," Applied Physics Letters, vol. 86 (2005) pp. 013105-1-013105-3.
Su et al., "New planar self-aligned double-gate fully-depleted P-MOSFETs using epitaxial lateral overgrowth (ELO) and selectively grown source/drain (S/D)," IEEE International SOI Conference, 2000, pp. 110-111.
Sun, Y. et al., "Temporally resolved growth of InP in the openings off-oriented from [110] direction," 2000 Int'l Conference on Indium Phosphide and Related Materials, Conf. Proc., pp. 227-230.
Sun, Y.T. et al., "InGaAsP multi-quantum wells at 1.5 μm wavelength grown on indium phosphide templates on silicon," 2003 Int'l Conference on Indium Phosphide and Related Materials, pp. 277-280.
Sun, Y.T.; Lourdudoss, S., "Sulfur doped indium phosphide on silicon substrate grown by epitaxial lateral overgrowth," 2004 Int'l Conference on Indium Phosphide and Related Materials, pp. 334-337.
Sun, Y.T.; Napierala, J.; Lourdudoss, S., "Selective area growth of InP on InP precoated silicon substrate by hydride vapor phase epitaxy," 2002 Int'l Conference on Indium Phosphide and Related Materials, pp. 339-342.

Suryanarayanan, G. et al., "Microstructure of lateral epitaxial overgrown InAs on (100) GaAs substrates," Applied Physics Letters, v 83, n 10, Sep. 8, 2003, pp. 1977-1979.

Takasuka et al., "AlGaAs/InGaAs DFB Laser by One-Time Selective MOCVD Growth on a Grating Substrate," 43 Jap. J. App. Phys. 4B (2004) pp. 2019-2022.

Takasuka et al., "InGaAs/AlGaAs Quantum Wire DFB Buried HeteroStructure Laser Diode by One-Time Selective MOCVD on Ridge Substrate," 44 Jap. J. App. Phys. 4B (2005) pp. 2546-2548.

Tamura et al., "Threading Dislocations in GaAs on Pre-patterned Si and in Post-patterned GaAs on Si," J. Crystal Growth, vol. 147, (1995) pp. 264-273.

Tanaka et al., "Structural Characterization of GaN Laterally Overgrown on a (111) Si Substrate," Applied Physics Letters, vol. 79, No. 7 (Aug. 13, 2001) pp. 955-957.

Tomiya, S. et al.., "Dislocation related issues in the degradation of GaN-based laser diodes," IEEE Journal of Selected Topics in Quantum Electronics, vol. 10, No. 6, pp. 1277-1286, Nov.-Dec. 2004.

Tran et al., "Growth and Characterization of InP on Silicon by MOCVD," J. Crystal Growth, vol. 121, (1992) pp. 365-372.

Tsang, W. et al., "The heteroepitaxial ridge-overgrown distributed feedback laser," IEEE Journal of Quantum Electronics, vol. QE-21, No. 6, pp. 519-526, Jun. 1985.

Tsaur, B.-Y. et al., "Low-dislocation-density GaAs epilayers grown on Ge-coated Si substrates by means of lateral epitaxial overgrowth," Applied Physics Letters, v 41, n 4, Aug. 15, 1982, pp. 347-349.

Tseng et al., "Effects of Isolation Materials on Facet Formation for Silicon Selective Epitaxial Growth," 71 Appl. Phys. Letters 16, p. 2328 (1997).

Tsuji et al., "Selective Epitaxial Growth of GaAs on Si with Strained Sort-period Superlattices by Molecular Beam Epitaxy under Atomic Hydrogen Irradiation," J. Vac. Sci. Technol. B., vol. 22, No. 3, (May/Jun. 2004) pp. 1428-1431.

Vanamu et al., "Epitaxial Growth of High-quality Ge Films on Nanostructured Silicon Substrates," Applied Physics Letters, vol. 88, (2006) pp. 204104-1-204104-3.

Vanamu et al., "Growth of High Quality $Ge/Si_{1-x}Ge_x$ on Nano-scale Patterned Si Structures," J. Vac. Sci. Techn. B, vol. 23, No. 4, (Jul./Aug. 2005) pp. 1622-1629.

Vanamu et al., "Heteroepitaxial Growth on Microscale Patterned Silicon Structures," J. Crystal Growth, vol. 280, (2005) pp. 66-74.

Vanamu et al., "Improving $Ge/Si_xGe_{1-x}$ Film Quality through Growth onto Patterned Silicon Substrates," Advances in Electronics Manufacturing Technology, V-EMT 1:25 (Nov. 8, 2004), pp. 1-4.

Vetury et al., "First Demonstration of AlGaN/GaN Heterostructure Field Effect Transistor on GaN grown by lateral epitaxial overgrowth (ELO)," Inst. Phys. Conf. Ser. No. 162: Ch. 5, pp. 177-183.

Wernersson et al., "InAs Epitaxial Lateral growth of W Marks," J. Crystal Growth, vol. 280 (2005) pp. 81-86.

Wuu, D.S. et al., "Defect reduction and efficiency improvement of near-ultraviolet emitters via laterally overgrown GaN on a GaN/patterned sapphire template," Applied Physics Letters, v 89, n 16, Oct. 16, 2006, pp. 161105-1-161105-3.

Xie et al., "From Porous Si to Patterned Si Substrate: Can Misfit Strain Energy in a Continuous Heteroepitaxial Film Be Reduced?" J Va. Sci. Technol. B, vol. 8, No. 2, (Mar./Apr. 1990) pp. 227-231.

Xu et al., "Spin-filter devices based on resonant tunneling antisymmetrical magnetic semiconductor hybrid structures," 84 App. Phys. Letters 11, pp. 1955-1957 (2004).

Yamaguchi et al., "Analysis for Dislocation Density Reduction in Selective Area Grown GaAs Films on Si Substrates," Appl. Phys. Lett. vol. 56, No. 1, (Jan. 1, 1990) pp. 27-29.

Yamaguchi et al., "GaAs Solar Cells Grown on Si Substrates for Space Use," Prog. Photovolt.: Res. Appl. 2001; 9:191-201.

Yamaguchi et al., "Super-high-efficiency Multi-junction Solar Cells," Prog. Photovolt.: Res. Appl. 2005; 13:125-132.

Yamaguchi et al., "Defect Reduction Effects in GaAs on Si Substrates by Thermal Annealing," Appl. Phys. Letters 53(23), p. 2293 (1998).

Yamamoto et al., "Optimization of InP/Si Heteroepitaxial Growth Conditions Using Organometallic Vapor Phase Epitaxy," J. Crystal Growth, vol. 96, (1989) pp. 369-377.

Yang et al., "High Performance CMOS Fabricated on Hybrid Substrate with Different Crystal Orientations," 2003 IEDM Tech. Dig., pp. 453-456.

Yang et al., "Selective Area Deposited Blue GaN-InGaN Multiple-quantum Well Light Emitting Diodes over Silicon Substrates," Applied Physics Letter, vol. 76, No. 3, (Jan. 17, 2000) pp. 273-275.

Yoon et al., "Selective Growth of Ge Islands on Noanometer-scale Patterned $SiO_2/Si$ Substrate by Molecular Beam Epitaxy," Applied Physics Letters, vol. 89 (2006) pp. 063107-1-063107-3.

Zamir et al., "Thermal Microcrack Distribution Control in GaN Layers on Si Substrates by Lateral Confined Epitaxy," Applied Physics Letters, vol. 78, No. 3, (Jan. 15, 2001) pp. 288-290.

Zang, K.Y. et al., "Nanoheteroepitaxial lateral overgrowth of GaN on nanoporous Si(111)," Applied Physics Letters, v 88, n. 14, Apr. 3, 2006, p. 141925.

Zang, K.Y. et al., "Nanoscale lateral epitaxial overgrowth of GaN on Si (111)," Applied Physics Letters, v 87, Nov. 7, 2005, p. 193106-1-193106-3.

Zela et al., "Single-crystalline Ge Grown Epitaxially on Oxidized and Reduced Ge/Si (100) Islands," J. Crystal Growth, vol. 263 (2004) pp. 90-93.

Zhang et al., "Removal of Threading Dislocations from Patterned Heteroepitaxial Semiconductors by Glide to Sidewalls," J. Electronic Materials, vol. 27, No. 11, (1998) pp. 1248-1253.

Zhang et al., "Strain Status of Self-assembled InAs Quantum Dots," Applied Physics Letters, vol. 77, No. 9, (Aug. 28, 2000) pp. 1295-1297.

Zheleva, T.S.; Ok-Hyun Nam; Ashmawi, W.M.; Griffin, J.D.; Davis, R.F., "Lateral epitaxy and dislocation density reduction in selectively grown GaN structures," J. Crystal Growth, v 222, n 4, Feb. 2001, pp. 706-718.

Zubia et al., "Initial Nanoheteroepitaxial Growth of GaAs on Si(100) by OMVPE." J. Electronic Materials, vol. 30, No. 7, (2001) pp. 812-816.

Intel Press Release, "Intel's Tri-Gate Transistor to Enable Next Era in Energy-Efficient Performance," Intel Corporation (Jun. 12, 2006).

Hammerschmidt, "Intel to Use Trigate Transistors from 2009 on," EETIMES Online, available at: http://www.eetimes.com/showArticle.jhtml?articleID=189400035 (Jun. 12, 2006).

Lammers, "Trigate and High-kstack up vs. planar," EETIMES Online, available at: http://www.eetimes.com/showArticle.jhtml?articleID=188703323&pgno=2&printable=true (Jun. 12, 2006).

Intel to Develop Tri-Gate Transistors Based Processors, available at: http://news.techwhack.com/3822/tri-gate-transistors/ (Jun. 13, 2006).

Ames, "Intel Says More Efficient Chips are Coming," PC World, available at: http://www.pcworld.com/printable/article/id,126044/printable.html (Jun. 12, 2006).

Bergman et al., "RTD/CMOS Nanoelectronic Circuits: Thin-Film InP-based Resonant Tunneling Diodes Integrated with CMOS circuits," 20 Electron Device Letters 3, pp. 119-122 (1999).

Cloutier et al., "Optical gain and stimulated emission in periodic nanopatterned crystalline silicon," Nature Materials, Nov. 2005.

Feng et al., "Integration of Germanium-on-Insulator and Silicon MOSFETs on a Silicon Substrate," 27 Electron Device Letters 11, pp. 911-913 (2006).

Fischer et al., "Elastic stress relaxation in SiGe epilayers on patterned Si substrates," 75 Journal of Applied Physics 1, pp. 657-659 (1994).

Fischer et al., "State of stress and critical thickness of Strained small-area SiGe layers," Phys. Stat. Sol. (a) 171, pp. 475-485 (1999).

Fitzgerald et al., "Structure and recombination in InGaAs/GaAs heterostructures," 63 Journal of Applied Physics 3, pp. 693-703 (1988).

Fitzgerald et al., "Totally relaxed $Ge_xSi_{1-x}$ layers with low threading dislocation densities grown on Si Substrates," 59 Applied Physics Letters 7, pp. 811-813 (1991).

Gibbon et al., "Selective-area low-pressure MOCVD of GaInAsP and related materials on planar InP substrates" Semicond Sci Tech. 8, pp. 998-1010 (1993).

International Preliminary Report on Patentability for International Application No. PCT/US2006/019152, dated Nov. 20, 2007.

International Search Report and Written Opinion for International Application PCT/US2007/007373, dated Oct. 5, 2007.
Ismail et al., "High-quality GaAs on sawtooth-patterned Si substrates," 59 Applied Physics Letters 19, pp. 2418-2420 (1991).
Jain et al., "Stresses in strained GeSi stripes and quantum structures: calculation using the finite element method and determination using micro-Raman and other measurements," Thin Solid Films 292 (1997) pp. 218-226.
Neumann et a., "Growth of III V resonant tunneling diode," J. of Crystal Growth (2003).
Prost, W., ed. QUDOS Technical Report 2002-2004.
Sun et al., "Thermal strain in Indium Phosphide on silicon obtained by Epitaxial Lateral Overgrowth," 94 J. of Applied Physics 4, pp. 2746-2748 (2003).
Usuda et al., "Strain relaxation of strained-Si layers on SiGe-on-insulator (SGOI) structures after mesa isolation," Applied Surface Sci. 224, pp. 113-116 (2004).
Usui et al., "Thick GaN Epitaxial Growth with Low Dislocation Density by Hydride Vapor Phase Epitazy," 36 Jap. J. of Applied Physics, pp. L899-L902 (1997).
Vescan et al., "Lateral confinement by low pressure chemical vapor deposition-based selective epitaxial growth of $Si_{1-x}Ge_x$/Si nanostructures," 81 J. of Applied Physics 10, pp. 6709-6715 (1997).
Choi et al., "Monolithic Integration of Si MOSFET's and GaAs MESFET's," Electron Device Letters, v. EDL-7, No. 4 (1986).
Choi et al., "Monolithic Integration of GaAs/AlGaAs Double-Heterostructure LED's and Si MOSFET's," Electon Device Letters, v. EDL-7, No. 9 (1986).
Choi et al., "Monolithic Integration of GaAs/AlGaAs Led and Si Driver Circuit," 9 Electron Device Letters 10 (1988).
Fiorenza et al., "Film Thickness Constraints for Manufacturable Strained Silicon CMOS," 19 Semiconductor Sci. Technol., pp. L4 (2004).
Hu et al., "Growth of Well-Aligned Carbon Nanotube arrays on Silicon Substrates using Porous Alumina Film as a Nanotemplate," 79 App. Physics Letters 19 (2001).
International Search Report and Written Opinion for International Application No. PCT/US2007/020181, dated Jan. 25, 2008.
International Search Report and Written Opinion for International Application No. PCT/US07/020777, mailed Feb. 8, 2008.
Rosenblad et al., "A Plasma Process for Ultrafast Deposition of SiGe Graded Buffer Layers," 76 Applied Physics Letters 4, pp. 427-429 (2000).
Shichijo et al., "Co-Integration of GaAs MESFET & Si CMOS Circuits," 9 Elec. Device. Letters 9 (1988).
Tamura et al., "Heteroepitaxy on high-quality GaAs on Si for Optical Interconnections on Si Chip," Proceedings of the SPIE, vol. 2400, pp. 128-139 (1995).
International Search Report and Written Opinion for International Application No. PCT/US2007/019568, mailed Feb. 6, 2008.
IPRP for International Application No. PCT/US2006/029247, mailed Feb. 7, 2008.

Bean et al., "$Ge_xSi_{1-x}$/Si strained-later superlattice grown by molecular beam epitaxy," J. Vac. Sci. Tech. A (2)2, pp. 436-440 (1984).
Blakeslee, "The Use of Superlattices to Block the Propogation of Dislocations in Semiconductors," Mat. Res. Soc. Symp. Proc. 148, pp. 217-227.
Currie et al., "Carrier Mobilities and Process Stability of Strained Si n- and p-MOSFETs on SiGe Virtual Substrates," J. Vac. Sci. Tech. B 19(6), pp. 2268-2279 (2001).
Donaton et al., "Design and Fabrication of MOSFETs with a Reverse Embedded SiGe (Rev. e-SiGe) Structure," 2006 IEDM, pp. 465-468.
International Technology Roadmap for Semiconductors-Front End Processes, pp. 1-62 (2005).
IPRP for International Application No. PCT/US2006/033859, mailed Mar. 20, 2008.
Matthews et al., "Defects in Epitaxial Multilayers-Misfit Dislocations," J. Crystal Growth 27, pp. 118-125 (1974).
Pidin et al., "MOSFET Current Drive Optimization Using Silicon Nitride Capping Layer for 65-nm Technology Node," 2004 Symp. On VLSI Technology, Dig. Tech. Papers, pp. 54-55.
Rim et al., "Enhanced Hole Mobilities in Surface-channel Strained-Si p-MOSFETs," 1995 IEDM, pp. 517-520.
Thean et al., "Uniaxial-Biaxial Hybridization for Super-Critical Strained-Si Directly on Insulator (SC-SSOI) PMOS with Different Channel Orientations," IEEE, pp. 1-4 (2005).
Thompson et al., "A Logic Nanotechnology Featuring Strained-Silicon," 25 IEEE Electron Device Letters 4, pp. 191-193 (2004).
Yin et al., "Ultrathin Strained-SOI by Stress Balance on Compliant Substrates and FET Performance," 52 IEEE Trans. on Electron Devices 10, pp. 2207-2214 (2005).
Examination Report in European Patent Application No. 06800414.2, mailed Mar. 5, 2009 (3 pages).
International Preliminary Report on Patentability for International Application No. PCT/US2007/019568, mailed Mar. 19, 2009 (7 pages).
International Preliminary Report on Patentability for International Application No. PCT/US07/021023, mailed Apr. 9, 2009 (8 pages).
International Preliminary Report on Patentability for International Application No. PCT/US2007/020181, mailed Apr. 2, 2009 (9 pages).
International Preliminary Report on Patentability for International Application No. PCT/US07/022392, mailed Apr. 30, 2009 (14 pages).
International Preliminary Report on Patentability for International Application No. PCT/US07/020777, mailed Apr. 9, 2009 (12 pages).
International Search Report and Written Opinion for International Application No. PCT/US07/022392, mailed Apr. 11, 2008 (20 pages).
International Search Report and Written Opinion for International Application No. PCT/US2008/068377, mailed Jul. 6, 2009 (19 pages).
Partial International Search Report for International Application No. PCT/US2008/068377, mailed Apr. 7, 2009.

* cited by examiner

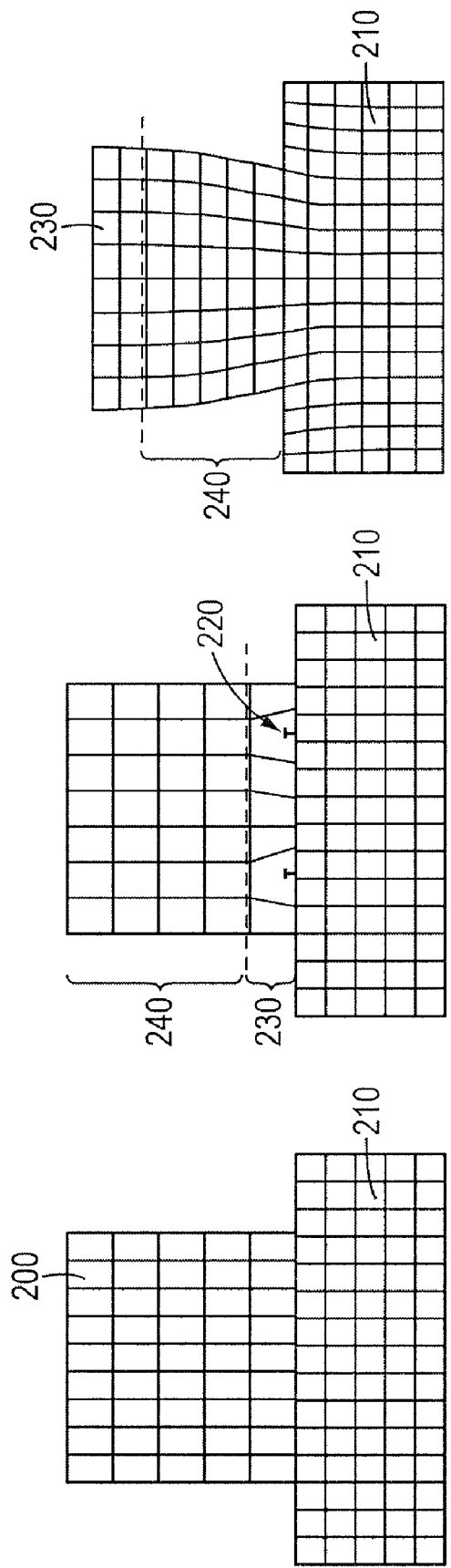

LATTICE-MISMATCHED SEMICONDUCTOR STRUCTURES AND RELATED METHODS FOR DEVICE FABRICATION

RELATED APPLICATIONS

This application claims the benefit of and priority to U.S. Provisional Application Ser. No. 60/785,567 filed Mar. 24, 2006, the entire disclosure of which is hereby incorporated by reference.

FIELD OF THE INVENTION

The technology disclosed herein relates generally to lattice-mismatched semiconductor heterostructures and, more specifically, to the selective epitaxial growth of the active-area material in connection with the integration of dissimilar semiconductor materials.

BACKGROUND

The increasing operating speeds and computing power of microelectronic devices have recently given rise to the need for an increase in the complexity and functionality of the semiconductor structures from which these devices are fabricated. Hetero-integration of dissimilar semiconductor materials, for example, III-V materials, such as gallium arsenide, gallium nitride, indium aluminum arsenide, and/or germanium with a silicon or silicon-germanium substrate, is an attractive path to increasing the functionality and performance of the CMOS platform. One technique for such integration is often referred to as "heteroepitaxial growth" or "heteroepitaxy," i.e. epitaxial growth of a semiconductor material over a semiconductor substrate, for example, by chemical vapor deposition ("CVD") or molecular beam epitaxy ("MBE"), where the semiconductor material, when fully relaxed, has a different lattice constant than the underlying substrate. In particular, heteroepitaxial growth can be advantageously employed to:

(i) fabric ate semiconductor devices for which lattice-matched substrates are not commercially available, e.g. some types of ultra-high speed RF or optoelectronic devices;

(ii) combine multiple new materials on a single wafer, e.g. Ge for p-channel FET devices and InGaAs or InSb for n-channel FET devices;

(iii) improve performance of the conventional CMOS platform by replacing Si, in active areas of some or all transistors on a wafer, with semiconductor materials with higher mobility and saturation velocity than Si, i.e. Ge and/or III-V materials; and (iv) achieve monolithic integration of semiconductor materials with large mismatch to Si with silicon microelectronics in a manner that is minimally, if at all, disruptive to the CMOS process.

Depending on the application, key considerations for using selective heteroepitaxy for fabrication of semiconductor devices include:

control of defect density, surface morphology, and degree of relaxation of the desired portions of heteroepitaxial regions;

ease of integration of heteroepitaxy into device manufacturing process; and reliability of electrical isolation of the defective regions from the active regions of the heterostructure.

Performance and, ultimately, the utility of devices fabricated using a combination of dissimilar semiconductor materials depend on the quality of the resulting structure. Specifically, a low level of dislocation defects is important in a wide variety of semiconductor devices and processes, because dislocation defects partition an otherwise monolithic crystal structure and introduce unwanted and abrupt changes in electrical and optical properties, which, in turn, results in poor material quality and limited performance. In addition, dislocation defects can degrade physical properties of the device material and can lead to premature device failure.

As mentioned above, dislocation defects typically arise in efforts to epitaxially grow one kind of crystalline material on a substrate of a different kind of material—often referred to as "heterostructure"—due to different crystalline lattice sizes of the two materials. This lattice mismatch between the starting substrate and subsequent layer(s) creates stress during material deposition that generates dislocation defects in the semiconductor structure.

Misfit dislocations form at the mismatched interface to relieve the misfit strain. Many misfit dislocations have vertical components, termed "threading segments," which terminate at the surface. These threading segments continue through all semiconductor layers subsequently added to the heterostructure. In addition, dislocation defects can arise in the epitaxial growth of the same material as the underlying substrate where the substrate itself contains dislocations. Some of the dislocations replicate as threading dislocations in the epitaxially grown material. Such dislocations in the active regions of semiconductor devices such as diodes, lasers and transistors, may significantly degrade performance.

To reduce formation of dislocations and associated performance issues, many semiconductor heterostructure devices known in the art have been limited to semiconductor layers that have very closely—e.g. within 0.1%—lattice-matched crystal structures. In such devices, a thin layer is epitaxially grown on a mildly lattice-mismatched substrate. As long as the thickness of the epitaxial layer is kept below a critical thickness for defect formation, the substrate acts as a template for growth of the epitaxial layer, which elastically conforms to the substrate template. While lattice-matching (or near matching) eliminate dislocations in a number of structures, there are relatively few known lattice-matched systems, limiting the design options for new devices.

Accordingly, there is considerable interest in heterostructure devices involving greater epitaxial layer thickness and greater lattice misfit than known approaches may allow. For example, it has long been recognized that gallium arsenide grown on silicon substrates may permit a variety of new optoelectronic devices, combining the electronic processing technology of silicon VLSI circuits with the optical component technology available in gallium arsenide. See, for example, Choi et al, "Monolithic Integration of Si MOSFET's and GaAs MESFET's," IEEE Electron Device Letters, Vol. EDL-7, No. 4, April 1986, incorporated herein by reference. Highly advantageous results of such a combination include high-speed gallium arsenide circuits combined with complex silicon VLSI circuits, and gallium arsenide optoelectronic interface units to replace wire interconnects between silicon VLSI circuits. Progress has been made in integrating gallium arsenide and silicon devices. See, for example, Choi et al, "Monolithic Integration of GaAs/AlGaAs Double-Heterostructure LED's and Si MOSFET's" IEEE Electron Device Letters, Vol. EDL-7, No. 9, September 1986; and Shichijo et al, "Co-Integration of GaAs MESFET and Si CMOS Circuits," IEEE Electron Device Letters, Vol. 9, No. 9, September 1988, both of which are incorporated herein by reference. However, despite the widely recognized potential advantages of such combined structures and substantial efforts to develop them, their practical utility has been limited by high defect densities in gallium arsenide layers grown on silicon substrates. See, for example, Choi et al, "Monolithic Integration of GaAs/AlGaAs LED and Si Driver Circuit," IEEE Electron Device Letters, Vol. 9, No. 10, October 1988 (p. 513), incorporated herein by reference. Thus, while basic techniques are known for integrating gallium arsenide and silicon devices, there exists a need for producing gallium arsenide layers having a low density of dislocation defects.

To control dislocation densities in highly-mismatched semiconductor layers, techniques such as wafer bonding and compositional grading have been explored.

Bonding of two different semiconductors may yield satisfactory material quality. Due to the limited availability and high cost of large size Ge or III-V wafers, however, the approach may not be practical.

Compositional grading also may yield satisfactory material quality for some applications, but requires growth of very thick epitaxial layers if substantial lattice mismatch is involved. For example, achieving high quality Ge on Si requires approximately 10 mircons of epitaxial growth. Growing such thick layers may be costly and may also lead to large and deleterious thermal stresses due to differences between the thermal expansion coefficients of the substrate and epitaxial layer. For these reason, compositional grading method may not be practical for many applications.

Another known technique to control dislocations in highly-mismatched semiconductor layers, termed "epitaxial necking" or "aspect ratio trapping," was demonstrated in connection with fabricating a Ge-on-Si heterostructure by Langdo et al. in "High Quality Ge on Si by Epitaxial Necking," Applied Physics Letters, Vol. 76, No. 25, April 2000, and also by Park et al. in "Defect reduction of selective Ge epitaxy in trenches on Si (001) substrates using epitaxial necking," Applied Physics Letters, Vol. 90, 052113, February 2007, both of which are incorporated herein by reference. Relaxation of strain due to mismatched epitaxy can be accomplished by "plastic relaxation," i.e., relaxation through the nucleation of dislocations 100. The "epitaxial necking" technique focuses on confining these undesirable dislocations to the lower portion of a hole or trench, within a predetermined distance H of the substrate 110-epitaxy interface as shown in FIG. 1a. The semiconductor material grown above a distance H from the substrate can therefore be substantially defect free, and can serve as useful material for the fabrication of a semiconductor device. This approach offers process simplicity by utilizing a combination of selective epitaxial growth and defect crystallography to force defects to the sidewall of the opening in the patterning mask.

Specifically, as shown in FIG. 1b it has been observed experimentally that dislocations in a mismatched cubic semiconductor grown on a Si (100) surface in the near vicinity (e.g., within approximately 500 nm or less) of a vertical dielectric sidewall surface bend toward that surface at approximately 30 degrees through 60 degrees. For example, the dislocations may bend toward that surface at approximately a 45 degree angle to that surface. Based on this relationship, the predetermined distance H necessary to trap a substantial majority of dislocation defects is, typically, approximately equal to a width between ½ w and 2 w, where w is the width of the trench. This range is based on the noted range of intersection angles of approximately 30 degrees through 60 degrees, leading to: $\tan(30°)\ w \leq H \leq \tan(60°)\ w$, which roughly corresponds to $½\ w \leq H \leq 2\ w$. Determination of more precise values of H for given semiconductor and substrate combinations, and for given hole or trench dimensions, sidewall materials, and sidewall orientations, is an area requiring more detailed study. For the specific case of Ge grown on (100) Si within trenches oriented along <110> directions with $SiO_2$ sidewalls, H is approximately equal to w (see Park et al., cited above). However, there are limitations to this technique. First, the size of the area for which this technique can successfully trap dislocations is restricted, as noted in the above relation between H and w. This may restrict practical use of epitaxial necking to applications involving relatively small semiconductor devices. Second, the presence of dislocations in the lower portion of the trench or hole may not be acceptable for some device applications, unless a way is found to keep the active regions of a semiconductor device electrically isolated from the dislocations. For some applications, their presence may not be acceptable in any case, and so a means of selective growth that avoids such dislocations (i.e., dislocations associated with plastic relaxation) entirely is highly desirable.

Thus, there is a need in the art for versatile and efficient methods of fabricating semiconductor heterostructures that constrain substrate interface defects in a variety of lattice-mismatched materials systems. There is also a need in the art for semiconductor devices utilizing a combination of integrated lattice-mismatched materials with reduced levels of substrate interface defects for improved functionality and performance.

SUMMARY

Aspects of the technology disclosed herein provide semiconductor heterostructures with significantly reduced interface defects, and methods for their fabrication that address limitations of known techniques. In its various aspects and implementations, the technology disclosed herein enables fabrication of semiconductor heterostructures including limited-area regions having upper surfaces substantially exhausted (or having tolerable concentrations) of threading dislocations. As a result, fabrication of semiconductor devices based on monolithic lattice-mismatched heterostructures long sought in the art but heretofore impractical due to dislocation defects may be realized.

In particular applications, aspects of the present technology feature semiconductor structures of Ge or III-V devices integrated with a Si substrate, such as, for example, gallium arsenide formed on a silicon substrate, as well as methods of producing semiconductor structures that contemplate integrating Ge or III-V materials on selected areas on a Si substrate.

In general, in one aspect, the technology disclosed herein features a method of forming a semiconductor heterostructure. The method includes providing a substrate that contains, or consists essentially of, a first semiconductor material, and then providing a dielectric mask thereover to define a seed window extending to the surface of the substrate. A second semiconductor material, lattice-mismatched to the underlying substrate, is epitaxially grown within and out of the seed window, laterally expanding over the mask, such that the lattice mismatch is at least partially accommodated within a portion of the second semiconductor material by elastic relaxation.

In another aspect, the present technology features a method of forming a semiconductor heterostructure that begins with providing a substrate including a first semiconductor material. The method additionally includes providing a dielectric mask thereover to define a self-assembled array of apertures extending to the surface of the substrate. A second semiconductor material, lattice-mismatched to the underlying substrate, is epitaxially grown within and out of the apertures, laterally expanding over the mask. Threading dislocations in the second semiconductor material decrease in density with increasing distance from the surface of the substrate.

Generally, in yet another aspect, the present technology provides a method of forming a semiconductor heterostructure that begins with providing a substrate including a first semiconductor material. The method additionally includes providing a self-assembled plurality of dielectric pillars extending from the surface of the substrate. A second semiconductor material, lattice-mismatched to the underlying substrate, is epitaxially grown over the substrate between the pillars, such that threading dislocations in the second semiconductor material decrease in density with increasing distance from the surface of the substrate.

In a further aspect, the technology disclosed herein contemplates a method of forming a semiconductor heterostructure. The method includes providing a substrate that contains, or consists essentially of, a first semiconductor material, and then providing a dielectric mask thereover to define a seed window extending to the surface of the substrate. The method additionally includes removing a portion of the surface of the substrate exposed within the window, thereby defining a notch, and then epitaxially depositing, in the window over the portion of the surface, a second semiconductor material having a hexagonal crystalline lattice, such that threading dislocations in the second semiconductor material decrease in density with increasing distance from the surface of the substrate.

In other aspects, the present technology features methods for electrical isolation of defective areas of heteroepitaxial region formed over the substrate from non-defective areas by forming a homo- or heterojunction within the heteroepitaxial region, and methods for control of surface characteristics of heteroepitaxial regions. Electronic and optoelectronic devices fabricated over the semiconductor heterostructures referenced above are also contemplated, as discussed in more detail below.

In an aspect, the invention features a structure including lattice-mismatched materials. The structure includes a substrate including a first crystalline material and having a top substrate surface. A non-crystalline mask layer is disposed above the substrate, the non-crystalline mask layer having a top surface and an opening defined by sidewalls extending from the top surface of the non-crystalline mask layer to the top substrate surface. A second crystalline material is disposed in the opening, the second crystalline material having a lattice mismatch to the first crystalline material and a thickness sufficient to permit a majority of defects arising from the lattice mismatch to exit the second crystalline material at the sidewalls. A third crystalline material is disposed above the second crystalline material and defines a junction therebetween the second crystalline material and the third crystalline material, the junction confining selected charge carriers to one side of the junction.

One or more of the following features may be included. The second crystalline material may include a first semiconductor material having a first doping type and a first doping level, the third crystalline material may include a second semiconductor material having a second doping type and a second doping level, with the first and second doping types being the same, and the first and second doping levels being different.

The second crystalline material may include a first semiconductor material having a first doping type and the third crystalline material may include a second semiconductor material having a second doping type, with the first doping type being different from the second doping type.

The second crystalline material may include a first semiconductor material, the third crystalline material may include a second semiconductor material, and the first and second semiconductor materials may be different; optionally, the second and third crystalline materials may be substantially lattice matched.

The second and third crystalline materials may each comprise at least one III-V semiconductor compound. The second and third crystalline materials may form a type II heterojunction.

A device may be at least partially disposed over the third crystalline material. An active area of the device may include at least a portion of the third crystalline material. The device may be a MOSFET, a photo-sensitive device, a light emitting device, or a photovoltaic device.

The confined selected charge carriers may include holes and/or electrons. The substrate may include Si. The mask layer may include $SiO_2$. The opening in the mask layer may include a substantially circular, substantially square, or substantially rectangular cross-section; the opening may comprise an elongated trench. The sidewalls of the opening may be substantially perpendicular to a top substrate surface. The third crystalline material may includes a top surface that is substantially coplanar with the top surface of the mask layer.

In another aspect, the invention features a structure including lattice-mismatched materials. The structure includes a substrate including a first crystalline semiconductor material. A second crystalline semiconductor material having a lattice mismatch to the substrate is disposed on the substrate in a predetermined configuration defining a top surface and a lateral sidewall surface extending from a top surface of the substrate to the top surface defined by the predetermined configuration. The sidewall surface has a height above the substrate top surface sufficient to permit a majority of defects arising from the lattice mismatch to exit the second crystalline semiconductor material at the lateral sidewall surface. A third crystalline semiconductor material substantially lattice matched with the second crystalline material, the third crystalline material being disposed on at least a portion of the sidewall surface of the second material to define an outer sidewall surface.

The lateral sidewall surface may include a column defining a generally circular or generally square cross-section. The lateral sidewall surface may define an elongated cross-section parallel to a top surface of the substrate, the elongated cross section length being more than twice its width. The third crystalline semiconductor material may have a bandgap wider than a bandgap of the second crystalline semiconductor material. An insulating material may be disposed adjacent to and in contact with at least a portion of the lateral sidewall surface. The insulating material may have a height above the substrate greater than the height sufficient to permit a majority of defects arising from the lattice mismatch between the substrate and the second crystalline semiconductor material to exit the second crystalline semiconductor material at the lateral sidewall surface.

An insulating material may be disposed adjacent to and in contact with the outer sidewall surface. The insulating material and the second and third crystalline semiconductor materials may each define a respective planar top surface, and the planar top surfaces are substantially coplanar. The third crystalline semiconductor material may be disposed over substantially the entire lateral sidewall surface. The third crystalline semiconductor material may be disposed over the top surface of the second crystalline material to define an outer top surface.

An insulating material may be disposed over the outer sidewall surface. The insulating material and third crystalline semiconductor material may each defines a planar top surface, with the planar top surfaces being substantially coplanar.

The third crystalline semiconductor material may be disposed over the substrate adjacent the second crystalline semiconductor material.

The second crystalline semiconductor material may define a plurality of predetermined shapes, each shape having a top surface and a lateral sidewall surface extending from the substrate to the top surface, the sidewall surface having a height above the substrate sufficient to permit a majority of defects arising from the lattice mismatch to exit the second crystalline semiconductor material at the sidewall surface. The third crystalline semiconductor material may include a contiguous layer disposed on and in contact with the second crystalline semiconductor material.

The second and third crystalline semiconductor materials may define a heterojunction.

In another aspect, the invention features a structure including lattice-mismatched materials. The structure includes a substrate including a first crystalline semiconductor material. A mask layer is disposed above the substrate, the mask layer having a top surface and a plurality of openings defined by sidewalls extending through the mask layer from the top surface to the substrate. A second crystalline material is disposed within each of the openings and has a lattice mismatch to the first crystalline material and a thickness sufficient to permit a majority of defects arising from the lattice mismatch to exit the second material at the sidewalls. A third crystalline semiconductor material is disposed within the openings above the second crystalline material and defines a junction in each opening for confining selected charge carriers to one side of the junction.

The third crystalline material disposed within an opening is discontinuous with the third crystalline material disposed in other openings. The second and third crystalline materials may define heterojunctions within the plurality of openings, and a plurality of semiconductor device elements may be associated with the plurality of openings.

The device elements comprise a photo-electric device element, a photo-emissive device element, and/or a photovoltaic device element.

The plurality of openings in the mask layer may define a rectangular array having spacings in an x-direction and in a y-direction. An array of photo-emissive device elements may be associated with the rectangular array of openings, and the spacings in each of the x- and the y-directions may be equal to an integer number of half wavelengths of a frequency of light emitted by the photo-emissive device elements.

In another aspect, the invention features a structure including lattice-mismatched materials. The structure includes a substrate comprising a first crystalline material. A first non-crystalline mask layer is disposed over the substrate, the first non-crystalline mask layer including a first window exposing at least a portion of the substrate. A second crystalline material is disposed in the window, the second crystalline material having a lattice mismatch to the first crystalline material, the lattice mismatch inducing strain in the second crystalline material. An area of the window exposing at least a portion of the substrate is sufficiently small to permit elastic relaxation of the second crystalline material without introduction of strain-related defects. A thickness of the second crystalline material is sufficiently high such that an inner region of the second crystalline material is partially relaxed and relieves strain from the lattice mismatch, and an outer region of the second crystalline material is substantially relaxed.

A semiconductor device may be disposed over the second crystalline material. An active area of the semiconductor device may include at least a portion of the second crystalline material. The first window may be defined by at least one sidewall substantially perpendicular to a top surface of the substrate. The first window may be defined by at least one sidewall substantially non-perpendicular to a top surface of the substrate. The first window may be defined by at least one sidewall including a plurality of regions, each region being at a different angle to a top surface of the substrate. The window may include a wider upper portion and a narrower lower portion. A second non-crystalline material may be disposed in the window.

Another aspect of the invention features a structure including lattice-mismatched materials. The structure includes a substrate including a first crystalline material. A non-crystalline mask layer is disposed above the substrate, the mask layer having a top surface and a plurality of openings defined by sidewalls extending from the top surface of the non-crystalline mask layer to a top surface of the substrate. A second crystalline material is disposed in the openings, the second crystalline material having a lattice mismatch to the first crystalline material and a thickness sufficient to permit a majority of defects arising from the lattice mismatch to exit the second material at the sidewalls. A third crystalline material is disposed above the second crystalline material, the third crystalline material disposed in each opening being non-contiguous with the third crystalline material disposed in other openings.

The structure may include a plurality of semiconductor devices, with each semiconductor device comprising an active region disposed in an opening in the mask layer. The plurality of semiconductor devices may be connected in parallel. The semiconductor devices may include an LED.

In another aspect, the invention features a structure including lattice-mismatched materials. The structure includes a substrate including a first crystalline material and having a top substrate surface. A non-crystalline mask layer is disposed above the substrate, the non-crystalline mask layer having a top surface and an opening defined by sidewalls extending from the top surface of the non-crystalline mask layer to the top substrate surface. A second crystalline material is disposed in the opening, the second crystalline material having a lattice mismatch to the first crystalline material and a thickness sufficient to permit a majority of defects arising from the lattice mismatch to exit the second crystalline material at the sidewalls. A third crystalline material is disposed above the second crystalline material and define a junction between the second crystalline material and the third crystalline material. The second and third crystalline materials are substantially lattice matched.

In another aspect, the invention features a structure including lattice-mismatched materials. The structure includes a substrate including a first crystalline semiconductor material. A mask layer is disposed above the substrate, the mask layer having a top surface and a plurality of openings defined by sidewalls extending through the mask layer from the top surface to the substrate. A second crystalline material is disposed within each of the openings and has a lattice mismatch to the first crystalline material and a thickness sufficient to permit a majority of defects arising from the lattice mismatch to exit the second material at the sidewalls. A third crystalline semiconductor material is disposed within the openings above the second crystalline material and defines a junction in each opening. The second and third crystalline materials are substantially lattice matched.

In another aspect, the invention features a method for forming a structure, including forming a non-crystalline mask layer over a top surface of a substrate including a first crystalline material, the non-crystalline mask layer having a top surface. An opening is formed in the non-crystalline mask layer, the opening including at least one sidewall extending from the top surface of the non-crystalline mask layer to the top surface of the substrate. A second crystalline material is introduced into the opening, the second crystalline material having a lattice mismatch to the first crystalline material and a thickness sufficient to permit a majority of defects arising from the lattice mismatch to exit the second crystalline material at the at least one sidewall. A third crystalline material is formed above the second crystalline material to define a junction between the second crystalline material and the third crystalline material. The junction is configured to confine selected charge carriers to one side of the junction.

In another aspect, the invention features a method for forming a structure including lattice-mismatched materials, the method including providing a substrate comprising a first crystalline semiconductor material. A layer is formed over the substrate, the layer (i) including a second crystalline semiconductor material having a lattice mismatch to the substrate and (ii) defining a predetermined shape having a top surface and a lateral sidewall surface extending from a top surface of the substrate to the top surface of the predetermined shape, the sidewall surface having a height above the top surface of the substrate sufficient to permit a majority of defects arising from the lattice mismatch to exit the second material at the lateral sidewall surface. A third crystalline semiconductor material substantially lattice matched with the second crystalline material is provided, the third crystalline material being disposed on at least a portion of the sidewall surface of the second material to define an outer sidewall surface.

In another aspect, the invention features a method for forming a structure including lattice-mismatched materials, the method including forming a mask layer above a substrate including a first crystalline semiconductor material, the mask layer having a top surface and a plurality of openings defined by sidewalls extending through the mask layer from the top surface to a top surface of the substrate. A second crystalline material is introduced into each of the openings, the second crystalline material having a lattice mismatch to the first crystalline material and a thickness sufficient to permit a majority of defects arising from the lattice mismatch to exit the second material at the sidewalls. A third crystalline semiconductor material is introduced into each of the openings above the second crystalline material, defining a junction in each opening configured to confine selected charge carriers to one side of the junction.

In another aspect, a method for forming a structure including lattice-mismatched materials includes forming a first non-crystalline mask layer over a substrate including a first crystalline material. A a first window is defined in the first non-crystalline mask layer to expose at least a portion of the substrate. A second crystalline material is introduced into the window, the second crystalline material having a lattice mismatch to the first crystalline material, the lattice mismatch inducing strain in the second crystalline material. A area of the window exposing at least a portion of the substrate is sufficiently small to permit elastic relaxation of the second crystalline material without introduction of strain-related defects. A thickness of the second crystalline material is sufficiently high such that an inner region of the second crystalline material is partially relaxed and relieves strain from the lattice mismatch, and an outer region of the second crystalline material is substantially relaxed.

In yet another aspect, the invention features a method for forming a structure including lattice-mismatched materials. The method includes forming a non-crystalline mask layer over a substrate including a first crystalline material, the mask layer having a top surface. A plurality of openings are defined in the non-crystalline mask layer, each of the openings defined by sidewalls extending from the top surface of the non-crystalline mask layer to a top surface of the substrate. A second crystalline material is introduced into the openings, the second crystalline material having a lattice mismatch to the first crystalline material and a thickness sufficient to permit a majority of defects arising from the lattice mismatch to exit the second material at the sidewalls. A third crystalline material is introduced above the second crystalline material, such that the third crystalline material disposed in each opening is non-contiguous with the third crystalline material disposed in other openings.

In another aspect, the invention features a method for forming a structure, including forming a non-crystalline mask layer over a top surface of a substrate including a first crystalline material, the non-crystalline mask layer having a top surface. An opening is formed in the non-crystalline mask layer, the opening including at least one sidewall extending from the top surface of the non-crystalline mask layer to the top surface of the substrate. A second crystalline material is introduced into the opening, the second crystalline material having a lattice mismatch to the first crystalline material and a thickness sufficient to permit a majority of defects arising from the lattice mismatch to exit the second crystalline material at the at least one sidewall. A third crystalline material is introduced above the second crystalline material to define a junction between the second crystalline material and the third crystalline material. The second and third crystalline materials are substantially lattice matched.

BRIEF DESCRIPTION OF DRAWINGS

FIGS. 2A-2C are schematic cross-sectional views illustrating relaxation in lattice-mismatched materials systems;

DETAILED DESCRIPTION

Silicon (Si) is recognized as presently being the most ubiquitous semiconductor for the electronics industry. Most of silicon that is used to form silicon wafers is formed from single crystal silicon. Silicon wafers serve as the substrate on which CMOS devices are formed. The silicon wafers are also referred to as a semiconductor substrate or a semiconductor wafer. While described in connection with silicon substrates, however, the use of substrates that include, or consist essentially of, other semiconductor materials, is contemplated without departing from the spirit and scope of the present disclosure.

As mentioned above, in particular applications, the present technology features semiconductor structures of Ge or III-V devices integrated with a Si substrate, such as, for example, gallium arsenide formed on a silicon substrate. Other semiconductor materials, lattice-mismatched to the underlying substrate, can also be used, such as for example a group II, a group III, a group IV, a group V, and a group VI element, and combinations thereof, more particularly, germanium, silicon germanium, gallium arsenide, indium phosphide, indium gallium arsenide, indium gallium phosphide, gallium phosphide, gallium nitride, indium gallium nitride, aluminum gallium nitride, indium arsenide, indium antimonide, indium aluminum antimonide, gallium antimonide, and indium gallium antimonide. In some aspects and implementations of this technology, the lattice-mismatched semiconductor material is compositionally graded.

Figure 1A:
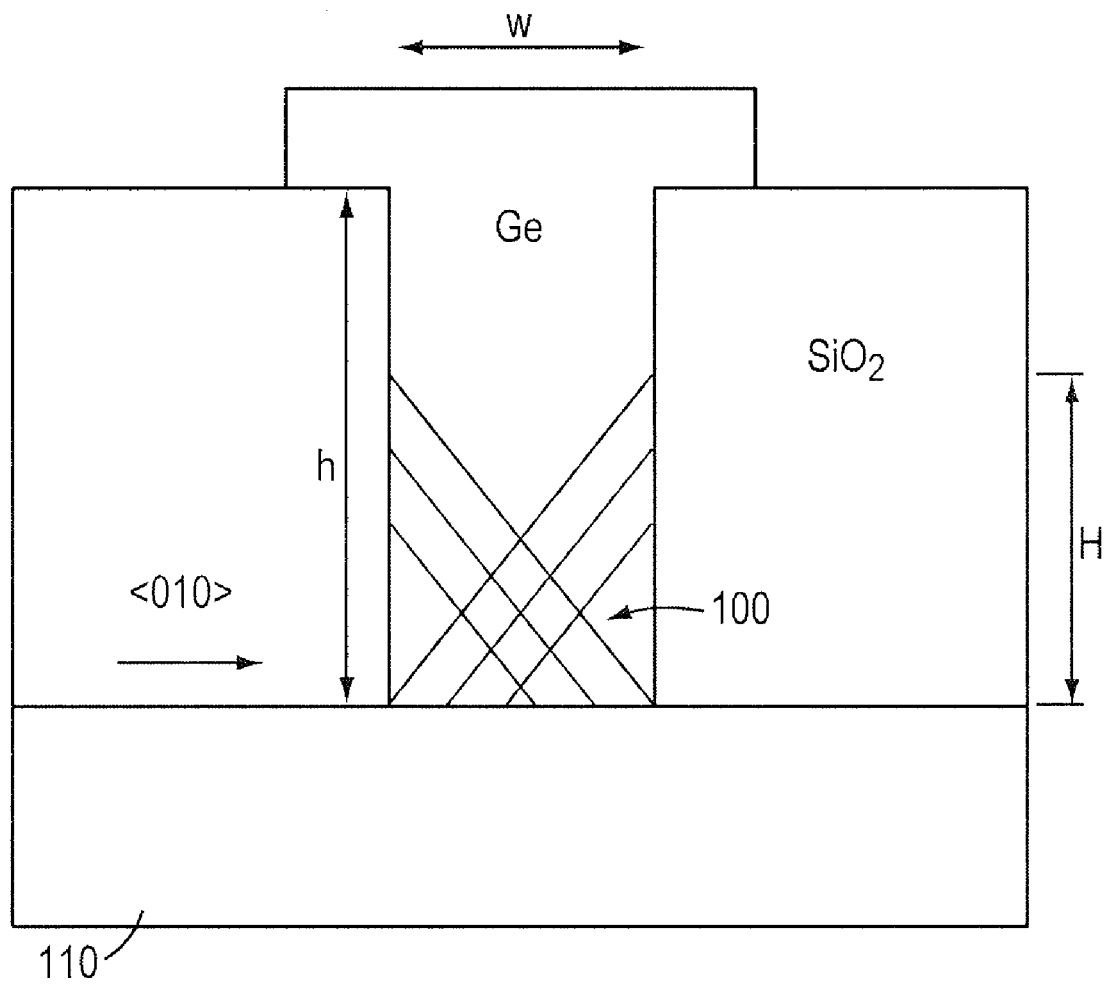
FIG. 1 is a schematic cross-sectional view illustrating a semiconductor heterostructure device composed of highly-mismatched deposited layers.
Figure 1B:
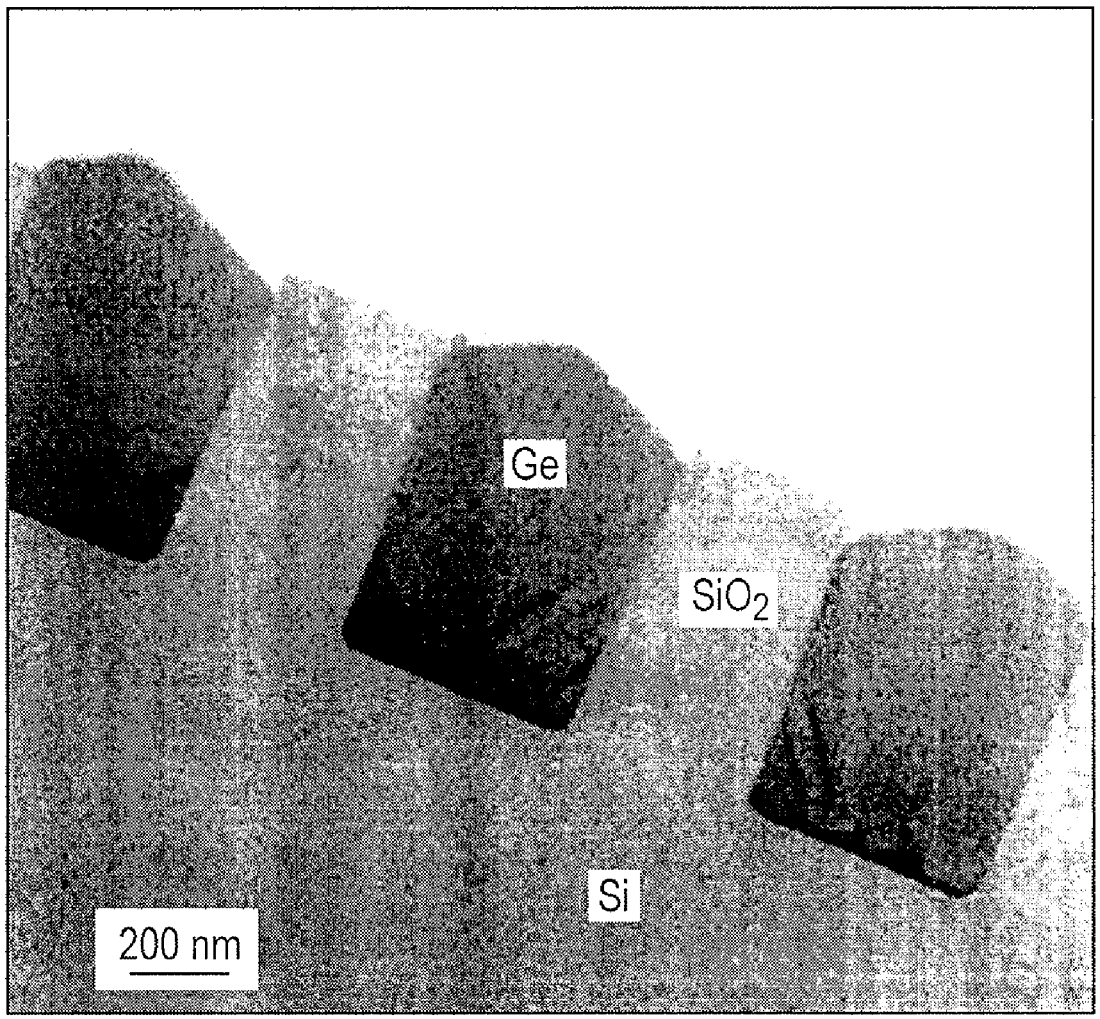

A. Utilizing Elastic Relaxation to Create Relaxed, Low-Defect Heteroepitaxial Regions As discussed above, there is a need in the art for versatile and efficient methods for fabricating semiconductor heterostructures that reduce dislocation defect densities in a variety of lattice-mismatched materials systems. As mentioned above and shown in FIG. 2A, many semiconductor heterostructure devices known in the art have been limited to semiconductor layers that have very closely—e.g. within 0.1%—lattice-matched crystal structures. In such devices a thin layer 200 is epitaxially grown on a mildly lattice-mismatched substrate 210. As long as the thickness of the epitaxial layer is kept below a critical thickness for defect formation, the substrate acts as a template for growth of the strained epitaxial layer. Thus, the hetero-epitaxial layer is fully strained. Another technique mentioned above (shown in FIG. 1) that addresses control of threading dislocation densities in highly-mismatched deposited layers, termed "epitaxial necking," relies on plastic relaxation of the lattice-mismatched material proximate to its interface with the substrate; plastic relaxation is illustrated schematically in FIG. 2B. Misfit dislocations 220 relax strain in directions perpendicular to the dislocation line. Thus, an upper portion 230 of the hetero-epitaxial layer is fully relaxed, while a lower portion 240 is partially relaxed. As discussed above, conventional epitaxial necking is typically applicable only to devices with small lateral dimensions in order for the dislocations in the lattice-mismatched semiconductor layer to terminate at a sidewall of the trench. Yet another approach relies on elastic relaxation of the heteroepitaxial material, as shown in FIG. 2C, whereby substantially no defects are created at the interface with the substrate, and the partially relaxed lower portion 240 is thicker than the fully relaxed upper portion 230. This approach is generally applicably only for extremely small lateral dimensions of the heteroepitaxial region and/or very low mismatch with the underlying substrate. For example, for 4% lattice mismatch, such as for pure Ge grown over Si, a lateral dimension of the heteroepitaxial region is preferably be $\leqq 20$ nm to fully avoid plastic relaxation and defect formation. For other semiconductor combinations with even higher mismatch, the lateral dimension may need to be even smaller. For the case of epitaxial growth of $Si_{1-x}Ge_x$ on Si, constraints on mismatch and lateral dimensions for full relaxation without defects can be estimated from an article by Luryi and Suhir, published in Applied Physics Letters, Vol. 49 (3), page 140 (1986), incorporated herein by reference.

Figure 3:
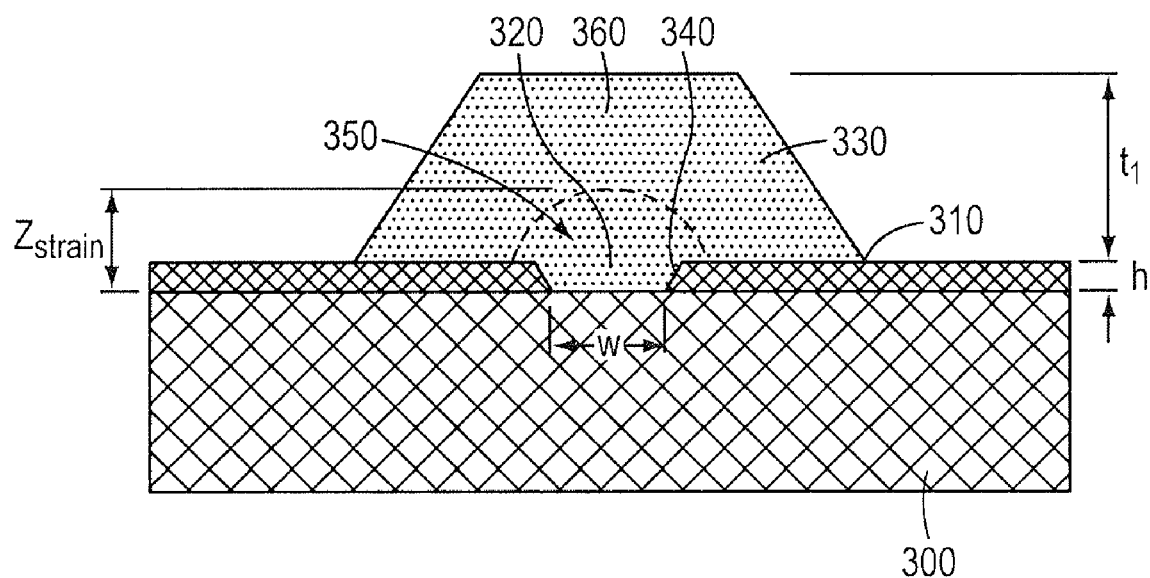
FIG. 3 is a schematic cross-sectional view illustrating a semiconductor heterostructure with a heteroepitaxial region having a substantially defect-free area, in accordance with an embodiment of the invention.

Referring now to FIG. 3, in some implementations of the inventive concepts described herein, an elastic relaxation technique is employed to create a substantially defect-free area of the heteroepitaxial region for fabrication of semiconductor devices. As shown in FIG. 3, a substrate 300 includes, or consists essentially of, a first crystalline material, e.g., a semiconductor such as silicon. A first non-crystalline mask layer 310 is disposed over the substrate. The first non-crystalline mask layer includes a first window 320, i.e., an opening or a trench, also referred to herein as a "seed window," extending to the surface of the substrate and exposing at least a portion of the substrate. The mask may include a dielectric material, such as, for example, silicon dioxide or silicon nitride.

A second crystalline material 330, e.g., a semiconductor, lattice-mismatched to the underlying substrate, is first deposited in the opening over the substrate, and then the epitaxial deposition continues such that a heteroepitaxial region is grown over the material disposed in the opening, laterally expanding over the mask. The lattice mismatch induces strain in the second crystalline material.

In various embodiments, the first crystalline material may include, or consist essentially of, silicon or a silicon germanium alloy. The second crystalline material may include, or consist essentially of, a group II, a group III, a group IV, a group V, and/or a group VI element, and/or combinations thereof, for example, germanium, silicon germanium, gallium arsenide, or gallium nitride.

If an area of the window exposing at least a portion of the substrate is sufficiently small, i.e., if the lateral dimension w of the opening is small enough, mismatch can be accommodated by elastic relaxation of the second crystalline material without introduction of strain-related defects, e.g., dislocations. This means that the aspect ratio (h/w) and sidewall angle of the opening generally do not need to be designed to trap dislocations, as in epitaxial necking approach described above. A sidewall 340 of the opening may be substantially perpendicular 340a to a top surface of the substrate. In another embodiment, the sidewall may be substantially non-perpendicular 340b to the substrate top surface (see FIG. 6A for a depiction of both embodiments). A thickness $t_1$ of the second crystalline material is sufficiently high such that an inner region 350 of the second crystalline material is partially relaxed and relieves strain from the lattice mismatch, and an outer region 360 of the second crystalline material is substantially relaxed.

The window may have two portions, a wider upper portion and a narrower lower portion (see discussion below with respect to FIGS. 6A-6C).

As shown in FIG. 3, $Z_{strain}$, the vertical extent of the substantially strained/partially relaxed epitaxial area is generally on the order of w. The upper portion of the heteroepitaxial region formed over this area is substantially relaxed and void of dislocation defects, and can advantageously be used for semiconductor device fabrication, e.g. as shown in FIGS. 6A-6B. A semiconductor device may disposed over the second crystalline material; in an embodiment, an active area of the semiconductor device includes at least a portion of the second crystalline material.

Figure 4:
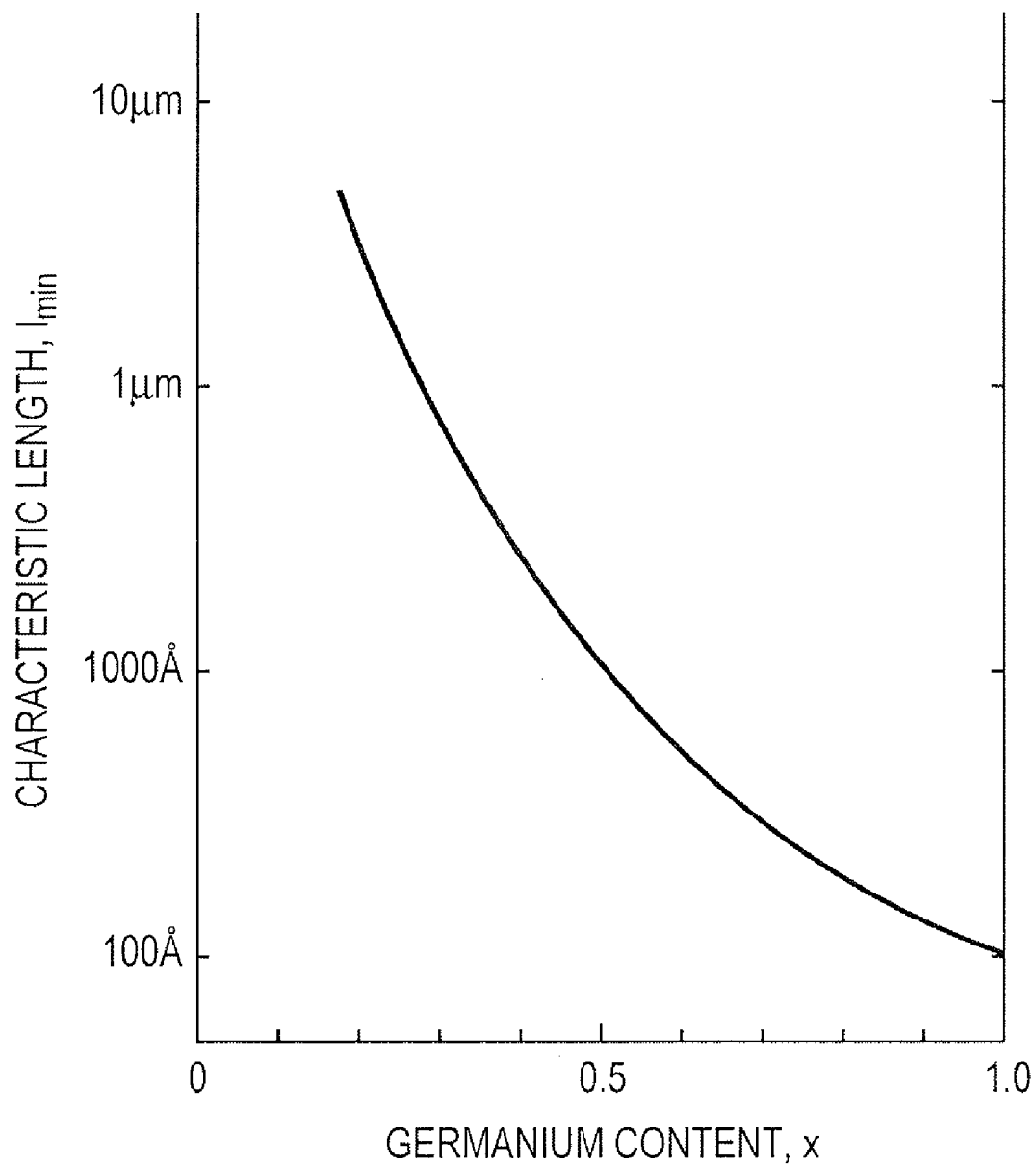
FIG. 4 is a graph enabling the calculation of the correlation between the thickness of a mask and the width of an opening for a particular application of $Si_{1-x}Ge_x$ deposited over Si.

Referring to FIG. 4, for a particular application of $Si_{1-x}Ge_x$ deposited over Si, the correlation between the width of the opening and germanium content x can be calculated using the graph from the article by Luryi and Suhir, mentioned above. Specifically, for all relaxation to occur elastically (so avoiding dislocation formation), the constraint on $w \leq 2 \times l_{min}$, where $l_{min}$ is the "characteristic length" which is a function of germanium content x as defined by Luryi and Suhir.

Figure 5:
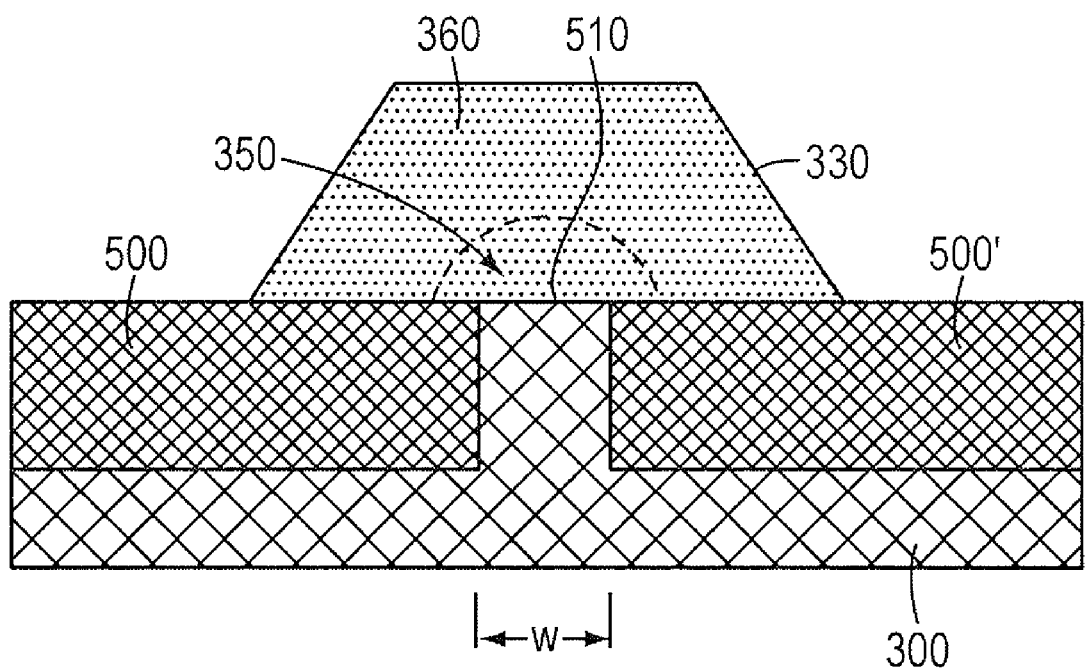
FIG. 5 is a schematic cross-sectional view illustrating a semiconductor heterostructure having insulator regions bounding a narrow portion of the top surface of a substrate surface, in accordance with an embodiment of the invention.

Referring to FIG. 5, in other implementations, insulator regions 500, 500' are formed in the top section of the substrate, leaving a narrow portion of the top surface 510 of the substrate exposed between and co-planar with the insulator regions. The lattice-mismatched semiconductor material is first epitaxially grown over the narrow portion of the substrate, and then the heteroepitaxy continues such that a heteroepitaxial region laterally expands over the insulator regions. As discussed above, the lateral dimension w of the narrow portion is small enough, such that the mismatch is accommodated by elastic relaxation. The upper portion of the heteroepitaxial region formed over this area is substantially relaxed and void of dislocation defects, and can advantageously be used for semiconductor device fabrication.

Figure 6A:
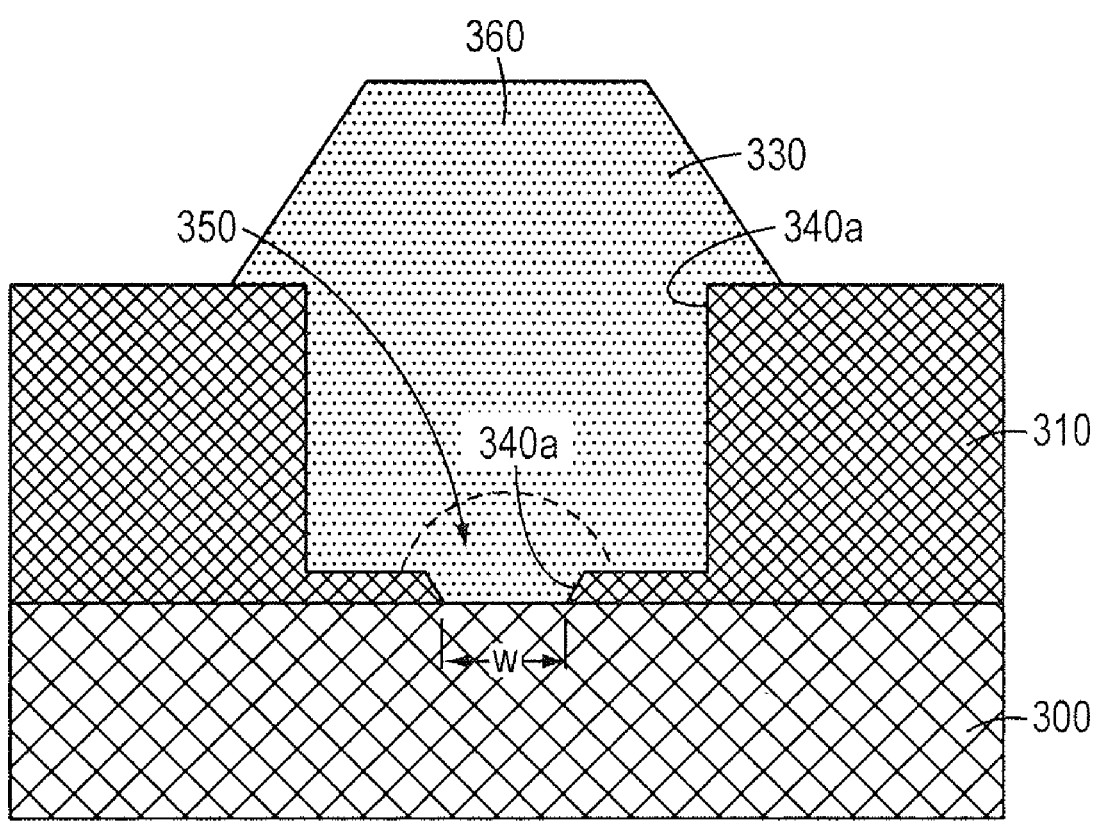
FIGS. 6A-6B are schematic cross-sectional views illustrating the fabrication of a planar MOSFET in an upper region of a heteroepitaxial region, in accordance with an embodiment of the invention.
Figure 6B:
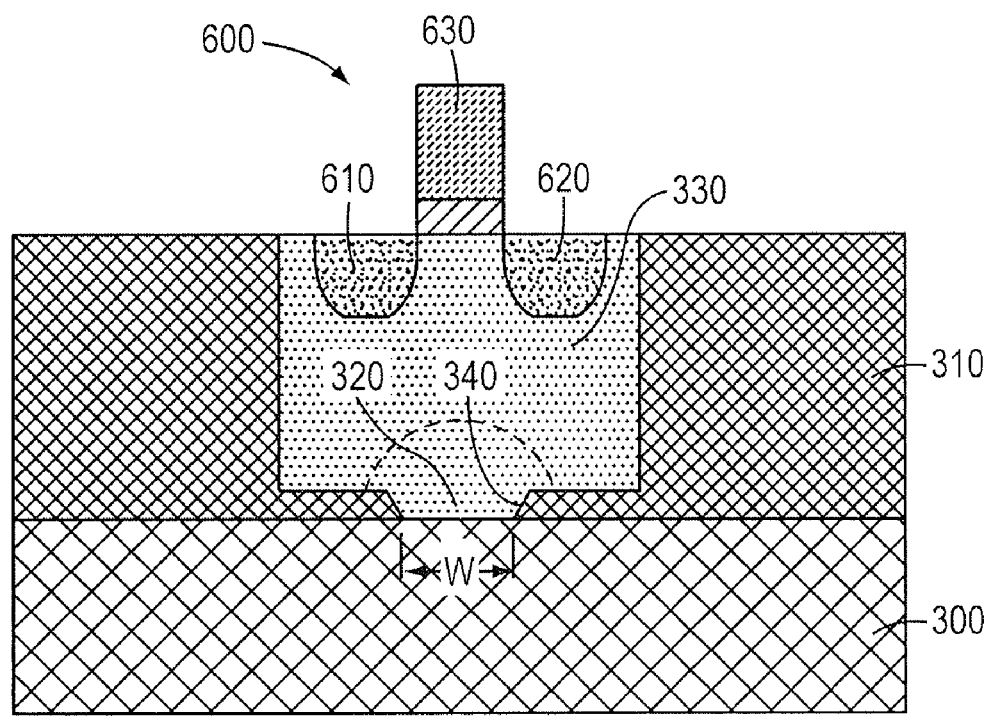
Figure 6C:
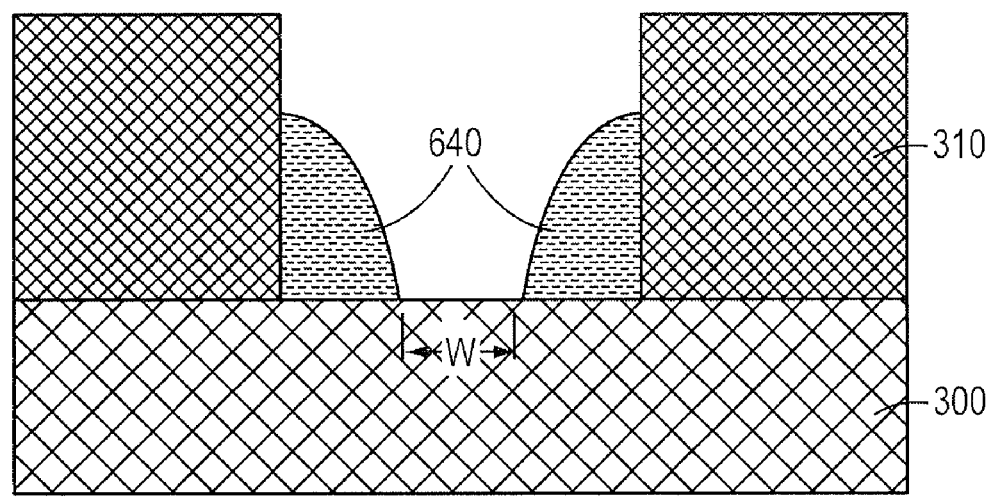
FIG. 6C is a schematic cross-sectional view illustrating a semiconductor heterostructure having a seed window with spacers, according to an embodiment of the invention.

Referring now to FIGS. 6A-6B, in some implementations, a planar MOSFET 600 including a source 610, a drain 620, and a gate 630, is fabricated in the upper portion of the heteroepitaxial region. Further to the discussion above in connection with FIG. 3, the fabrication entails:

Depositing or growing an insulator layer over a substrate;

Fabricating a seed window, e.g., a trench, with bottom width w narrow enough to allow substantial elastic relaxation w/o dislocations, for subsequent epitaxial deposition;

Epitaxially growing one or more lattice-mismatched semiconductor materials to be used for the active area of the MOSFET;

Planarizing an upper portion of the heteroepitaxial region, e.g. by chemical-mechanical polishing ("CMP"), creating a substantially planar active area; and then Fabricating MOSFET elements, including gate and source/drain regions.

The method described above in connection with FIGS. 3 and 6A-6B involves creating an opening or seed window with outward slanted sidewalls, i.e., a structure that is substantially narrower at the bottom than the top. In some implementations, such window is defined in the insulator layer by two lithography-and-etch cycles, e.g. making a wide opening/trench first, then making a narrower one inside. Alternatively, in other implementations, this can be achieved with only one lithography step, followed by spacer 640 deposition and etch, as shown in FIG. 6C. This technique is generally more economical and can alleviate lithographic alignment problems, or lithographic minimum feature limitations, inherent with the lithography-and-etch approach. The spacers can be formed from the same or different material than the insulator layer. For either case, selective epitaxial growth follows creation of the opening or trench.

Figure 7A:
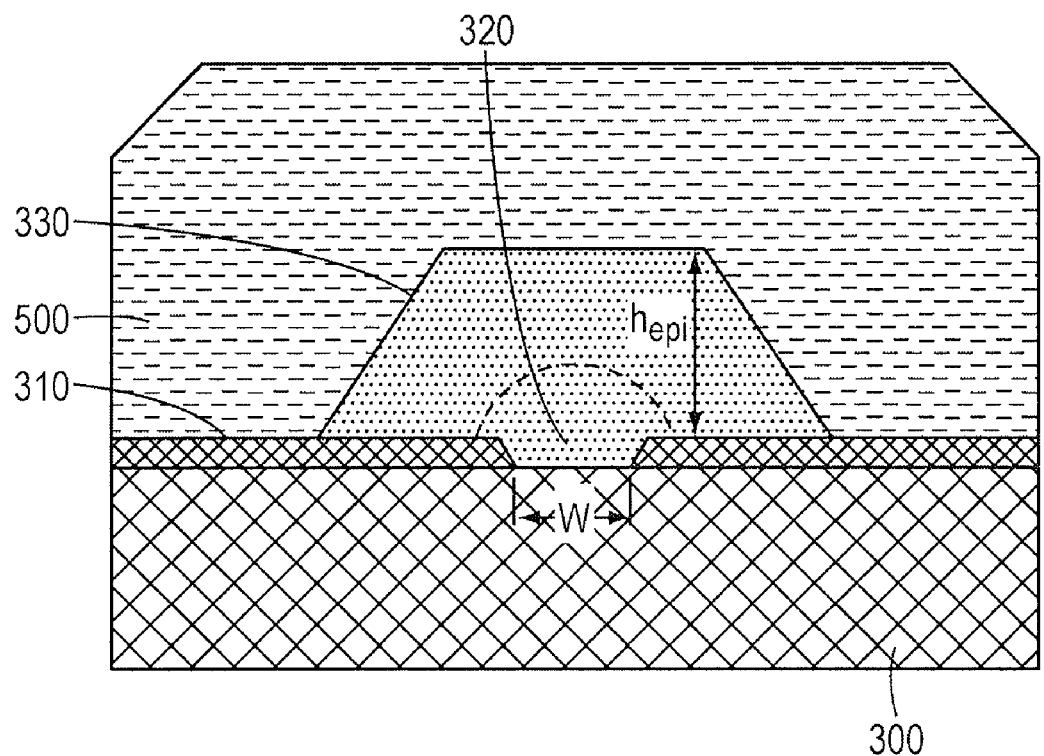
FIGS. 7A-7B are schematic cross-sectional views illustrating a method for forming a substantially defect-free area of an epitaxial region that is co-planar with an insulator region, according to an embodiment of the invention.
Figure 7B:
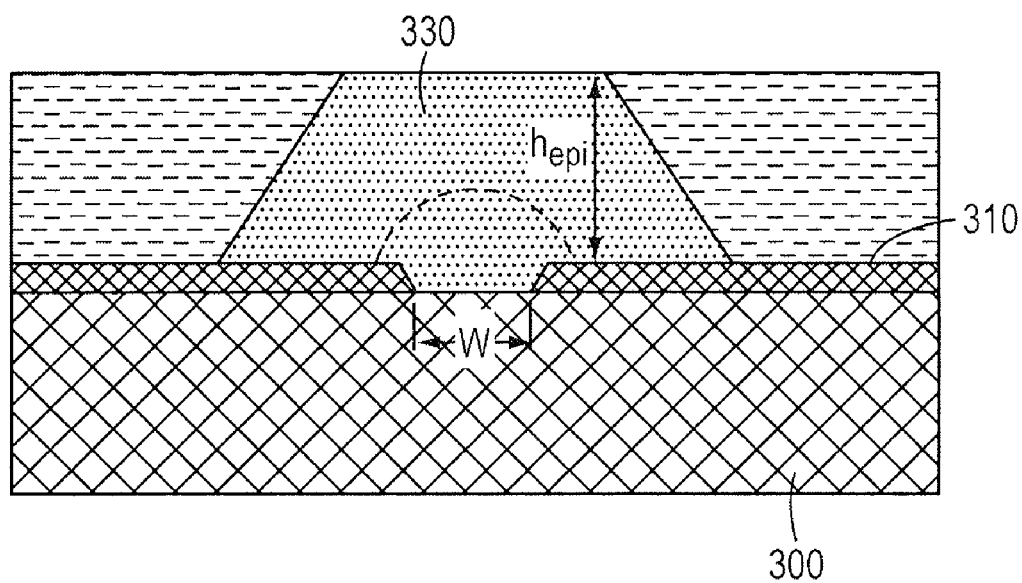

Referring now to FIGS. 7A-7B, in some implementations, a substantially defect-free area of the heteroepitaxial region for fabrication of semiconductor devices can be formed to be co-planar with an insulator region. Further to the discussion above in connection with FIG. 3, the fabrication entails:

Depositing or growing a first insulator layer on a substrate;

Fabricating a seed window, e.g. a trench, with bottom width w narrow enough to allow substantial elastic relaxation without dislocations, for subsequent epitaxial deposition;

Epitaxially growing one or more lattice-mismatched semiconductor materials to be used for the active area of the electronic device to a thickness of $h_{epi}$;

Depositing a second insulator layer to a thickness exceeding $h_{epi}$ (the second insulator layer can be formed from the same or different material than the first insulator layer);

Planarizing the heteroepitaxial region and the second insulator layer (e.g., via CMP) to form a planar active area, i.e. an active area co-planar with adjacent isolation regions; and then Fabricating the electronic device in the active area.

Figure 8A:
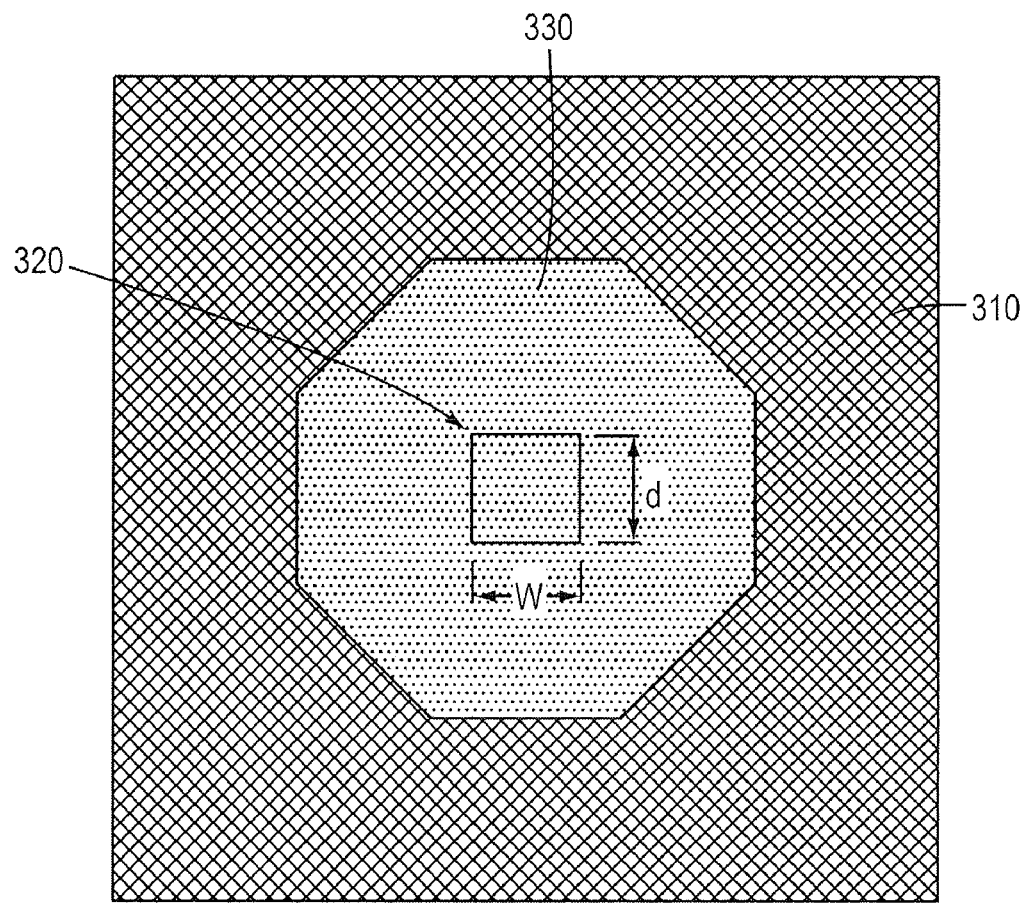
FIGS. 8, 9, and 10 are schematic top and cross-sectional views illustrating semiconductor heterostructures with seed windows of differing geometries, according to embodiments of the invention.
Figure 8B:
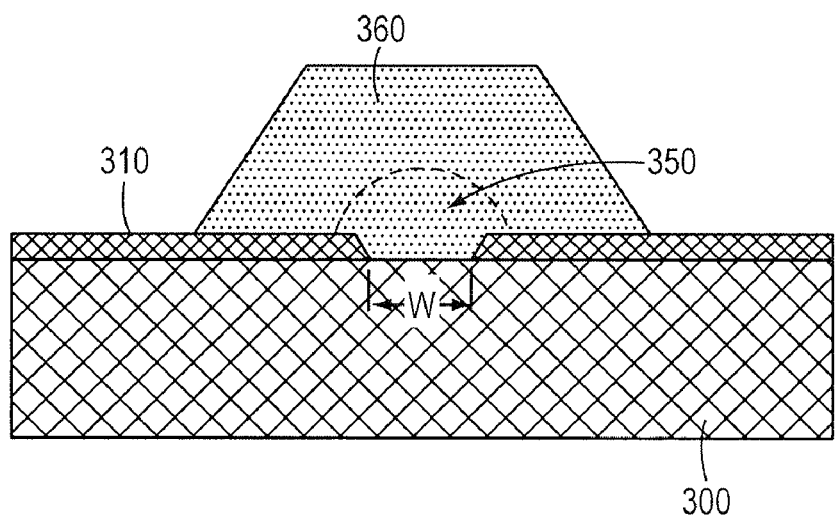
Figure 9A:
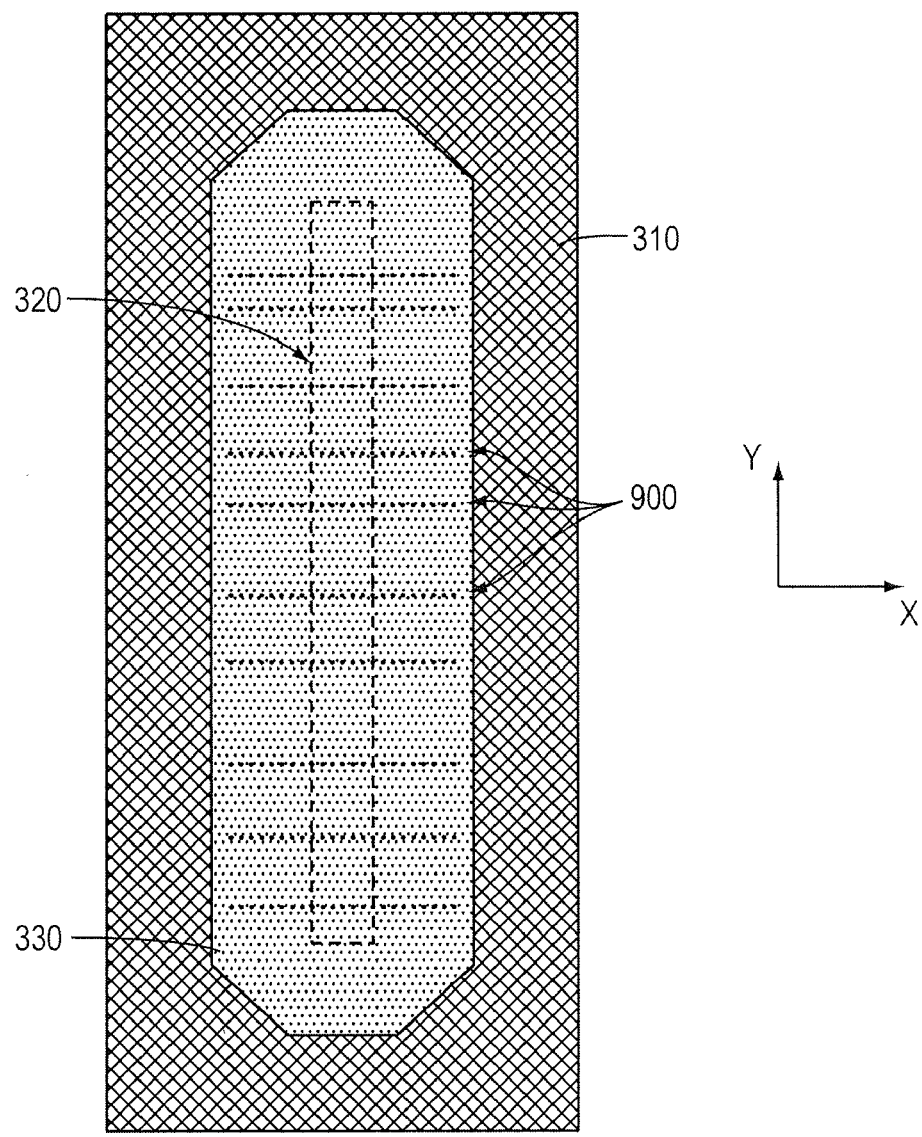
Figure 9B:
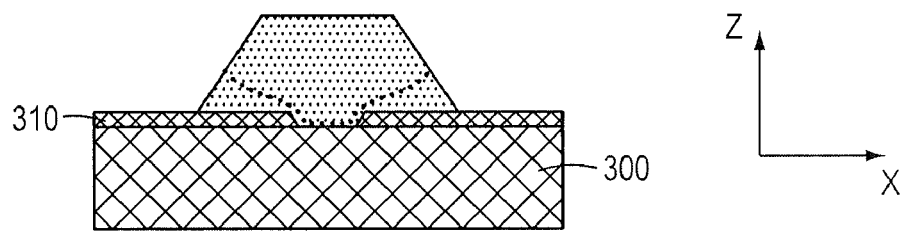
Figure 10A:
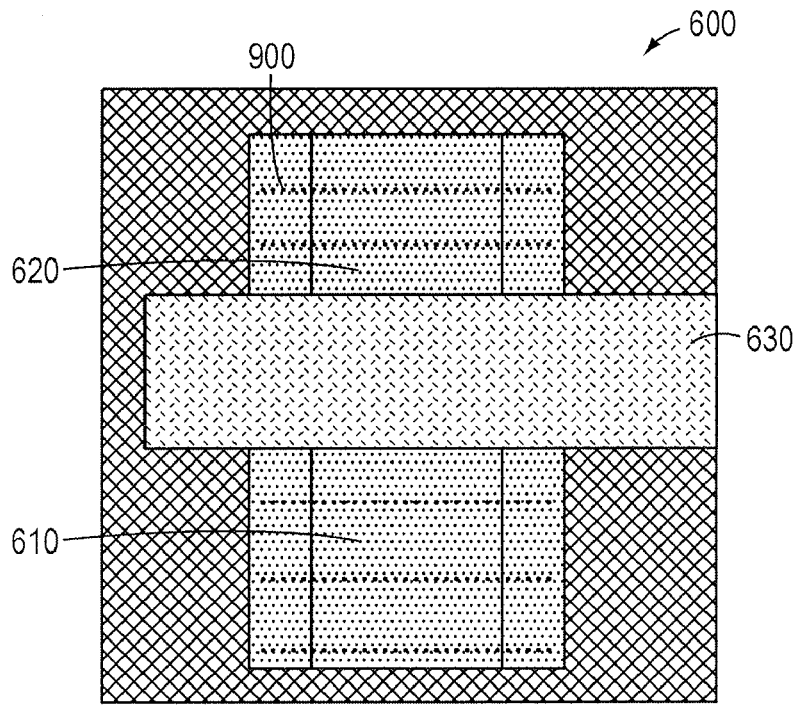
Figure 10B:
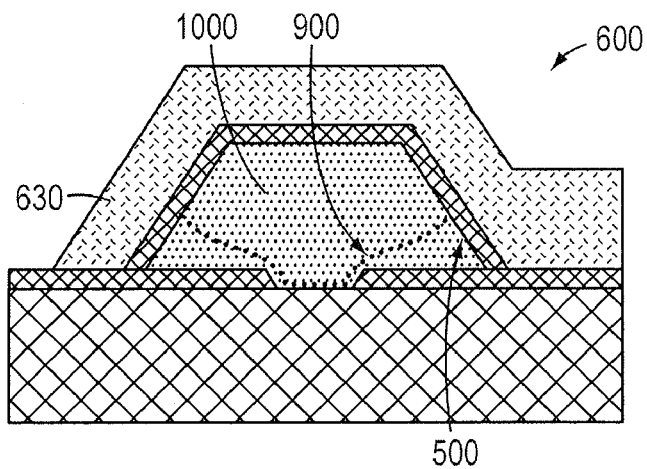
Figure 10C:
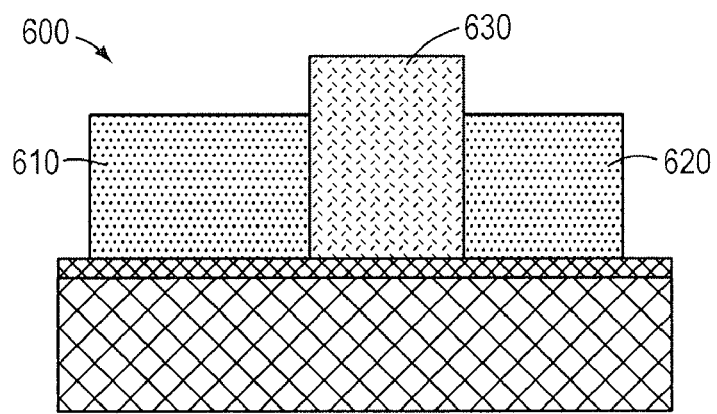

In many implementations of the technology discussed herein, both width and length of the seed window are constrained in order to achieve an omnidirectional elastic relaxation of the lattice-mismatched material, as shown in FIG. 8. In other implementations, however, long, narrow seed windows are employed to achieve elastic relaxation in one direction (x) and plastic relaxation in the other (y), as shown in FIG. 9. Plastic relaxation of the y-direction strain results in the formation of dislocations 900. This configuration is useful for semiconductor device applications, if misfits are oriented such that they cannot form shorts between junctions, e.g., perpendicular to current flow between source and drain regions of a MOSFET 600, such as a surround-gate MOSFET including a channel 1000 shown in FIG. 10.

Notably, if the thickness of the heteroepitaxial region is only a few times its critical thickness, or less, the Y-direction strain may be substantially maintained, due to kinetic barriers to dislocation nucleation, as discussed, for example, in E. A. Stach et al., Phil. Mag. A, Vol. 80, No. 9, p 2159 (2000), incorporated herein by reference. This phenomenon can be advantageous in certain situations: for example, if the substrate is Si and the lattice-mismatched semiconductor material grown thereover is SiGe or Ge, the resulting wrap-around gate FET will have uniaxial compression in the direction of current flow. Uniaxial compression can have a beneficial impact on hole mobility in SiGe or Ge MOSFETs.

B. Local Heterointegration Process Without Confining Sidewalls for MOSFET Active Area As described in co-pending application Ser. Nos. 11/436,198 and 11/436,062, both filed on May 17, 2006, and incorporated by reference herein, the "epitaxial necking" technique focuses on confining the undesirable dislocations to the lower portion of a hole or trench, away from the active-area surface. This approach offers process simplicity by utilizing a combination of selective epitaxial growth and defect crystallography to force defects to the sidewall of the opening in the patterning mask and produces limited-area regions having upper surfaces substantially exhausted of threading dislocations.

However, in certain applications, MOSFETs may be fairly tolerant of threading dislocations. For example, MOSFET devices have been produced commercially on SOI wafers with threading dislocation densities ("TDD") as high as $10^6$ cm$^{-2}$. An integration scheme described herein focuses on reducing TDD to levels that are sufficient for some MOSFET applications, particularly for the heterostructures where the amount of mismatch between the active-area material and the underlying substrate is not too significant. As discussed in J. G. Fiorenza, et al., *Film Thickness Constraints for Manufacturable Strained Silicon CMOS*, Semicond. Sci. Technol., Vol. 19, p. L4 (2004), incorporated herein by reference, however, it is important to keep misfit dislocations out of the channel area, as these are well known to be highly deleterious to MOSFET off-current even at low levels.

Figure 11A:
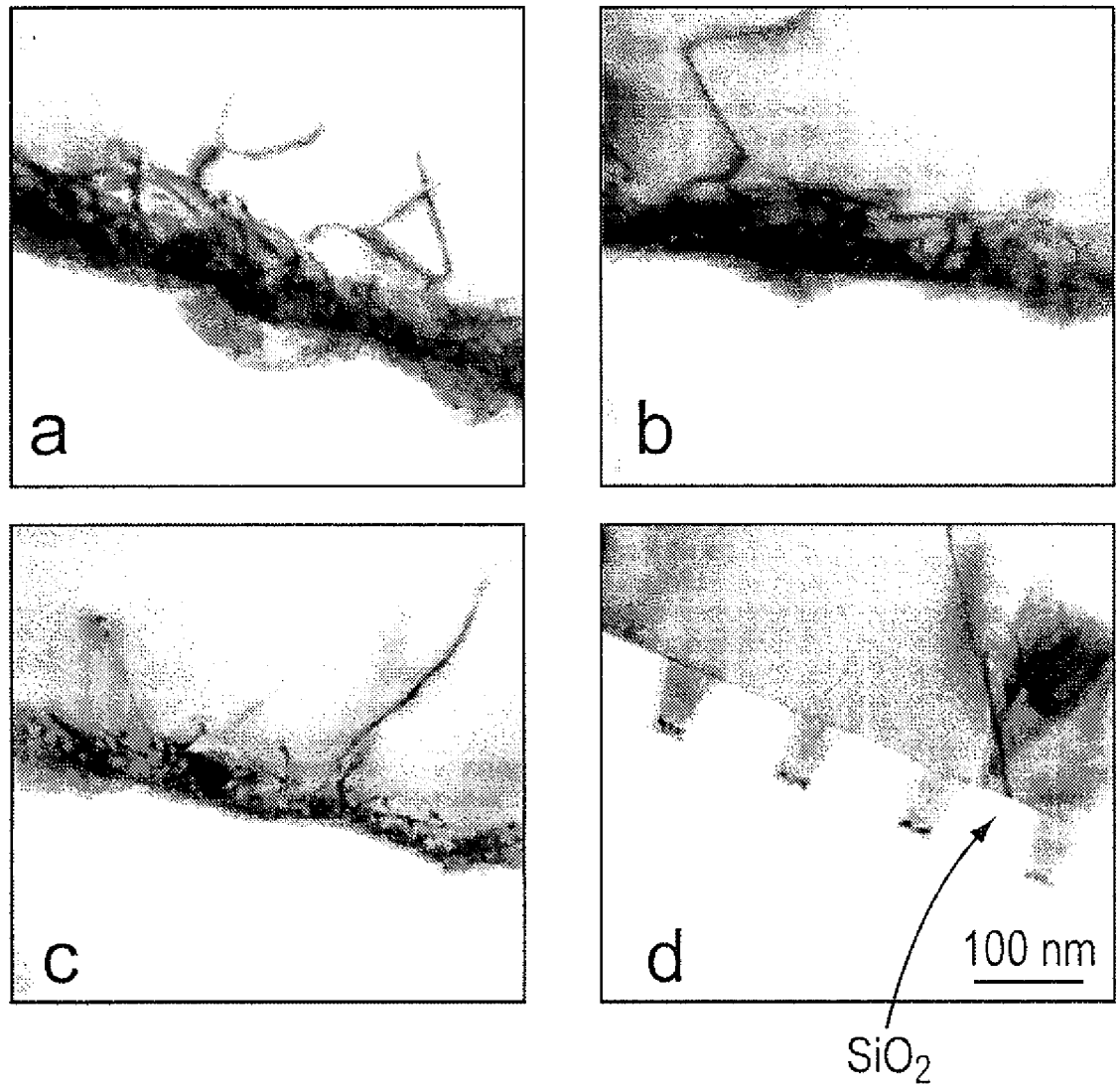
FIG. 11A(a)-11A(d) are micrograph images illustrating the effect of reducing lateral dimensions of a heteroepitaxial region on the thickness of a heavily dislocated region between mismatched regions.
Figure 11B:
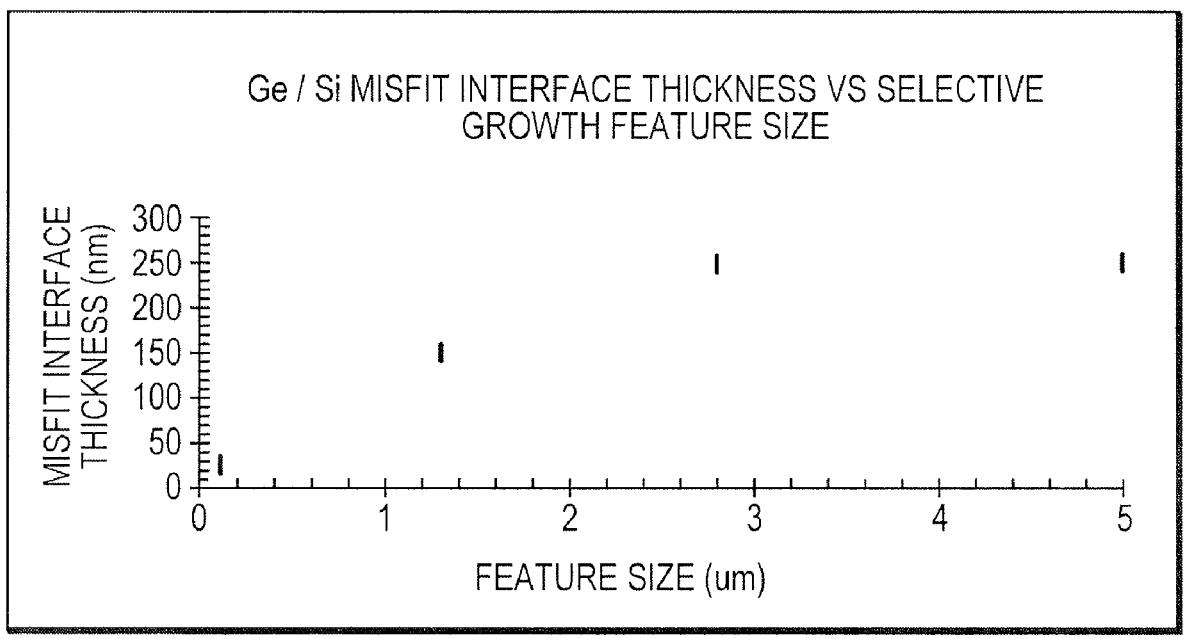
FIG. 11B is a graph depicting Ge/Si misfit dislocation interface thickness dependence on selective growth feature size.

Referring to FIG. 11A, reducing lateral dimensions of a heteroepitaxial region can dramatically reduce the vertical extent of the heavily-dislocated region that exists at the boundary between mismatched regions. This has been demonstrated with Ge epitaxy on Si substrates by Tom Langdo in a thesis entitled "Selective SiGe Nanostructures" (Ph.D. Thesis, MIT, 2001), incorporated herein by reference. Specifically, FIG. 11A depicts interface dislocation comparison showing (a) the control Ge/Si substrate interface on unpatterned Si, (b) in 2.8 µm features, (c) in 1.3 µm features, and (d) on interferometric lithography patterned substrates with 100 nm features. All images are shown at the same magnification. Note the reduction in thickness of the interfacial dislocation region as the feature dimension is reduced from (b) to (c) to (d). FIG. 11B depicts Ge/Si misfit dislocation interface thickness dependence on selective growth feature size.

Figure 12A:
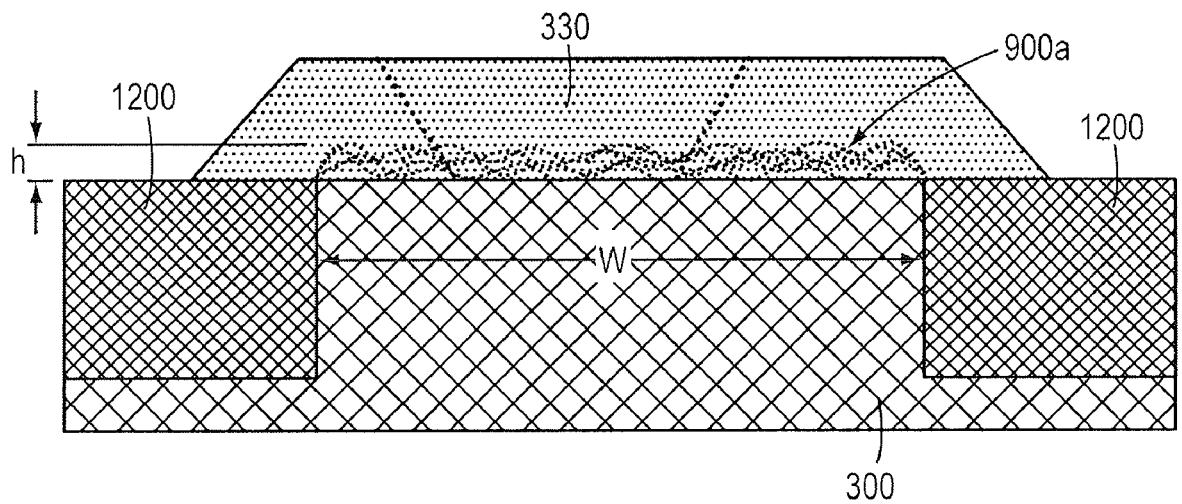
FIGS. 12A-12B are schematic cross-sectional views illustrating a method for using selective heteroepitaxy on small areas of silicon to create non-silicon active areas for MOSFETs, according to an embodiment of the invention.

Referring to FIG. 12A, selective heteroepitaxy is utilized on small areas of silicon to create non-silicon active areas for MOSFETs. In contrast to the epitaxial necking approach discussed above, insulator sidewalls bounding the epitaxial region are not necessary, simplifying process integration. In some implementations of this aspect of the technology disclosed herein, a CMOS wafer is processed through conventional STI formation steps, and then a heteroepitaxial region is selectively grown (e.g. via CVD), surrounded on all four sides by STI 1200. The thickness of the heavily dislocated region h next to the substrate generally corresponds to the data derived from the graph in FIG. 11B. In order to confine the heavily dislocated region 900a to a narrow area of height h next to the substrate, the distance between STI regions is preferably constrained either in the x dimension or y dimension (or both) to be less than about 1 µm. This is so that h is substantially less than it would be in the case for a blanket heteroepitaxial film. In a particular implementation, it may be desirable to constrain h to 50 nm (for example, to limit the total amount of epitaxy thickness required for the device active area). In this case, w should be approximately 400 nm, as estimated based on linear interpolation between experimental data points shown in FIG. 11B.

Figure 12B:
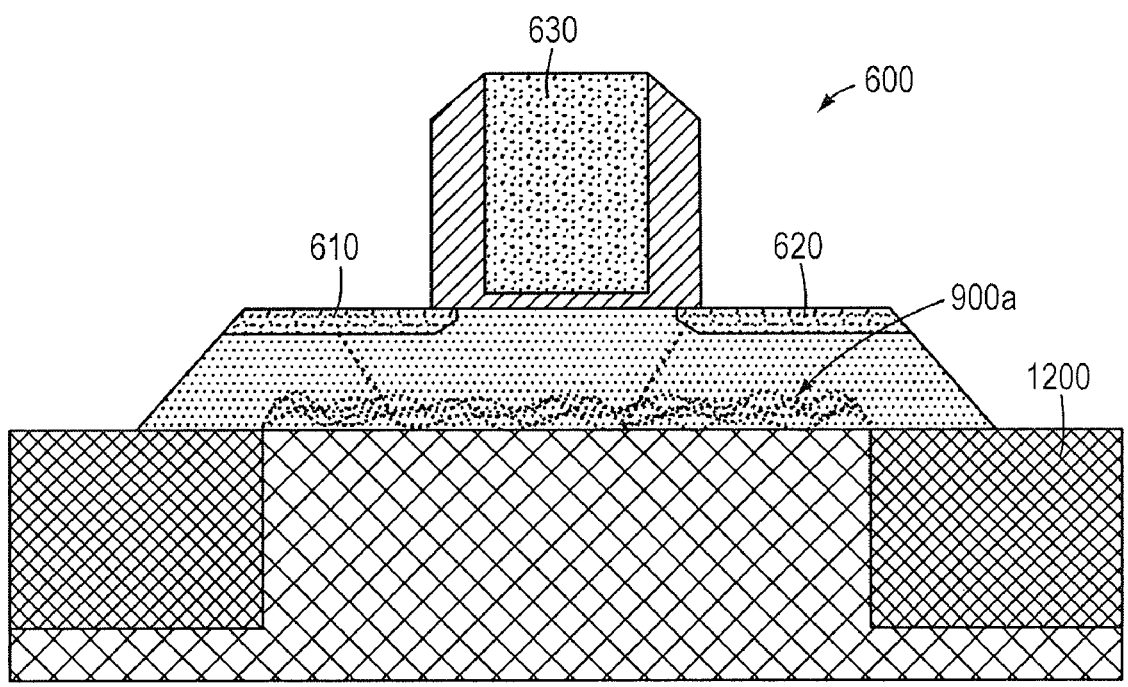

Transistor elements, including gate and source/drain regions, are then fabricated as shown in FIG. 12B, keeping any part of the source or drain regions from intersecting the heavily dislocated region. Otherwise, source and drain dopants can diffuse along the dislocations, causing serious leakage problems.

C. Large-Area Heterointegration

Figure 13A:
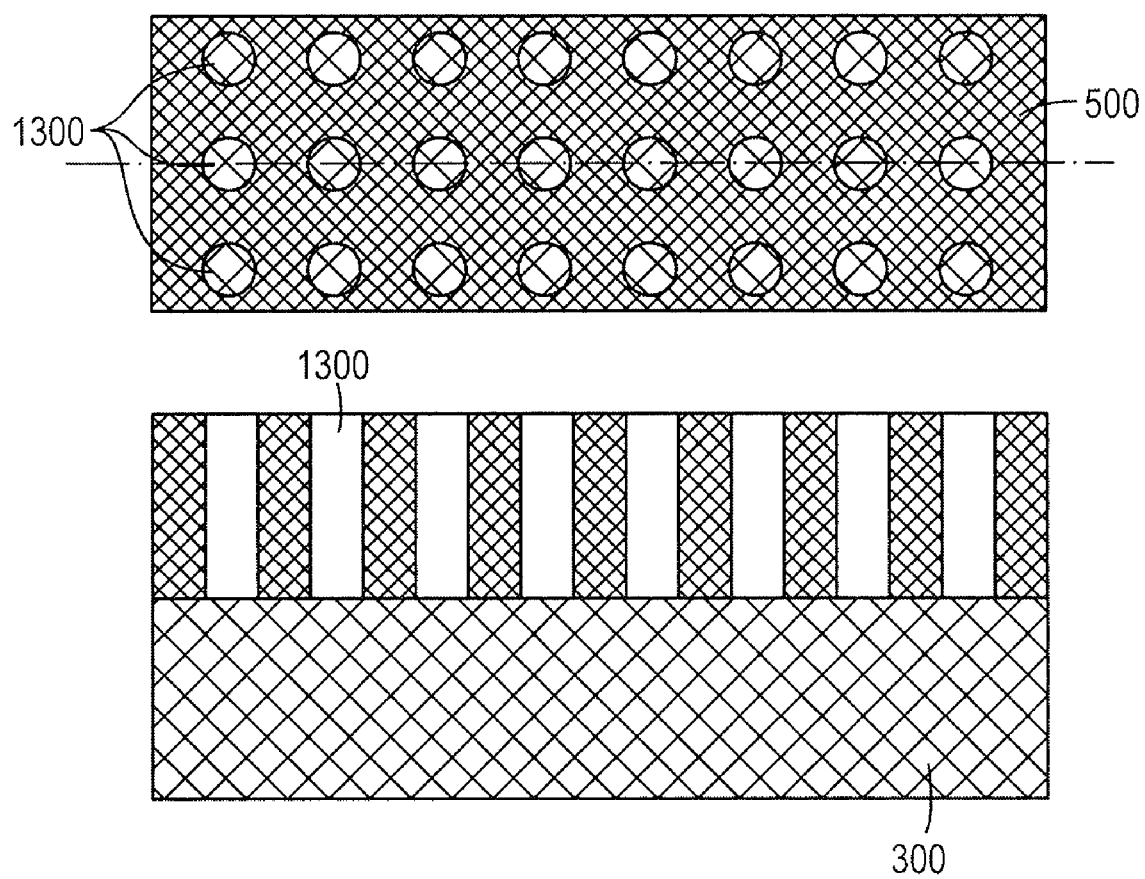
FIGS. 13A-13B, 14A-14C, and 15A-15B are schematic top and cross-sectional views illustrating semiconductor heterostructures utilizing various techniques for creating large active areas within heteroepitaxial regions, according to embodiments of the invention.
Figure 13B:
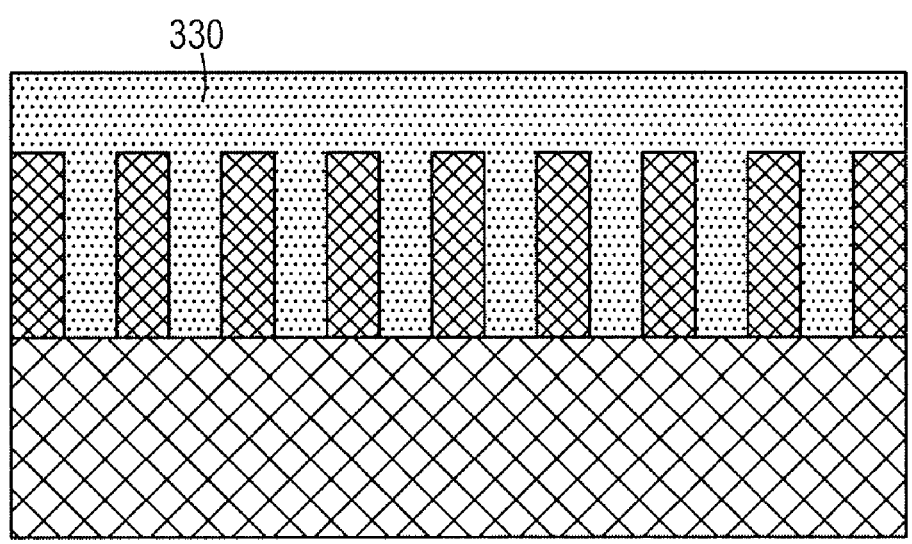

Referring to FIGS. 13A-13B, in one of its many aspects, the technology disclosed herein focuses on creating large active areas within the heteroepitaxial region by a combination of epitaxial necking and ELO techniques, employing a self-assembled mask. Specifically, an oxide layer defining an array of holes 1300 therethrough can be formed using self-assembly techniques, thereby avoiding traditional time-consuming lithography and etch approaches. For an example of how a self-assembled array of vertical holes in an insulator layer may be created on a Si substrate, see an article by Wenchong Hu et al entitled "Growth of well-aligned carbon nanotube arrays on silicon substrates using porous alumina film as a nanotemplate" and published in Applied Physics Letters, Vol. 79, No. 19 (2001), incorporated herein by reference. The article describing how anodic oxidation of the aluminum can be used to create a self-assembled array of vertical holes similar to that shown in FIG. 13A, where the insulator is alumina ($Al_2O_3$). The process described by Hu et al., however, leaves a small residual layer of alumina at the bottom of each hole. To remove this residual layer, an anisotropic dry etch (much higher etch rate normal to the wafer surface than parallel to the wafer surface) may be performed, exposing the silicon which is the 'seed' for subsequent epitaxial necking. Then, heteroepitaxial regions are selectively grown within out of the holes, at least until resulting islands coalesce. Depending on lateral dimensions of the aperture, degree of mismatch, and rigidity of sidewall oxide, either plastic or elastic relaxation of the heteroepitaxial "pillars" may dominate. The resulting heteroepitaxial layer is then planarized (FIG. 13B), e.g. via CMP, and the active-area, substantially exhausted of threading dislocations is used for device fabrication.

Figure 14A:
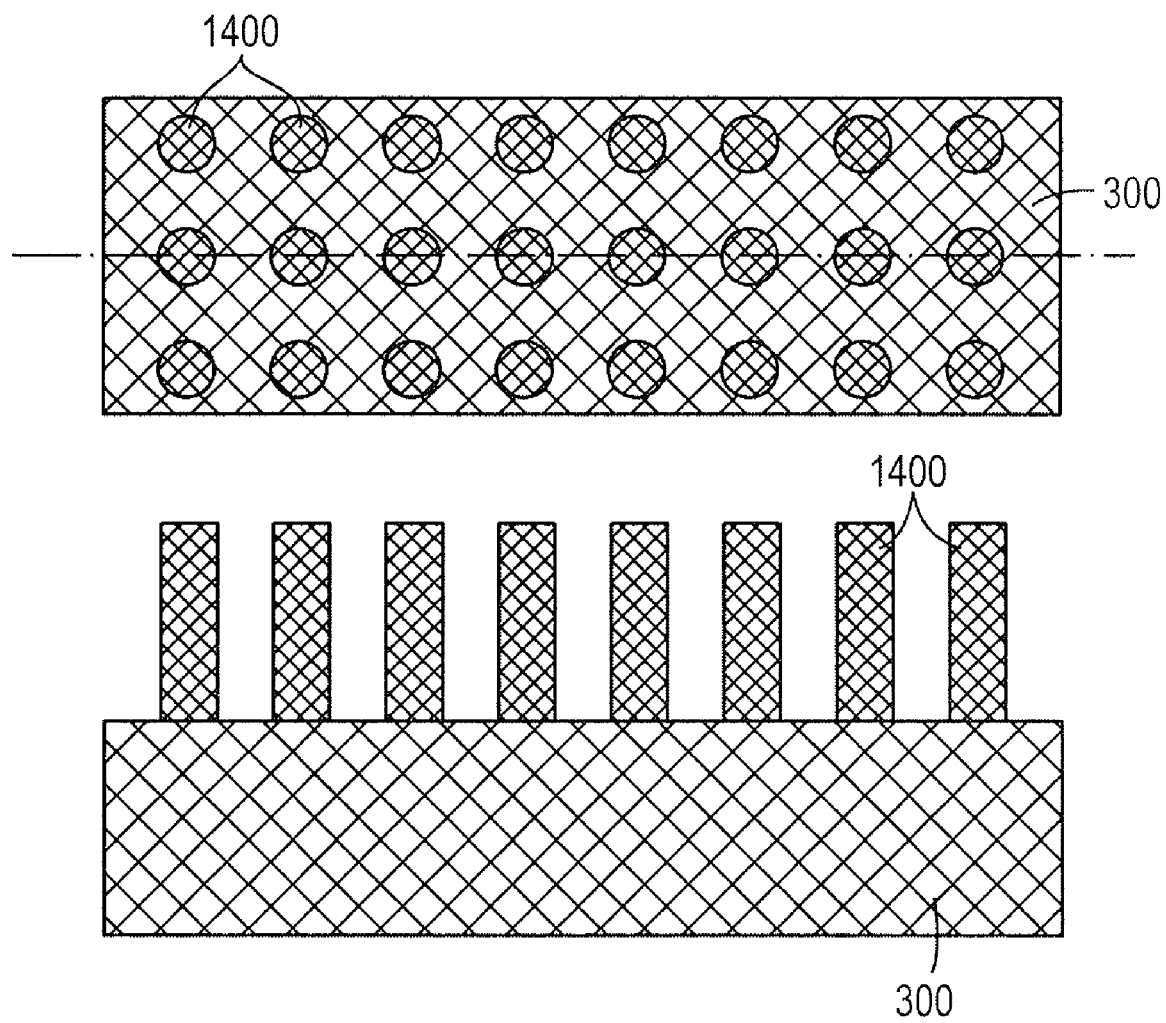
Figure 14B:
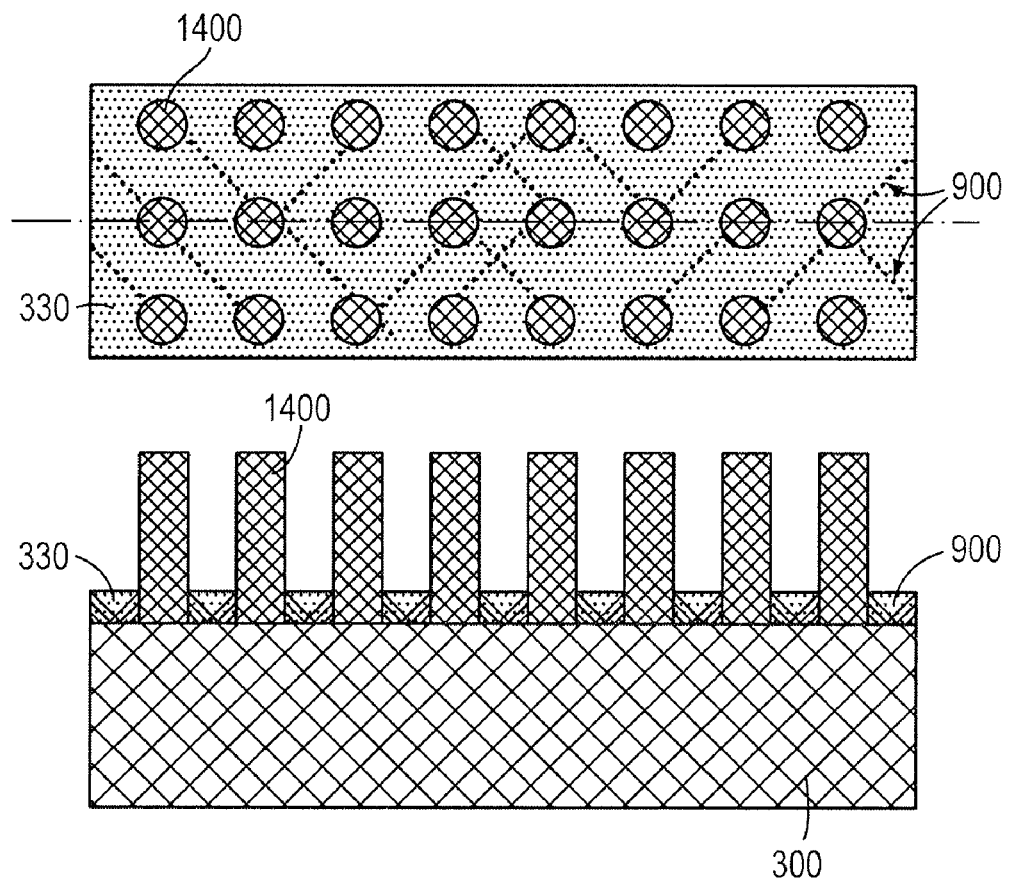
Figure 14C:
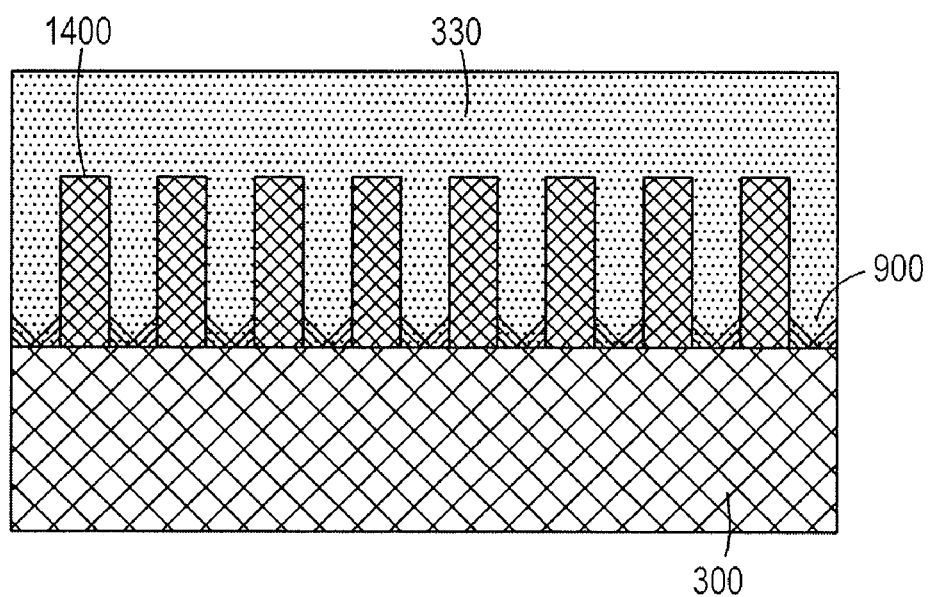

Referring to FIGS. 14A-14C, in another aspect, the technology disclosed herein focuses on creating large active areas within the heteroepitaxial region by a technique similar to epitaxial necking, employing selective epitaxial growth between disconnected mask elements. Specifically, an oxide layer defining an array of disconnected pillars 1400 formed of insulating material can be provided over the substrate using either self-assembly techniques, or conventional lithography and etch approaches (FIG. 14A). Preferably, the distance between the pillars is equal to or less than the pillar radius. Then, during selective epitaxial growth of the lattice-mismatched semiconductor material over the substrate, with onset of plastic relaxation, dislocations form and are blocked or confined at insulator pillars (FIG. 14B). Specifically, dislocations reach and terminate at the surfaces of the pillars at or below a predetermined distance from the surface of the substrate, such that threading dislocations in the heteroepitaxial region decrease in density with increasing distance from the surface of the substrate. Accordingly, the upper surface of the heteroepitaxial region is substantially exhausted of threading dislocations, enabling formation of semiconductor devices having increased channel width.

Blocking of the dislocation is promoted by geometry of the pillar array and because of the forces that cause dislocations to exit at the sidewalls of the pillars. Specifically, even when dislocations have an orientation that does not favor trapping at sidewalls, epitaxial necking approach is still effective at certain dimensions because of the forces that draw dislocations to free surfaces in order to reduce the elastic energy of the crystal. Mathematically, they arise because the boundary conditions of the expressions for strain require strain components to be zero at surfaces. As discussed by Tom Langdo in the 2001 thesis referenced above, for the case of Ge grown selectively in holes in a $SiO_2$ mask on Si substrates, it was observed that "all defects within ~300 nm of the window edge are bent and forced out to the $SiO_2$ sidewall." The epitaxial growth continues between the pillars until continuous layer is achieved, followed by planarization of the resulting structure (see FIG. 14C).

Notably, in contrast to epitaxial necking approaches using seed windows, the entire volume of the lattice-mismatched material is epitaxially grown over the substrate between the pillars. As a result, one of the features of this approach is avoiding the situation wherein regions of the lattice-mismatched material plastically relax in isolation from neighboring regions, resulting in formation of interface defects when the adjacent regions coalesce.

Figure 15A:
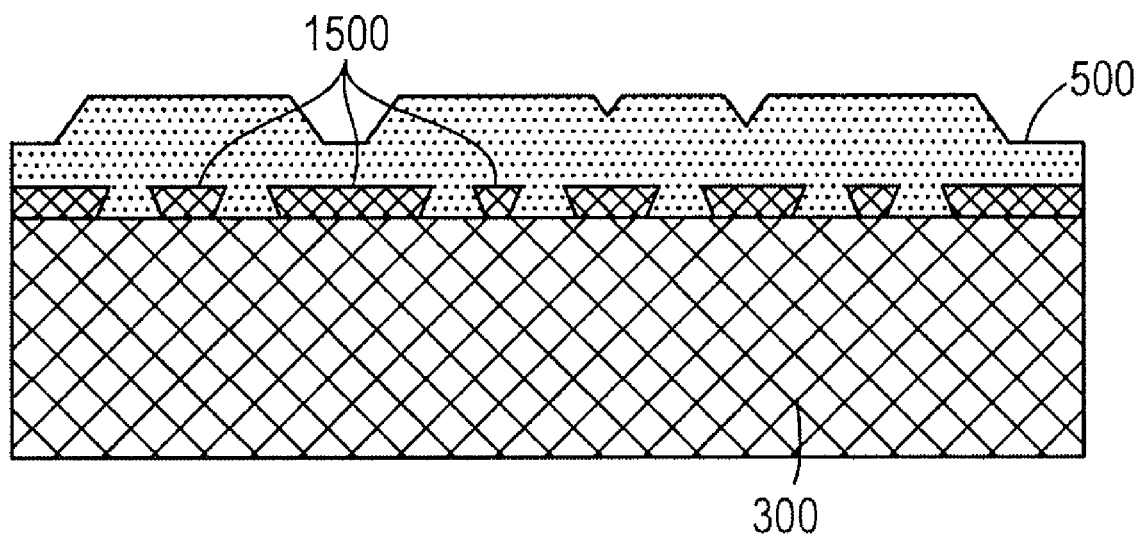
Figure 15B:
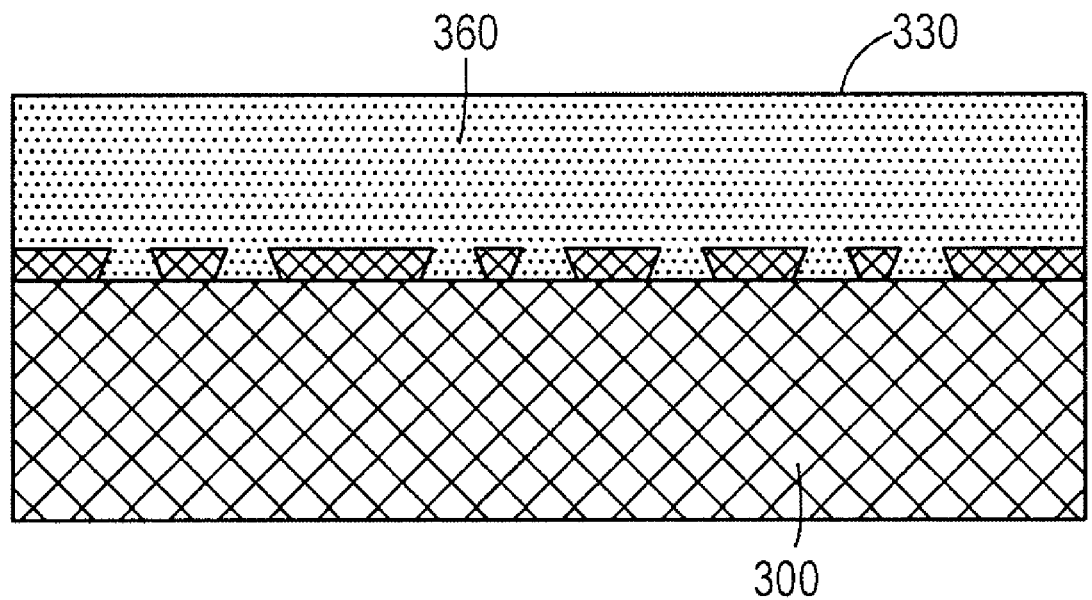

In still another aspect, the present technology relates to creating large active areas within the heteroepitaxial region by maskless ELO technique, based on elastic relaxation. Referring to FIGS. 15A-15B, a plurality of small islands 1500 of lattice-mismatched semiconductor material is nucleated over the substrate without photolithography or masking. Each of the islands is small enough to avoid plastic relaxation and corresponding misfit nucleation. These will serve as "seeds" for subsequent epitaxy. As skilled artisans will readily recognize, nucleation of disconnected islands is a typical result of highly-mismatched heteroepitaxy on blanket substrates. The growth conditions which result in such 'islanding' are commonly understood and widely published within the heteroepitaxy research community. Then, an insulator layer is deposited over the substrate and the seed islands disposed thereover, for example, via CVD, followed by planarization of the insulator layer to expose top surfaces of the seeds. The lattice-mismatched semiconductor material is then grown over the seeds and the insulator layer by selective epitaxy, again followed by planarization of the resulting heteroepitaxial region.

D. Electrical Isolation of Defective Area of Heteroepitaxial Region from Non-Defective Areas It is well known that dislocations forming due to the relaxation of mismatch strain in heteroepitaxial systems can be deleterious to device performance. In general, keeping the charge carriers, holes or electrons or both, away from the defects avoids such deleterious effects. While the epitaxial necking approach discussed above confines such defects to the bottom part of the heteroepitaxial region within a hole or trench, it is desirable to confine carriers of one or both types to the substantially defect-free region in the upper part of the heteroepitaxial region. For MOSFET applications, the electric field applied to the gate of a MOSFET may be sufficient to confine carriers away from the defective regions. However, for some other applications (e.g. LEDs or photodiodes) some other approaches are needed. In particular, such confinement in the context of epitaxial necking can be implemented by forming either homo- or heterojunctions in the heteroepitaxial region within the "necking" aperture.

Figure 16A:
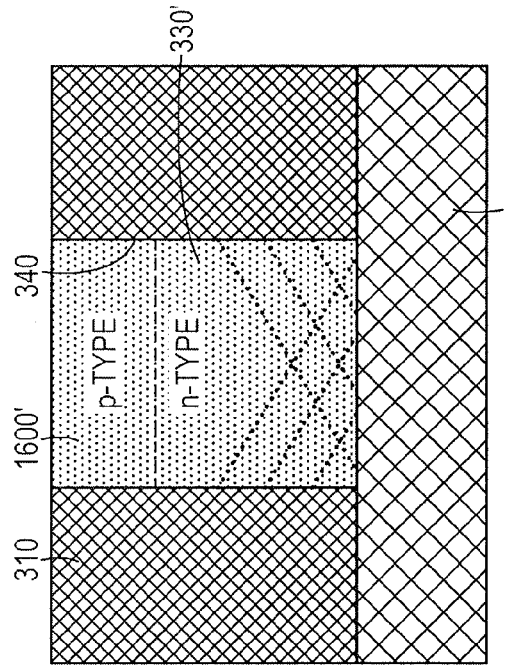
FIGS. 16A-16B, and 17A-17B are schematic cross-sectional views illustrating semiconductor heterostructures utilizing homojunctions or type I or II heterojunctions within a heteroepitaxial region to confine electrons and/or holes to a non-defective region thereof, according to embodiments of the invention.
Figure 16B:
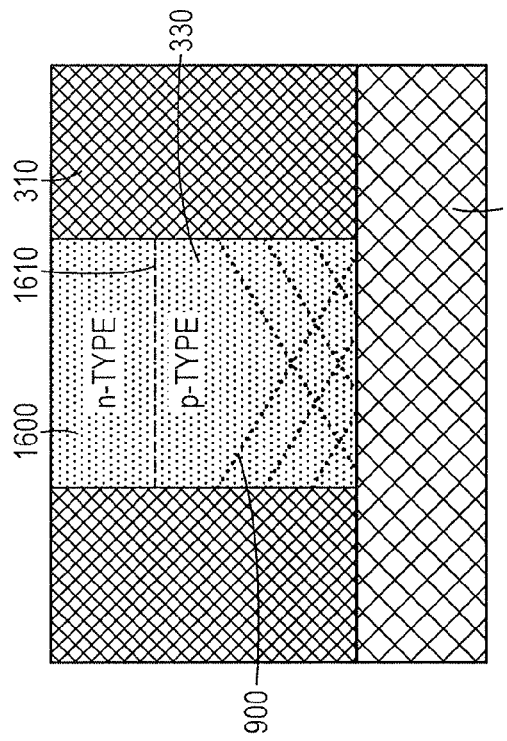

Referring to FIGS. 16A-16B, in some embodiments, n- or p-type dopants are implanted within the heteroepitaxial region and/or grown in-situ, such that a homojunction is formed within the lattice-mismatched material in the aperture, confining either electrons (FIG. 16A) or holes (FIG. 16B) to the non-defective region. In particular, a structure may include a substrate including a first crystalline material, e.g., Si, and having a top substrate surface. A non-crystalline mask layer 310 is disposed above the substrate 300. The non-crystalline mask layer may include a dielectric material, such as $SiO_2$. The non-crystalline mask layer has a top surface and an opening defined by sidewalls 340 extending from the top surface of the non-crystalline mask layer to the top surface of the substrate. A cross-section of the opening may be one of various shapes, including substantially circular, substantially square, or substantially rectangular. The opening may be configured as an elongated trench. The sidewalls of the opening may be substantially perpendicular to a top substrate surface.

A second crystalline material 330 is disposed in the opening, and is lattice mismatched to the first crystalline material. A thickness of the second crystalline material is sufficient to permit a majority of defects arising from the lattice mismatch to exit the second crystalline material at the sidewalls. A third crystalline material 1600 is disposed above the second crystalline material and defines a junction 1610 between the second crystalline material and the third crystalline material. The junction is configured to confine selected charge carriers, i.e., holes or electrons, to one side of the junction. The second crystalline material 330 may be p-type and the third crystalline material 1600 may be n-type (FIG. 16A) or the second crystalline material 330' may be n-type and the third crystalline material 1600' may be p-type (FIG. 16B). The second and third crystalline materials may be substantially lattice matched. The substrate may include a group IV element or compound, such as Si, and the second and third crystalline materials may each include at least one III-V semiconductor compound. A top surface of the third crystalline material may be substantially coplanar with the top surface of the mask layer. This may be achieved by, e.g., planarizing the top surface of the mask layer and the top surface of the third crystalline material by, for example, chemical-mechanical polishing.

In some embodiments, the second crystalline material includes a first semiconductor material having a first doping type and a first doping level, the third crystalline material includes a second semiconductor material having a second doping type and a second doping level. The first and second doping types are the same, e.g., both n-type or p-type, and the first and second doping levels are different, e.g. ~$5\times10^{16}$/cm$^3$ and ~$5\times10^{18}$/cm$^3$ respectively. Alternatively, the first doping type and second doping type may be different, e.g., the first doping type n-type (with a first doping level e.g. in the range $1\times10^{16}$/cm$^3$ to $1\times10^{20}$/cm$^3$) and the second doping type p-type (with a second doping level e.g. in the range $1\times10^{16}$/cm$^3$ to $1\times10^{20}$/cm$^3$), or vice versa.

Figure 17A:
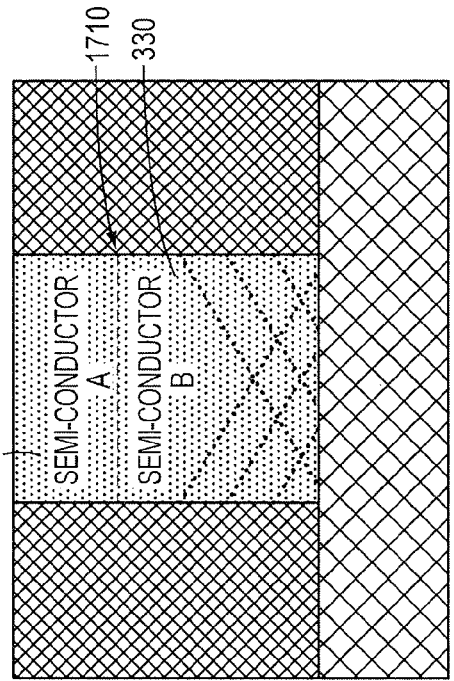
Figure 17B:
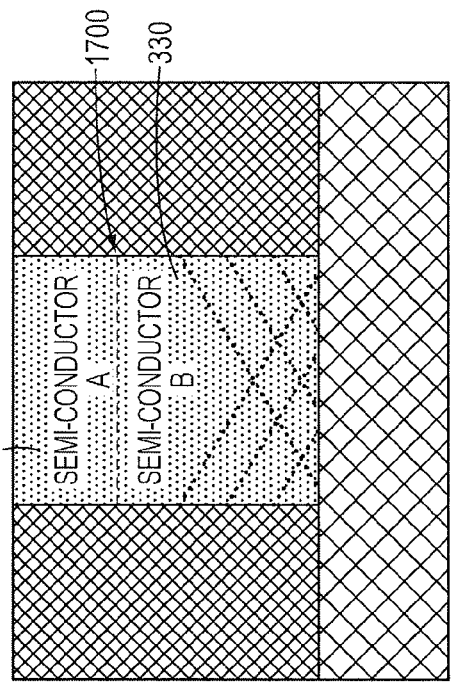

Alternatively, referring to FIGS. 17A-17B, in other embodiments, either a type II 1700 or type I 1710 heterojunction may be formed in or above the opening by depositing a different semiconductor material (third crystalline material 1600) over the lattice-mismatched material containing the defective area (second crystalline material 330), thereby confining either electrons or holes (FIG. 17A) or electrons and holes (FIG. 17B) to the non-defective region. For type I heterojunctions, for electron and hole confinement to non-defective regions, a key is for $Eg_A<Eg_B$, where Eg is energy band-gap, and the subscripts refer to the semiconductor region labels in FIG. 17B. An example of this is be growing $Al_{0.5}Ga_{0.5}As$ in semiconductor region B (second crystalline material 330) of FIG. 17B and GaAs in semiconductor region A (third crystalline material 1600) of FIG. 17B. For type II heterojunctions, for electron confinement to non-defective regions, a key is for $\lambda_A>\lambda_B$, where $\lambda$ is electron affinity and the subscripts refer to the semiconductor region labels in FIG. 17A. For hole confinement to non-defective regions, a key is for $(\lambda_A+Eg_A)<(\lambda_B+Eg_B)$, and again the subscripts refer to the semiconductor region labels in FIG. 17A. In these embodiments, the second crystalline material 330 includes a first semiconductor material, the third crystalline material 1600 includes a second semiconductor material, and the first and second semiconductor materials are different. To avoid propagation of new mismatch dislocations into the third crystalline material 1600 due to plastic relaxation of the third crystalline material, the second and third crystalline materials are substantially lattice-matched, i.e., the lattice constants between the first and second crystalline materials are preferably similar, e.g., within 1%. Each of the second and third crystalline materials 330 and 1600 may include, or consist essentially of, a group II, a group III, a group IV, a group V, and/or a group VI element, and/or combinations thereof, for example, germanium, silicon germanium, gallium arsenide, or gallium nitride.

In any of the embodiments illustrated in FIGS. 16A-16B and 17A-17B, a device may be at least partially disposed over the third crystalline material. An active area of the device may include at least a portion of the third crystalline material. The device may be, e.g., a MOSFET, a photo-sensitive device, a light emitting device, or a photovoltaic device.

E. Control of Surface Characteristics of Heteroepitaxial Regions

Various device applications require very high minority carrier lifetime, and/or dominance of one kind of recombination mechanism (referring to the mechanism by which holes and electrons recombine) over others (e.g. radiative recombination dominating over non-radiative recombination, for light emitting devices). In these applications, it is typically desirable to keep carriers away from semiconductor surfaces, where carrier recombination rates are typically high, and the recombination mechanism is typically non-radiative. In other situations, even though carrier lifetime is less important, it is still desirable to keep current flow away from a free surface, such as edges of mesa- or STI-isolated FETs, to suppress edge-leakage effects. The following technique can be employed to address this objective in the context of epitaxial necking.

Figure 18A:
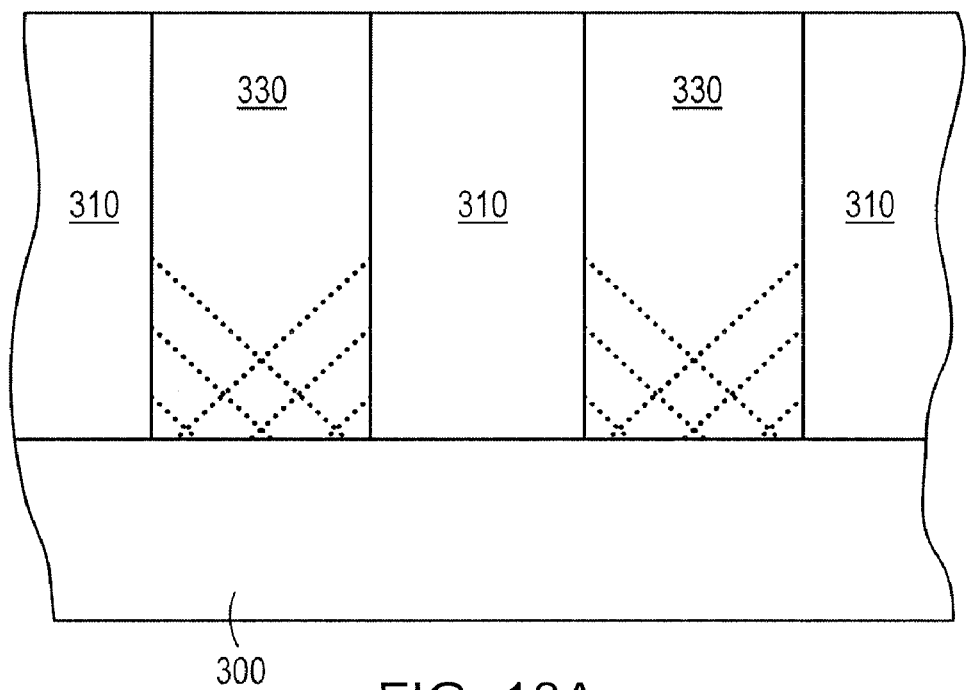
FIGS. 18A-18E are schematic cross-sectional views of semiconductor heterostructures illustrating techniques for keeping carriers or current flow away from semiconductor surfaces, according to embodiments of the invention.
Figure 18B:
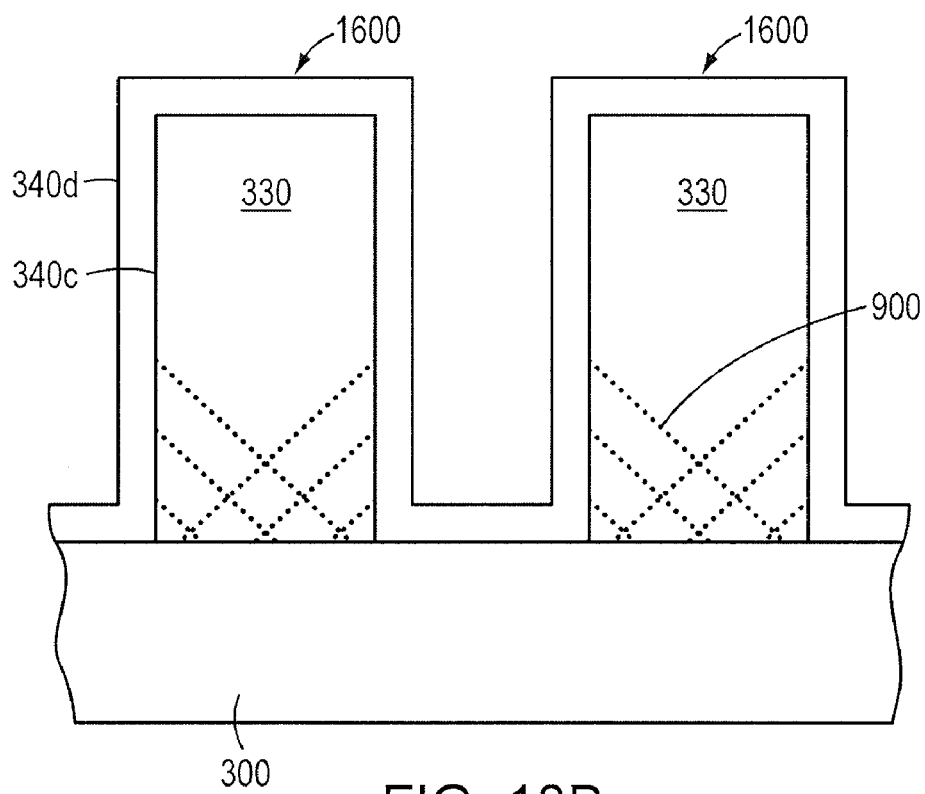

Referring to FIGS. 18A-18D, a substrate 300 is provided that includes, or consists essentially of, a first crystalline semiconductor material, such as, for example, silicon. A mask 310 is disposed over the substrate and has one or more openings or "seed windows," extending to the surface of the substrate. The mask may include a dielectric material, such as, for example, silicon dioxide or silicon nitride. A second crystalline semiconductor material 330, lattice-mismatched to the underlying substrate, is deposited in the opening over the substrate, forming a heteroepitaxial region. The heteroepitaxial region is planarized to remove a portion of the second crystalline semiconductor material extending above the surface of the mask (FIG. 18A). The mask is then removed and a third crystalline semiconductor material 1600 is grown over the second crystalline semiconductor 330. Thus, the second crystalline semiconductor material is disposed on the substrate in a predetermined configuration defining a top surface and a lateral sidewall surface 340c extending from a top surface of the substrate to the top surface defined by the predetermined configuration, the lateral sidewall surface having a height above the top surface of the substrate sufficient to permit a majority of defects arising from the lattice mismatch to exit the second material at the lateral sidewall surface. The lateral sidewall surface may define a column having a generally circular cross-section or a generally square cross-section. The lateral sidewall surface may define an elongated cross-section parallel to the top surface of the substrate, the elongated cross-section having a length and a width, the length being more than twice the width.

The third crystalline material 1600 is disposed on at least a portion of the sidewall surface of the second material to define an outer sidewall surface 340d. In some embodiments, the third crystalline semiconductor material is disposed over substantially the entire lateral sidewall surface. The third crystalline semiconductor material may be disposed over the top surface of the second material to define an outer top surface. The third crystalline semiconductor material may be disposed over the substrate adjacent to the second crystalline semiconductor material.

The third crystalline semiconductor material may be substantially lattice matched with the second crystalline material and/or may form a heterojunction with the second crystalline semiconductor material. The third crystalline semiconductor material may have a wider bandgap than a bandgap of the second crystalline semiconductor material. This will keep holes and electrons confined to the second crystalline semiconductor material, and thus away from any semiconductor surface (where 'surface' in this context means a boundary between a semiconductor and free space or between a semiconductor and a non-semiconductor material; a boundary between two semiconductor regions is not considered a 'surface' in this context). Thus, the addition of the third crystalline semiconductor material leads to lower carrier recombination rates and especially to lower non-radiative recombination rates. In an alternate embodiment, the third crystalline semiconductor material may have a different doping type than the second crystalline semiconductor material, e.g., p-type versus n-type, or vice versa. This will make it unlikely that both carrier types are present at the surface of the third crystalline semiconductor material even though one or the other carrier type may be commonplace at the surface. For example, if the second crystalline semiconductor material is n-type and the third crystalline semiconductor material is p-type, the carriers present at the third crystalline semiconductor material surface will be predominantly holes. Since a high carrier recombination rate may require significant presence of both holes and electrons, this configuration may prevent significant carrier recombination at a semiconductor surface.

The second crystalline semiconductor material may define a plurality of predetermined shapes, each shape having a top surface and a lateral sidewall surface extending from the substrate to the top surface, the sidewall surface having a height above the substrate sufficient to permit a majority of defects arising from the lattice mismatch to exit the second crystalline semiconductor material at the sidewall surface. The third crystalline semiconductor material may include a contiguous layer disposed on and in contact with the second crystalline semiconductor material.

Figure 18C:
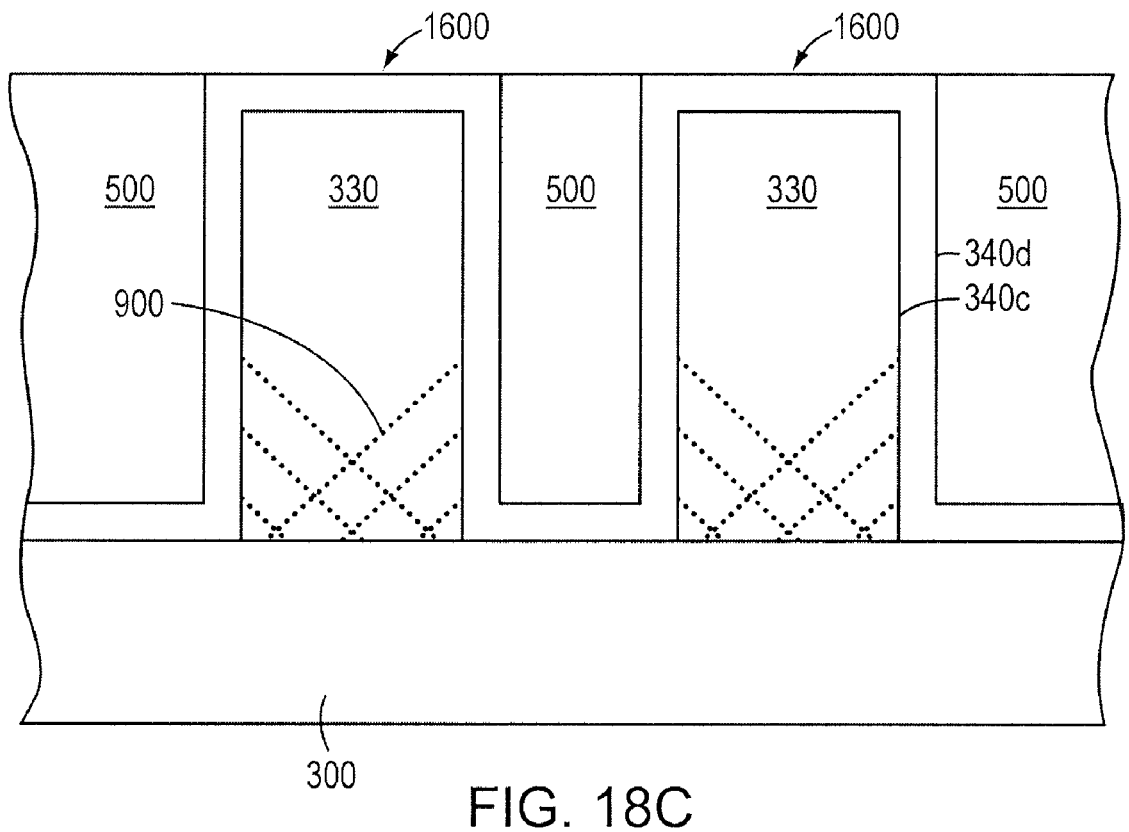
Figure 18D:
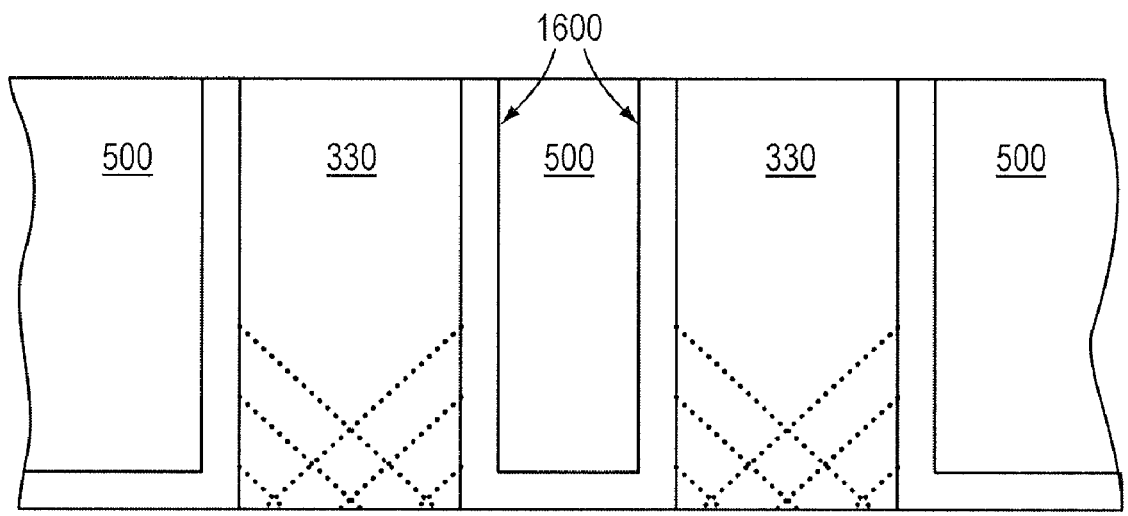

Depending on the desired application of this structure, the area between heteroepitaxial regions can then be filled with an insulator, and the resulting structure is then planarized, exposing the tops of either the second crystalline semiconductor material 330 (FIG. 18D) or the third crystalline semiconductor material (FIG. 18C). The insulating material may be disposed adjacent to and in contact with at least a portion of the lateral sidewall surface and/or adjacent to and in contact with the outer sidewall surface. The insulating material may have a height above the substrate greater than the height sufficient to permit a majority of defects arising from the lattice mismatch between the substrate and the second crystalline semiconductor material to exit the second crystalline semiconductor material at the lateral sidewall surface. The insulating material and the second and third crystalline semiconductor materials may each defines a respective planar top surface that are substantially coplanar.

Figure 18E:
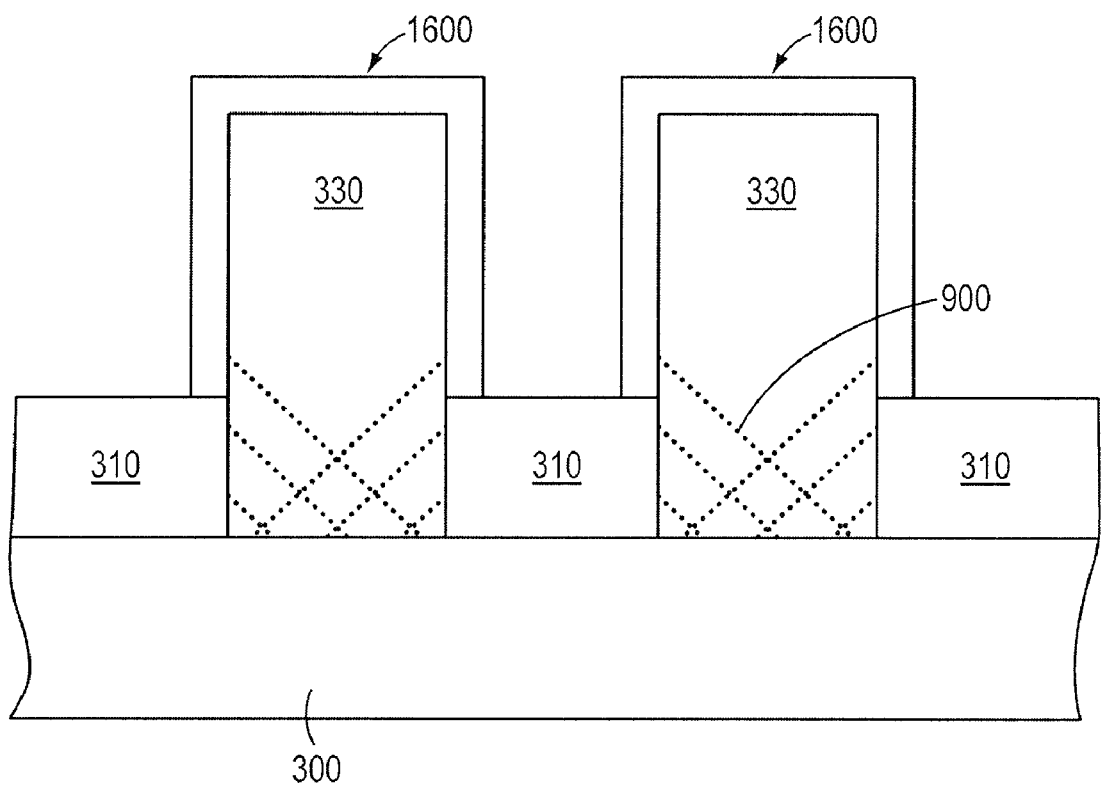

Referring to FIG. 18E, in some versions, in order to keep adjacent semiconductor regions electrically isolated, the mask can be removed only partially, e.g., via a timed dry etch, and then the wider-bandgap material B is grown over the semiconductor material A.

F. Photonic Devices on Si

Figure 19A:
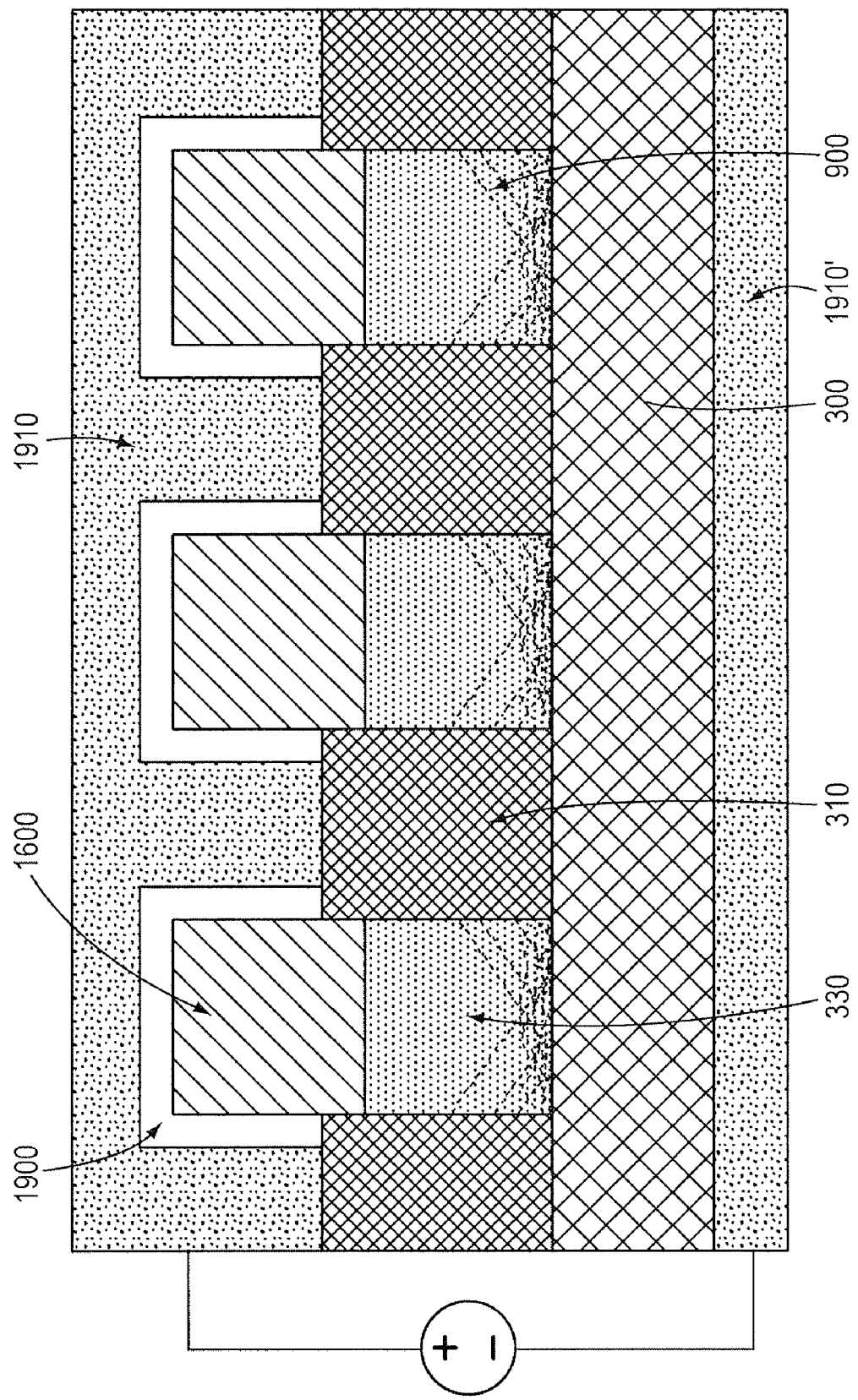
FIGS. 19A-19B are schematic views of photonic devices formed by the integration of non-Si semiconductors on Si wafers, according to embodiments of the invention.

Various implementations of the present technology described above with reference to FIGS. 16-18 make possible efficient fabrication of light emitting or photovoltaic devices (these are examples of photo-emissive and photo-absorptive devices, which are referred to herein collectively as "photonic devices") that include non-Si semiconductors, such as GaAs or InP or GaN, integrated on Si wafers, as shown in FIG. 19A. It is well known that various III-V semiconductor materials are typically far superior to Si in photonic efficiency, and the ability to integrate these materials onto a Si platform is extremely desirable. One of the key requirements of making efficient photonic semiconductor devices is to have, within the device, a semiconductor region or regions of high crystal quality for either (a) photon absorption (e.g. for photovoltaic devices) or (b) photon emission (for LEDs and lasers). Substantially avoiding semiconductor crystal dislocations in such regions is important to photonic device efficiency. This is because dislocations may promote non-radiative recombination, if both carrier types (holes and electrons) are present in the vicinity of the dislocations. Non-radiative recombination of carriers typically reduces the efficiency of either light absorbing or light emitting photonic devices. In addition, dislocation defects in the emission or absorption region of a photonic semiconductor device may lead to premature device failure. Through the use of techniques and structures described with respect to FIGS. 16-18, this goal of a high crystal quality region, substantially free of dislocation defects, for photon emission or absorption can be achieved. In particular, a structure may include a substrate including a first crystalline material, e.g., Si, and having a top substrate surface. A non-crystalline mask layer is disposed above the substrate. The non-crystalline mask layer may include a dielectric material, such as $SiO_2$. The non-crystalline mask layer has a top surface and an opening defined by sidewalls extending from the top surface of the non-crystalline mask layer to the top surface of the substrate. A cross-section of the opening may be one of various shapes, including substantially circular, substantially square, or substantially rectangular. The opening may be configured as an elongated trench. The sidewalls of the opening may be substantially perpendicular to a top substrate surface.

A second crystalline material is disposed in the opening, and is lattice mismatched to the first crystalline material. A thickness of the second crystalline material is sufficient to permit a majority of defects arising from the lattice mismatch to exit the second crystalline material at the sidewalls. A third crystalline material is disposed above the second crystalline material and defines a junction between the second crystalline material and the third crystalline material. The second and third crystalline materials may be substantially lattice matched. A top surface of the third crystalline material may be substantially coplanar with the top surface of the mask layer. This may be achieved by, e.g., planarizing the top surface of the mask layer and the top surface of the third crystalline material by, for example, chemical-mechanical polishing. The structure may, for example, include a plurality of openings. The third crystalline material disposed within an opening may be discontinuous, i.e., non-contiguous, with the third crystalline material disposed in other openings. Subsequent to growth of the third crystalline region, at least a portion of the non-crystalline mask layer may be removed, exposing at least portion of the sidewalls of the third crystalline material. A fourth crystalline material 1900 is then grown on at least a portion of the exposed surface. This fourth crystalline material may or may not be substantially lattice matched to the third crystalline material. For the case where the third and fourth crystalline materials are lattice mismatched, a thickness of the fourth crystalline material may be below the critical thickness for dislocation formation, to maintain a high quality of the interface between the third and fourth crystalline materials. The substrate may include a group IV element or compound, such as Si, and the second, third and fourth crystalline materials may each include at least one III-V semiconductor compound. A plurality of semiconductor device elements may be associated with the plurality of openings. Means for forming the semiconductor device elements are widely known to those well versed in the art. The device elements may include, for example, a photoelectric device element, a photo-emissive device element, and/or a photovoltaic device element.

The following description of doping levels and energy band gap applies specifically to a light-emitting diode (LED). At least a portion of the first and second crystalline materials may be relatively highly doped, e.g. with concentration of n-type dopants $>1\times10^{18}/cm^3$, to allow the region to serve as a relatively low resistance current path for the LED to be fabricated. The third crystalline material may be doped at a relatively low concentration and of the opposite type to the second crystalline material, e.g. with a concentration of p-type dopants $<1\times10^{17}/cm^3$. Because of the high n-type doping in the second crystalline region, the dominant carrier type in the second crystalline region will be electrons; very few holes will be present in this region. The lower value of the doping chosen for the third crystalline region allows a significant number of both electrons and holes to be present in the third crystalline region, under conditions of positive bias (i.e., when a positive voltage is applied across the completed structure, as indicated in FIG. 19A). Because of this, most of the electron-hole radiative recombination, and hence light emission, will occur in this third crystalline region. Since the third crystalline region is an area of good crystal quality, substantially free of dislocations, the electron-hole recombination therein may be substantially radiative. Promoting radiative recombination instead of non-radiative recombination is a key to high LED efficiency. The fourth crystalline material may be relatively highly doped, e.g. with concentration of p-type dopants $>1\times10^{18}/cm^3$, to allow the region to serve as a relatively low resistance current path for the LED. Optionally, an energy gap of the fourth crystalline material may be greater than that of the third crystalline material, to promote confinement of carriers to the third crystalline material and to reduce surface-related non-radiative carrier recombination, as discussed above.

A conductor layer 1910 including a first conductive material may be disposed in contact with the fourth crystalline region, overlaying the heteroepitaxial regions. This conductor layer may be transparent, translucent, or opaque. For example, the first conductive material may be indium-tin-oxide (ITO). A second conductive material 1910' may also be disposed on the back surface of the wafer. For example, this material could be aluminum. Means for depositing these conductive materials are widely known to those well versed in the art.

For the LED example described above, the first crystalline region could comprise Si, with arsenic as the dopant species. The second crystalline region could comprise GaAs or AlGaAs, with Si as the dopant species. The third crystalline region could comprise GaAs, with zinc as the dopant species. The fourth crystalline region could comprise GaAs or AlGaAs, with zinc as the dopant species.

More advanced and efficient LED structures may also be made using this approach, with a key difference being the presence of extra layers not described herein, such as undoped semiconductor quantum well emission regions surrounded by undoped semiconductor confinement regions, all disposed between the p and n regions of the LED.

For the above examples of doping types, given with respect to an LED device, the types may be reversed. That is, at least a portion of the first and second crystalline materials may be highly doped, e.g., with concentration of p-type dopants$>1\times 10^{18}/cm^3$. The third crystalline material may be doped at a relatively low concentration and of the opposite type to the second crystalline material, e.g., with a concentration of n-type dopants$<1\times 10^{17}$ cm$^3$. The fourth crystalline material may be highly doped, e.g., with concentration of p-type dopants$>1\times 10^{18}$ cm$^3$. The resulting device would also be a functional LED, but with the voltage biasing reversed compared to the situation depicted in FIG. 19A.

Figure 19B:
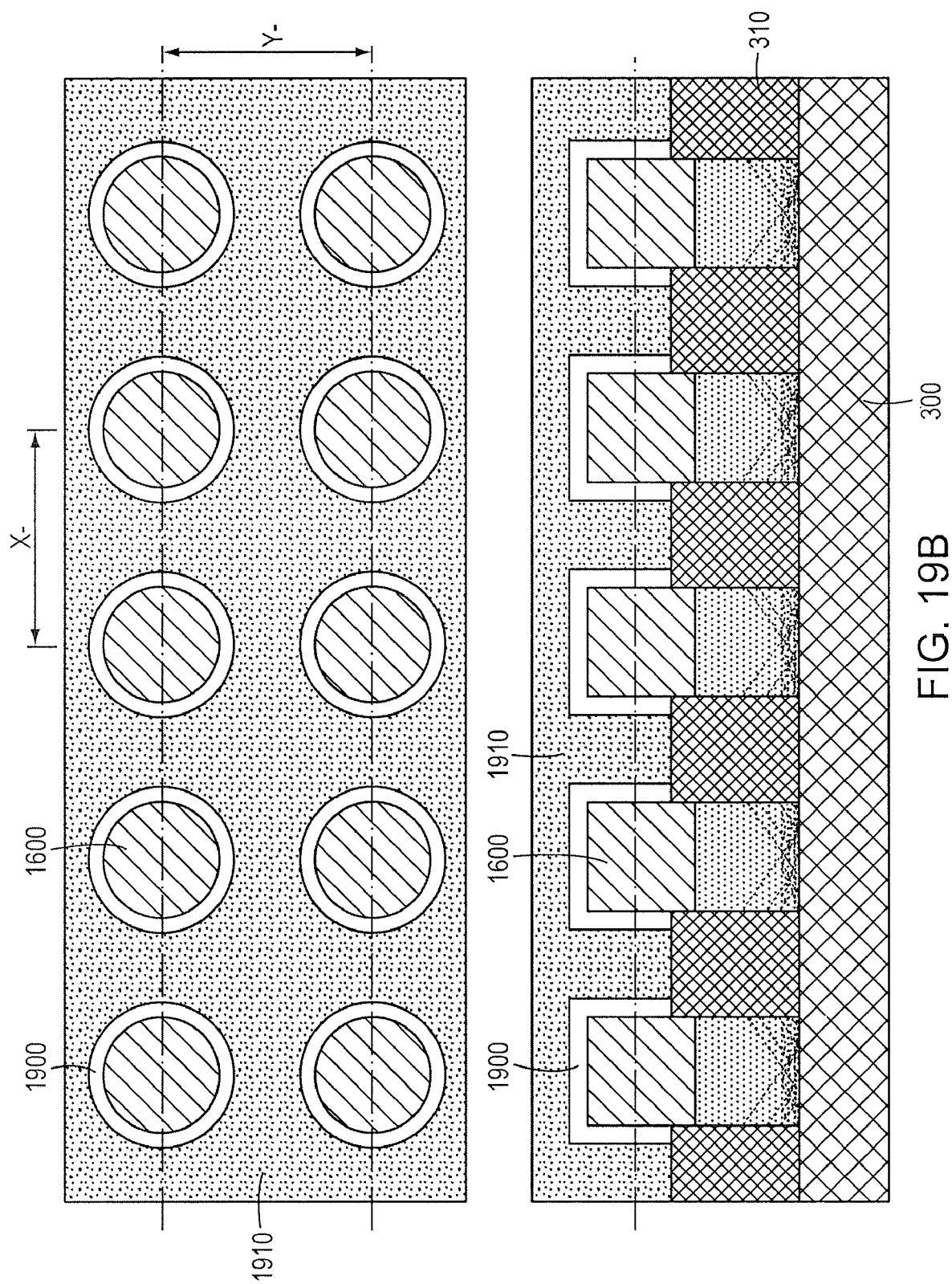

Certain implementations of the present technology focus on arranging light emitting elements to promote directional emission. Often, it is desirable to promote light emission from a semiconducting device in a given direction. Referring to FIG. 19B, an array semiconducting devices, e.g., emitters such as light-emitting diodes (LEDs), is connected in parallel, with the size of the emitting elements varying approximately with the order of the wavelength of the light being emitted. The array may be rectangular in shape. Further, to inhibit light propagation in a given direction, the spacing of light-emitting elements in that direction is preferably equal to an integer number of half-wavelengths of the emitted light. For example, the X-direction and Y-direction spacings may be equal to a half-wavelength of the emitted light. Inhibited X- and Y-propagation may lead to increased emission in the Z direction. This configuration may be of significant advantage for LEDs, for example, where increasing emission in the Z direction (perpendicular to the wafer or chip surface) is often highly desired. In an embodiment, an array of photo-emissive device elements is associated with the rectangular array of openings, and the spacings in each of the x- and the y-directions are equal to an integer number of half wavelengths of a frequency of light emitted by the photo-emissive device elements. In some versions, a hexagonal array of holes, where the spacing between the holes in the X-Y plane is equal to an integer number of half wavelengths, is used to block X and Y direction transmission more effectively than a rectangular array, hence better promoting Z-direction emission.

G. Epitaxial Necking for Hexagonal Semiconductors

Hexagonal semiconductors, such as the III-nitride (III-N) materials, are of great interest for high-power high-speed electronics and light-emitting applications. However, the threading dislocations in such materials typically have a different orientation (e.g. at 0° or 90° to the substrate) relative to the substrate, compared to the more commonly used cubic semiconductors, such as Si, Ge, and GaAs.

For epitaxy of hexagonal semiconductors such as III-nitrides on Si, the (111) surface of Si is commonly preferred over the (100). This is because the (111) surface of Si is hexagonal (even though Si is a cubic crystal). This makes a better template for hexagonal crystal growth than the cubic (100) face. However, epitaxial necking approach discussed above may be less effective in these applications, because the threading dislocations in the hexagonal semiconductors disposed over the lattice-mismatched Si (111) substrates may not be effectively confined by the vertical sidewalls.

Figure 20A:
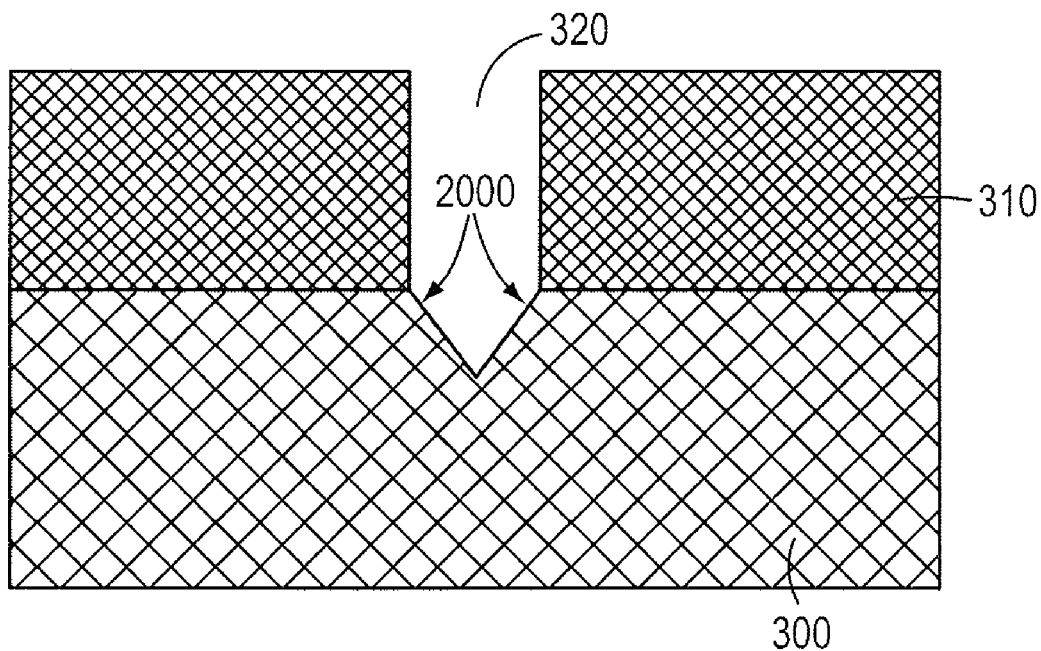
FIGS. 20A-20B, 21A-21B, 22A-22B, 23A-23B, and 24A-24B are schematic cross-sectional and top views of structures incorporating hexagonal non-Si semiconductors, according to various embodiments of the invention.
Figure 20B:
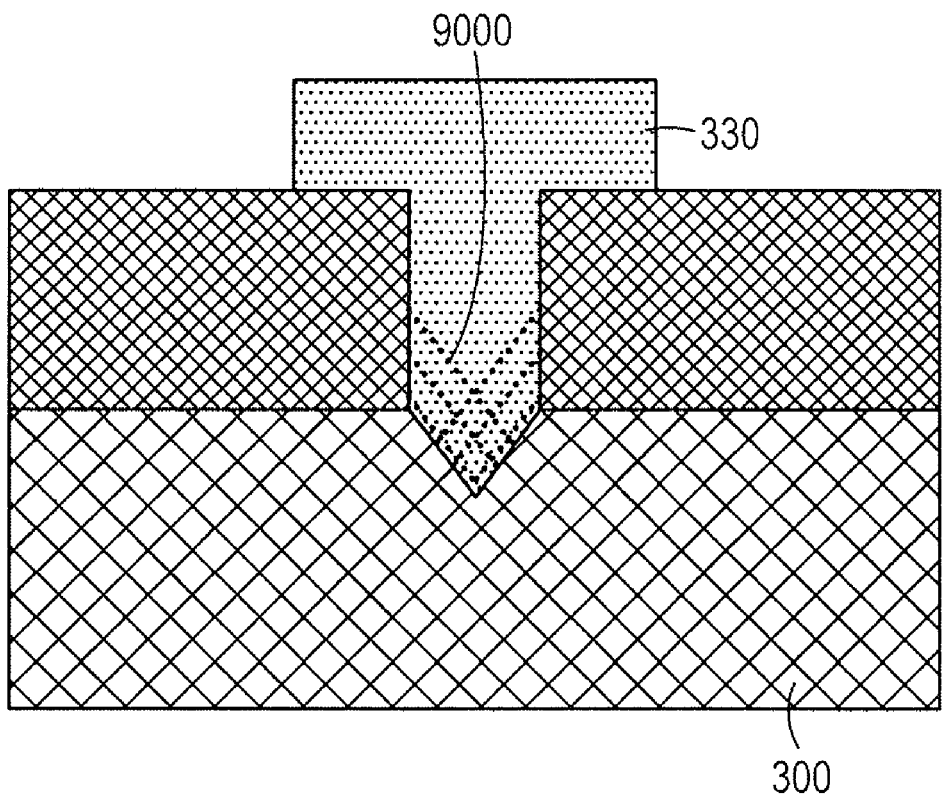

In order to address these concerns, in some implementations, the present technology features a modification to the epitaxial necking technique wherein the surface of the substrate exposed in the seed window is configured to enable confinement of the threading dislocations within the window. Referring to FIG. 20A, after the dielectric mask is disposed over the Si (100) substrate and a seed window is defined therethrough, an etch that is selective to the (111) Si crystal face, for example, a KOH solution, is applied to the portion of the substrate exposed at the bottom of the seed window to expose (111) surfaces 2000. A lattice-mismatched semiconductor material is then deposited in the seed window over the substrate, and the epitaxial deposition continues such that a heteroepitaxial region is grown over the material disposed in the opening, laterally expanding over the mask. Because of the configuration of the underlying surface, orientation of the threading dislocations in the heteroepitaxial region is at approximately 45° to the wafer surface, facilitating trapping of the dislocation by substantially vertical sidewalls of the mask, as shown in FIG. 20B.

Then, if small areas of hexagonal semiconductor material are desired for device active areas, the heteroepitaxial islands resulting from the individual seed windows can be planarized (e.g. via CMP), to be substantially co-planar with the adjacent insulator areas. Alternatively, if a large area is desired, growth can proceed until adjacent islands coalesce, followed optionally by planarization of the resulting structure. In the latter case, because lateral growth rates of hexagonal semiconductor can be dramatically increased over growth rate normal to the surface employing various known approaches, these semiconductors afford process flexibility not available with cubic semiconductors grown on (100) surfaces. Specifically, differential growth rates of these materials allows for widely-spaced seed windows; for example, spacing may be five times the opening width or even greater, offering a substantial advantage over closely-spaced seed windows, if the defects which are known to form when epitaxial growth fronts coalesce cannot be substantially eliminated.

Blocking of the dislocations is also promoted by the forces that cause dislocations to exit a growing crystal at lateral surfaces. Specifically, even when dislocations have an orientation that does not favor trapping at sidewalls, epitaxial necking approach is still effective at certain dimensions because of boundary forces that cause dislocations to propagate to free surfaces in order to reduce the elastic energy of the crystal. As discussed by Tom Langdo in the 2001 thesis referenced above, for the case of Ge grown selectively in holes in an SiO$_2$ mask on Si substrates, it was observed that "all defects within ~300 nm of the window edge are bent and forced out to the SiO$_2$ sidewall." Therefore, epitaxial necking can be effective for hexagonal semiconductors grown on (111) surfaces if the hole or opening width is, for example, on the order of 600 nm, so that all defects will be within 300 nm of a sidewall.

Figure 21A:
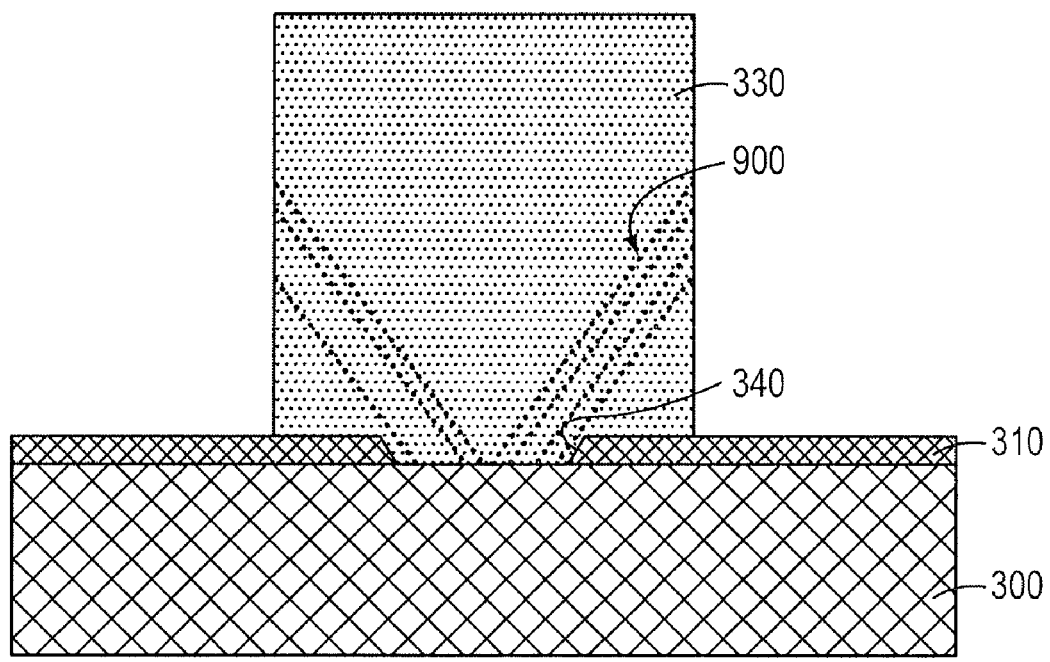
Figure 21B:
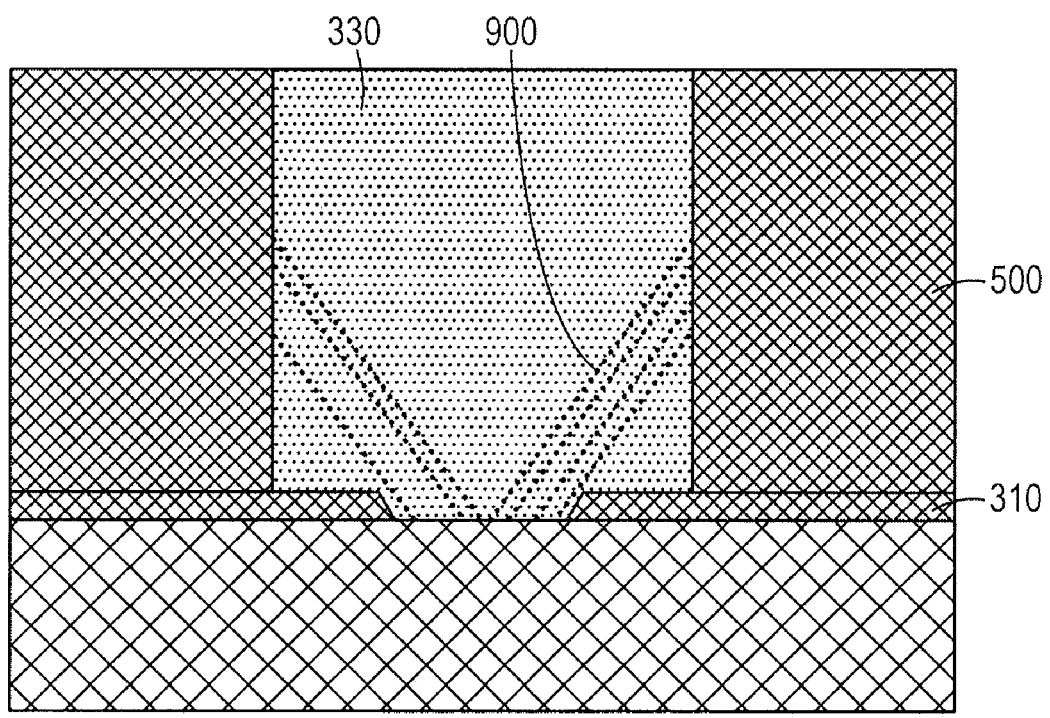

In alternative implementations, epitaxial necking techniques can be used with hexagonal semiconductor materials such as GaN without confining sidewalls of the dielectric mask. Referring to FIG. 21A, after a seed window is patterned in a thin mask over the substrate (see, e.g. FIG. 3), the hexagonal lattice-mismatched semiconductor material is grown in and then above the seed window under process conditions that promote growth normal to the substrate over lateral growth, such that dislocation defects are trapped at boundaries of the heteroepitaxial region despite a lack of physical confinement by the sidewalls of the mask, as in the embodiments described above in connection with FIGS. 20A-20B. Similarly, in other alternative embodiments, III-V materials such as GaAs or InP can be epitaxially grown on a (111) Si substrate in a controlled manner to promote growth normal to the substrate so that defects in III-V materials are trapped despite a lack of confinement by mask sidewalls. Then, as illustrated in FIG. 21B, if desired for various purposes, such as for an active area co-planar with adjacent isolation regions for subsequent device fabrication, an insulating layer can be deposited adjacent to the heteroepitaxial region and the resulting structure planarized.

In other alternative implementations, epitaxial necking can be used in conjunction with lateral growth techniques for hexagonal semiconductor materials such as III-N materials As illustrated in the example of in FIGS. 22-24, epitaxial necking techniques are first used to grow material such as a III-N material in openings so that defects exit the opening sidewalls. Then, after the material reaches the top of the opening, techniques that are known to those of skill in the art of epitaxy are used to increase lateral growth of the. This permits the use of relatively widely spaced seed regions that trap defects, such as openings, as a way to grow relatively wide areas of high quality crystalline material over the top of the mask that defines the openings. For example, by taking advantage of the ability to control the growth rate for III-N materials so that lateral growth is dramatically higher than normal growth, it is practical to use widely spaced seed regions, such as spacing that is between openings that is at least five or ten times five times greater than the opening width. To the extent that there are defects in areas where material originating from separate seed regions coalesces, there will be a wide spacing between such areas.

Figure 22A:
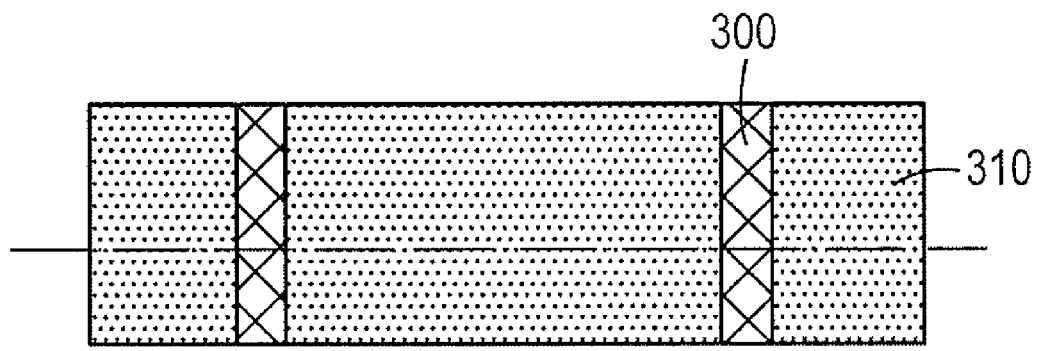
Figure 22B:
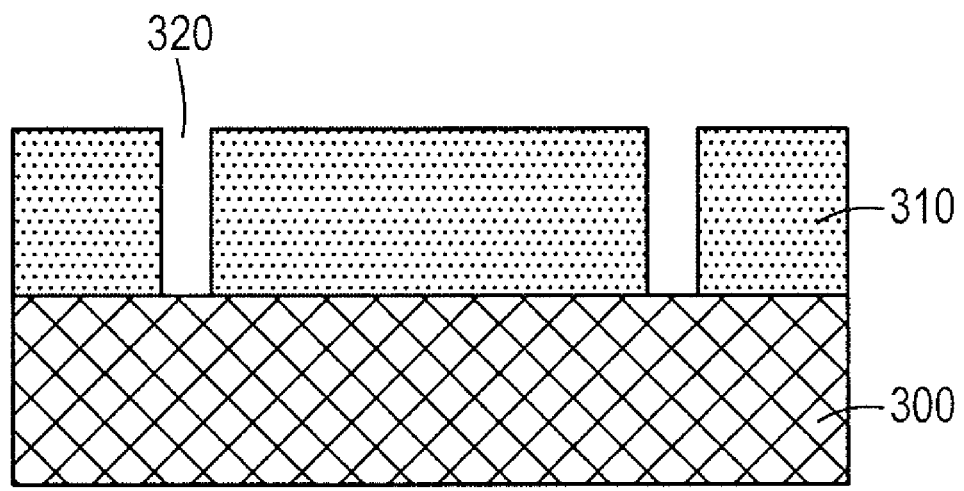
Figure 23A:
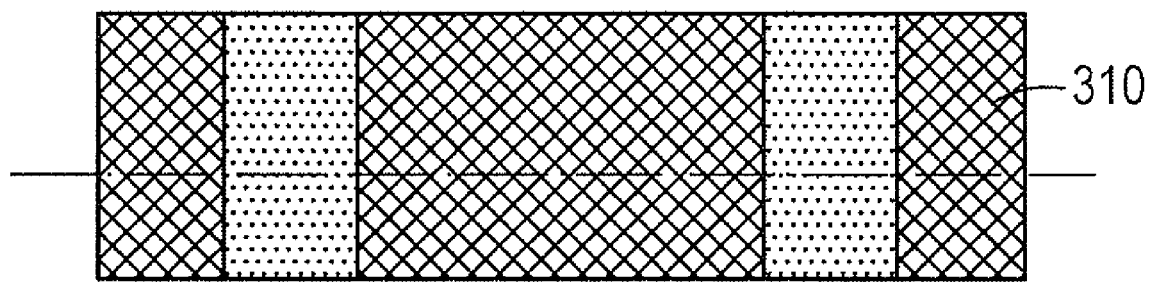
Figure 23B:
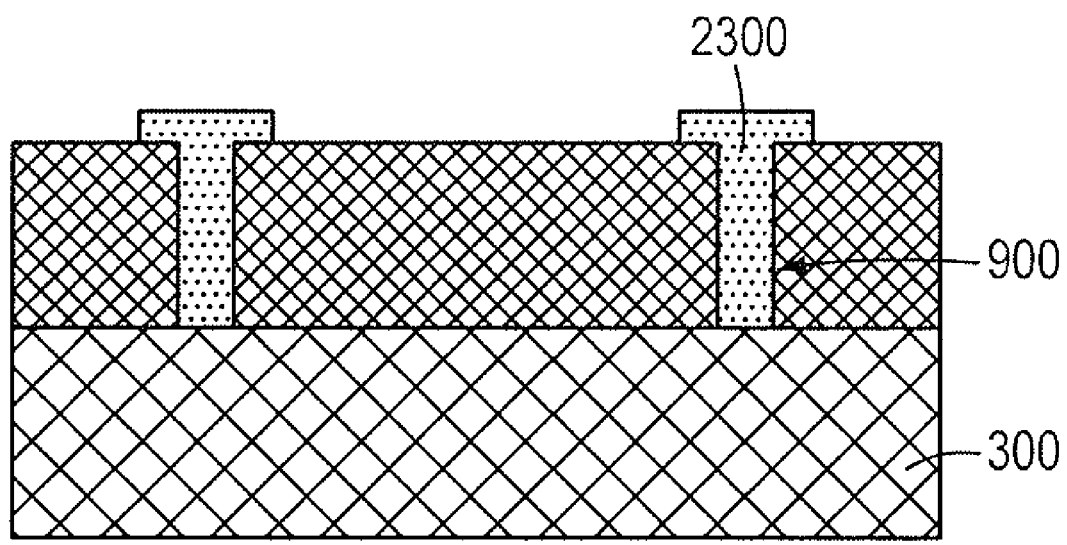
Figure 24A:
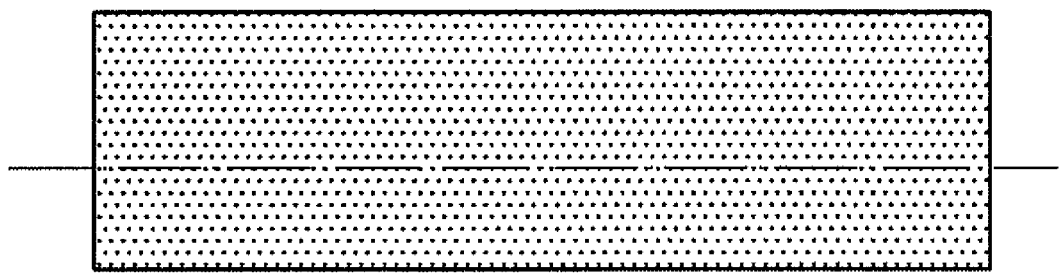
Figure 24B:
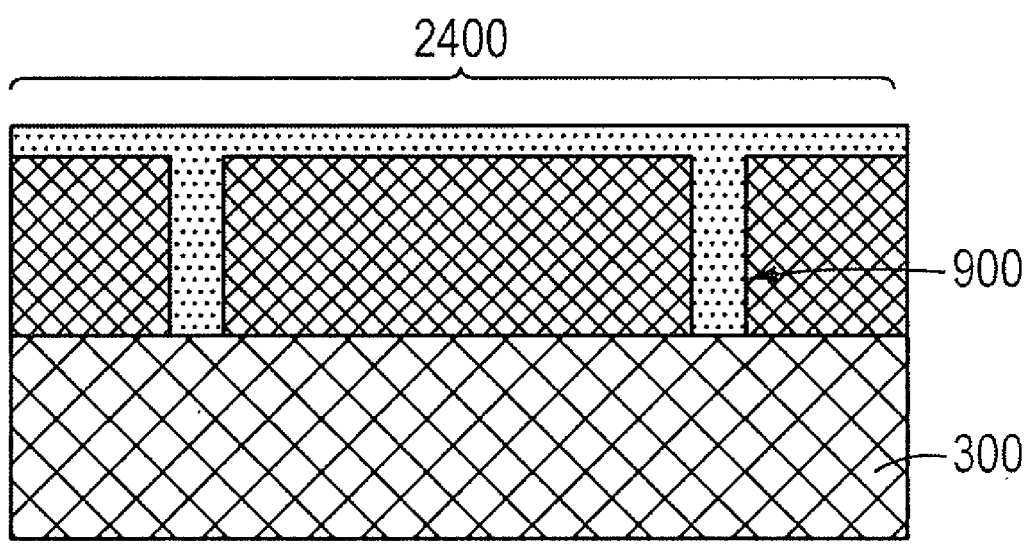

Referring to FIGS. 22A-B, a mask material composed of SiN or $SiO_2$ is deposited over a Si substrate, and openings exposing the Si substrate are defined in the mask using standard lithography and etch techniques. The ratio of the height to the width of the openings is configured so that when epitaxially growing a material in the opening that has a lattice mismatch to Si, such as a III-N, the height is sufficient to permit dislocation defects to exit at the opening sidewalls. As illustrated in FIGS. 23A-B, the lattice-mismatched material is grown to a height above the top 2300 of the openings. Then, by modifying growth conditions to promote the lateral growth rate, such as by modifying the ratios of precursor gas flows, the lattice-mismatched material is grown until adjacent growth fronts coalesce to create a layer that covers the surface area between adjacent openings 2400 as shown in FIGS. 24A-B. By increasing the distance between openings, variations of this embodiment reduce the percentage of the top layer that is subject to possible defects that can arise in regions where adjacent growth fronts coalesce. The coalesced surface can optionally be planarized and also optionally a new layer of material re-grown over the planarized surface if necessary to create a layer and surface with the desired characteristics.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A structure including lattice-mismatched materials, the structure comprising:
    a substrate including a first crystalline material and having a top substrate surface;
    a non-crystalline mask layer disposed above the substrate, the non-crystalline mask layer having a top surface and an opening defined by sidewalls extending from the top surface of the non-crystalline mask layer to the top substrate surface;
    a second crystalline material disposed in the opening, the second crystalline material having a lattice mismatch to the first crystalline material and a thickness sufficient to permit a majority of defects arising from the lattice mismatch to exit the second crystalline material at the sidewalls; and
    a third crystalline material disposed above the second crystalline material and defining a junction therebetween, the junction confining selected charge carriers to one side of the junction.

2. A structure including lattice-mismatched materials comprising:
    a substrate comprising a first crystalline semiconductor material;
    a second crystalline semiconductor material having a lattice mismatch to the substrate, the second crystalline semiconductor material being disposed on the substrate in a predetermined configuration defining a top surface and a lateral sidewall surface extending from a top surface of the substrate to the top surface defined by the predetermined configuration, the sidewall surface having a height above the substrate top surface sufficient to permit a majority of defects arising from the lattice mismatch to exit the second crystalline semiconductor material at the lateral sidewall surface; and
    a third crystalline semiconductor material substantially lattice matched with the second crystalline material, the third crystalline material being disposed on at least a portion of the sidewall surface of the second crystalline material to define an outer sidewall surface.

3. A structure including lattice-mismatched materials comprising:
    a substrate including a first crystalline semiconductor material;
    a mask layer disposed above the substrate, the mask layer having a top surface and a plurality of openings defined by sidewalls extending-through the mask layer from the top-surface to the substrate;
    a second crystalline material disposed within each of the openings and having a lattice mismatch to the first crystalline material and a thickness sufficient to permit a majority of defects arising from the lattice mismatch to exit the second material at the sidewalls; and
    a third crystalline semiconductor material disposed within the openings above the second crystalline material and defining a junction in each opening for confining selected charge carriers to one side of the junction.

4. A structure including lattice-mismatched materials, the structure comprising:
- a substrate including a first crystalline material;
- a non-crystalline mask layer disposed above the substrate, the mask layer having a top surface and a plurality of openings defined by sidewalls extending from the top surface of the non-crystalline mask layer to a top surface of the substrate;
- a second crystalline material disposed in the openings, the second crystalline material having a lattice mismatch to the first crystalline material and a thickness sufficient to permit a majority of defects arising from the lattice mismatch to exit the second material at the sidewalls; and
- a third crystalline material disposed above the second crystalline material, the third crystalline material disposed in each opening being non-contiguous with the third crystalline material disposed in other openings.

5. A structure including lattice-mismatched materials, the structure comprising:
- a substrate including a first crystalline material and having a top substrate surface;
- a non-crystalline mask layer disposed above the substrate, the non-crystalline mask layer having a top surface and an opening defined by sidewalls extending from the top surface of the non-crystalline mask layer to the top substrate surface;
- a second crystalline material disposed in the opening, the second crystalline material having a lattice mismatch to the first crystalline material and a thickness sufficient to permit a majority of defects arising from the lattice mismatch to exit the second crystalline material at the sidewalls; and
- a third crystalline material disposed above the second crystalline material and defining a junction therebetween, wherein the second and third crystalline materials are substantially lattice matched.

6. A structure including lattice-mismatched materials comprising:
- a substrate including a first crystalline semiconductor material;
- a mask layer disposed above the substrate, the mask layer having a top surface and a plurality of openings defined by sidewalls extending through the mask layer from the top surface to the substrate;
- a second crystalline material disposed within each of the openings and having a lattice mismatch to the first crystalline material and a thickness sufficient to permit a majority of defects arising from the lattice mismatch to exit the second material at the sidewalls; and
- a third crystalline semiconductor material disposed within the openings above the second crystalline material and defining a junction in each opening,
wherein the second and third crystalline materials are substantially lattice matched.

7. The structure of claim 1, wherein the second crystalline material comprises defects arising from the lattice mismatch to the first crystalline material, and the majority of the defects exit the second crystalline material at the sidewalls.

8. The structure of claim 1, wherein the first crystalline material and the third crystalline material are different, and the third crystalline material is substantially free of defects.

9. The structure of claim 1, wherein a top surface of the third crystalline material is substantially coplanar with the top surface of the non-crystalline mask layer.

10. The structure of claim 3, wherein the second crystalline material comprises defects arising from the lattice mismatch to the first crystalline material, and the majority of the defects exit the second crystalline material at the sidewalls.

11. The structure of claim 3, wherein the first crystalline material and the third crystalline material are different, and the third crystalline material is substantially free of defects.

12. The structure of claim 3, wherein, in each of the openings, a top surface of the third crystalline material is substantially coplanar with the top surface of the non-crystalline mask layer.

13. The structure of claim 4, wherein the second crystalline material comprises defects arising from the lattice mismatch to the first crystalline material, and the majority of the defects exit the second crystalline material at the sidewalls.

14. The structure of claim 4, wherein the first crystalline material and the third crystalline material are different, and the third crystalline material is substantially free of defects.

15. The structure of claim 4, wherein, in each of the openings, a top surface of the third crystalline material is substantially coplanar with the top surface of the non-crystalline mask layer.

16. The structure of claim 2, wherein the second crystalline semiconductor material and the third crystalline semiconductor material are different.

17. The structure of claim 2, wherein the third crystalline semiconductor material has a wider bandgap than a bandgap of the second crystalline semiconductor material.

18. The structure of claim 2, further comprising an insulating material disposed adjacent to and in contact with the outer sidewall surface.

19. The structure of claim 18, wherein the insulating material and the second and third crystalline semiconductor materials each defines a respective planar top surface, and the planar top surfaces are substantially coplanar.

20. The structure of claim 2, wherein the third crystalline semiconductor material is disposed over substantially the entire lateral sidewall surface.

* * * * *